US008130787B2

(12) United States Patent
Hagiwara et al.

(10) Patent No.: US 8,130,787 B2
(45) Date of Patent: Mar. 6, 2012

(54) HIGH-FREQUENCY CIRCUIT DEVICE, AND COMMUNICATIONS APPARATUS COMPRISING SAME

(75) Inventors: Kazuhiro Hagiwara, Kumagaya (JP);
Keisuke Fukamachi, Kumagaya (JP);
Shigeru Kemmochi, Kumagaya (JP)

(73) Assignee: Hitachi Metals, Ltd., Tokyo (JP)

( * ) Notice: Subject to any disclaimer, the term of this patent is extended or adjusted under 35 U.S.C. 154(b) by 765 days.

(21) Appl. No.: 12/161,111

(22) PCT Filed: Jan. 17, 2007

(86) PCT No.: PCT/JP2007/050607
§ 371 (c)(1),
(2), (4) Date: Jul. 16, 2008

(87) PCT Pub. No.: WO2007/083668
PCT Pub. Date: Jul. 26, 2007

(65) Prior Publication Data
US 2010/0157860 A1 Jun. 24, 2010

(30) Foreign Application Priority Data

Jan. 17, 2006 (JP) .................................. 2006-008343
Jul. 25, 2006 (JP) .................................. 2006-202392

(51) Int. Cl.
*H04L 12/66* (2006.01)
(52) U.S. Cl. ...................................... 370/463
(58) Field of Classification Search .......................... None
See application file for complete search history.

(56) References Cited

U.S. PATENT DOCUMENTS 6,507,728 B1   1/2003   Watanabe et al.
6,535,748 B1   3/2003   Vuorio et al.
2003/0011071 A1   1/2003   Kariyazaki
2005/0085201 A1   4/2005   Martin et al.
2005/0239416 A1   10/2005   Shimizu
2006/0250182 A1   11/2006   Takeda et al.

FOREIGN PATENT DOCUMENTS

| JP | 09-294100 A | 11/1997 |
|---|---|---|
| JP | 10-022865 A | 1/1998 |
| JP | 10-154947 A | 6/1998 |
| JP | 10-173578 A | 6/1998 |
| JP | 2000-031861 A | 1/2000 |
| JP | 2000-049652 A | 2/2000 |
| JP | 2003-229786 A | 8/2003 |
| JP | 2003-273624 A | 9/2003 |

(Continued)

OTHER PUBLICATIONS

Chinese Office Action, dated Jun. 24, 2011 for corresponding Chinese Application No. 200780009111.7.

*Primary Examiner* — Anh-Vu Ly
(74) *Attorney, Agent, or Firm* — Sughrue Mion, PLLC

(57) ABSTRACT

A high-frequency circuit device comprising at least first and second antenna terminals, at least first and second transmitting terminals for a first communications system, at least first and second receiving terminals for a first communications system, two or more switch circuits, and two or more filter circuits, the first transmitting terminal for the first communications system being connectable to the first antenna terminal, the second transmitting terminal for the first communications system being connectable to the second antenna terminal, the first receiving terminal for the first communications system being connectable to the first antenna terminal, and the second receiving terminal for the first communications system being connectable to the second antenna terminal.

20 Claims, 42 Drawing Sheets

FOREIGN PATENT DOCUMENTS

| | | |
|---|---|---|
| JP | 2004-007162 A | 1/2004 |
| JP | 2004-207880 A | 7/2004 |
| JP | 2005-123785 A | 5/2005 |
| JP | 2005-269305 A | 9/2005 |
| JP | 2005-295312 A | 10/2005 |
| JP | 2005-318115 A | 11/2005 |
| JP | 2005-333485 A | 12/2005 |
| JP | 2005-341131 A | 12/2005 |
| JP | 2006-013849 A | 1/2006 |
| JP | 2006-014102 A | 1/2006 |
| WO | 2006/003959 A1 | 1/2006 |

US 8,130,787 B2

HIGH-FREQUENCY CIRCUIT DEVICE, AND COMMUNICATIONS APPARATUS COMPRISING SAME

FIELD OF THE INVENTION

The present invention relates to a high-frequency circuit device disposed between an antenna and a transmitting/receiving circuit for wireless communications between electronic or electric apparatuses, and a communications apparatus comprising such a high-frequency circuit device.

BACKGROUND OF THE INVENTION

Wireless communications between electronic or electric apparatuses, such as cell phones, wireless LAN, short-distance, wireless Bluetooth™, etc., have remarkably progressed in recent years. As wireless communications apparatuses have increasingly been integrated and become multi-functional, multi-band products having pluralities of communications systems, and products capable of transmitting large volume of signals, etc. have been developed. Among them, much attention is paid to a multiple-input, multiple-output (MIMO) wireless communications system. The MIMO communications system uses pluralities of transmitting antennas and pluralities of receiving antennas for the spatial-multiplexing transmission of plural signals in a predetermined frequency band, thereby increasing the volume of signals transmitted without expanding the used frequency band width. This system improves the utilization efficiency of frequency bands.

For instance, JP 2005-318115 A discloses a wireless communications system comprising (a) a receiver comprising pluralities of antennas, a means for branching signals received by part of the antennas, a means for multiplying each branched signal by a complex weight, a means for adding the received signals to output signals of the weight-multiplying means, a means for controlling the complex weight based on the output signals of the adding means such that a channel has the maximum capacity to the received signals, and RF front-ends for generating baseband signals based on the output signals of the adding means, and (b) a transmitter comprising pluralities of antennas, a means for generating transmitting signals, RF front-ends for generating RF transmitting signals based on the output signals of the transmitting-signal-generating means, a means for branching the RF transmitting signals, a means for multiplying the output of the branching means by a complex weight, a means for adding the outputs of the weight-controlling means, and a weight-controlling means for determining the complex weight based on a feedback signal from the receiver.

Because such MIMO communications system needs pluralities of antennas and the same number of RF front-ends as that of the antennas, it has a complicated structure with a large number of parts. Multi-band communications systems also suffer the same problems.

Thus desired are small, high-frequency circuit devices with a small number of parts, which can be used in multi-band communications systems, MIMO communications systems, etc.

OBJECT OF THE INVENTION

An object of the present invention is to provide a small, high-frequency circuit device with a small number of parts, which can be used in multi-band communications systems, MIMO communications systems, etc., and a communications apparatus comprising such a high-frequency circuit device.

DISCLOSURE OF THE INVENTION

The first high-frequency circuit device of the present invention comprises at least first and second antenna terminals, at least a first transmitting terminal and at least first and second receiving terminals for a first communications system, one or more switch circuits, and two or more filter circuits, the first transmitting terminal and the first receiving terminal for the first communications system being connectable to the first antenna terminal, and the second receiving terminal for the first communications system being connectable to the second antenna terminal. With the first and second receiving terminals in the same communications system connected to different antenna terminals, receiving circuits can be operated simultaneously. Also, with at least one of the antenna terminals connectable to the transmitting terminal and the receiving terminal, the high-frequency circuit device can be miniaturized.

The first high-frequency circuit device preferably comprises at least a first transmitting terminal and at least first and second receiving terminals for a second communications system, the first transmitting terminal and the first receiving terminal for the second communications system being connectable to the first antenna terminal, and the second receiving terminal for the second communications system being connectable to the second antenna terminal.

The second high-frequency circuit device of the present invention comprises at least first and second antenna terminals, at least first and second transmitting terminals and at least first and second receiving terminals for a first communications system, two or more switch circuits, and two or more filter circuits, the first transmitting terminal and the first receiving terminal for the first communications system being connectable to the first antenna terminal, the second transmitting terminal and the second receiving terminal for the first communications system being connectable to the second antenna terminal.

The second high-frequency circuit device preferably comprises at least first and second transmitting terminals and at least first and second receiving terminals for a second communications system, the first transmitting terminal and the first receiving terminal for the second communications system being connectable to the first antenna terminal, and the second transmitting terminal and the second receiving terminal for the second communications system being connectable to the second antenna terminal.

The second high-frequency circuit device preferably comprises a third antenna terminal, and a third receiving terminal for the first communications system, the third receiving terminal for the first communications system being connectable to the third antenna terminal.

The second high-frequency circuit device preferably comprises a third antenna terminal, a third receiving terminal for the first communications system, and a third receiving terminal for the second communications system, the third receiving terminal for the first communications system and the third receiving terminal for the second communications system being connectable to the third antenna terminal.

The second high-frequency circuit device preferably comprises a third transmitting terminal for the first communications system, the third transmitting terminal for the first communications system being connectable to the third antenna terminal.

The second high-frequency circuit device preferably comprises a third transmitting terminal for the first communications system, and a third transmitting terminal for the second communications system, the third transmitting terminal for the first communications system and the third transmitting terminal for the second communications system being connectable to the third antenna terminal.

Each of the first and second high-frequency circuit devices preferably comprises a transmitting/receiving terminal for a third communications system.

Each of the first and second high-frequency circuit devices preferably comprises two or more low-noise amplifier circuits sharing a common power supply terminal for amplifying received signals.

Each of the first and second high-frequency circuit devices preferably comprises two or more high-frequency amplifier circuits sharing a common power supply terminal for amplifying transmitting signals.

The high-frequency circuit device according to a preferred embodiment of the present invention comprises at least first and second antenna terminals, at least a first transmitting terminal and at least first and second receiving terminals for a first communications system, and at least a first transmitting terminal and at least first and second receiving terminals for a second communications system, (A) a first path connected to the first antenna terminal comprising (a) a path extending from the first antenna terminal to the first transmitting terminal for the first communications system, with a first switch circuit, a first diplexer circuit, a first high-frequency amplifier circuit and a first bandpass filter circuit connected in this order between them, (b) a path extending from the first diplexer circuit to the first transmitting terminal for the second communications system, with a second high-frequency amplifier circuit and a second bandpass filter circuit connected in this order between them, (c) a path extending from the first switch circuit to the first receiving terminal for the first communications system, with a second diplexer circuit and a third bandpass filter circuit connected in this order between them, and (d) a path extending from the second diplexer circuit to the first receiving terminal for the second communications system, and (B) a second path connected to the second antenna terminal comprising (a) a path extending from the second antenna terminal to the second receiving terminal for the first communications system, with a third diplexer circuit and a fourth bandpass filter circuit connected in this order between them, and (b) a path extending from the third diplexer circuit to the second receiving terminal for the second communications system.

The high-frequency circuit device according to another preferred embodiment of the present invention comprises at least first and second antenna terminals, at least first and second transmitting terminals and at least first and second receiving terminals for a first communications system, and at least first and second transmitting terminals and at least first and second receiving terminals for a second communications system, (A) a first path connected to the first antenna terminal comprising (a) a path extending from the first antenna terminal to the first transmitting terminal for the first communications system, with a first switch circuit, a first diplexer circuit, a first high-frequency amplifier circuit and a first bandpass filter circuit connected in this order between them, (b) a path extending from the first diplexer circuit to the first transmitting terminal for the second communications system, with a second high-frequency amplifier circuit and a second bandpass filter circuit connected in this order between them, (c) a path extending from the first switch circuit to the first receiving terminal for the first communications system, with a second diplexer circuit and a third bandpass filter circuit connected in this order between them, and (d) a path extending from the second diplexer circuit to the first receiving terminal for the second communications system, and (B) a second path connected to the second antenna terminal comprising (a) a path extending from the second antenna terminal to the second transmitting terminal for the first communications system, with a second switch circuit, a third diplexer circuit, a third high-frequency amplifier circuit and a fourth bandpass filter circuit connected in this order between them, (b) a path extending from the third diplexer circuit to the second transmitting terminal for the second communications system, with a fourth high-frequency amplifier circuit and a fifth bandpass filter circuit connected in this order between them, (c) a path extending from the second switch circuit to the second receiving terminal for the first communications system, with a fourth diplexer circuit and a sixth bandpass filter circuit connected in this order between them, and (d) a path extending from the fourth diplexer circuit to the second receiving terminal for the second communications system.

The high-frequency circuit device according to a further preferred embodiment of the present invention comprises at least first to third antenna terminals, at least first and second transmitting terminals and at least first to third receiving terminals for a first communications system, and at least first and second transmitting terminals and at least first to third receiving terminals for a second communications system, (A) a first path connected to the first antenna terminal comprising (a) a path extending from the first antenna terminal to the first transmitting terminal for the first communications system, with a first switch circuit, a first diplexer circuit, a first high-frequency amplifier circuit and a first bandpass filter circuit connected in this order between them, (b) a path extending from the first diplexer circuit to the first transmitting terminal for the second communications system, with a second high-frequency amplifier circuit and a second bandpass filter circuit connected in this order between them, (c) a path extending from the first switch circuit to the first receiving terminal for the first communications system, with a second diplexer circuit and a third bandpass filter circuit connected in this order between them, and (d) a path extending from the second diplexer circuit to the first receiving terminal for the second communications system, (B) a second path connected to the second antenna terminal comprising (a) a path extending from the second antenna terminal to the second transmitting terminal for the first communications system, with a second switch circuit, a third diplexer circuit, a third high-frequency amplifier circuit and a fourth bandpass filter circuit connected in this order between them, (b) a path extending from the third diplexer circuit to the second transmitting terminal for the second communications system, with a fourth high-frequency amplifier circuit and a fifth bandpass filter circuit connected in this order between them, (c) a path extending from the second switch circuit to the second receiving terminal for the first communications system, with a fourth diplexer circuit and a sixth bandpass filter circuit connected in this order between them, and (d) a path extending from the fourth diplexer circuit to the second receiving terminal for the second communications system, and (C) a third path connected to the third antenna terminal comprising (a) a path extending from the third antenna terminal to the third receiving terminal for the first communications system, with a fifth diplexer circuit and a seventh bandpass filter circuit connected in this order between them, and (b) a path extending from the fifth diplexer circuit to the third receiving terminal for the second communications system.

The high-frequency circuit device according to a still further preferred embodiment of the present invention comprises at least first to third antenna terminals, at least first to third transmitting terminals and at least first to third receiving terminals for a first communications system, and at least first to third transmitting terminals and at least first to third receiving terminals for a second communications system, (A) a path connected to the first antenna terminal comprising (a) a path extending from the first antenna terminal to the first transmitting terminal for the first communications system, with a first switch circuit, a first diplexer circuit, a first high-frequency amplifier circuit and a first bandpass filter circuit connected in this order between them, (b) a path extending from the first diplexer circuit to the first transmitting terminal for the second communications system, with a second high-frequency amplifier circuit and a second bandpass filter circuit connected in this order between them, (c) a path extending from the first switch circuit to the first receiving terminal for the first communications system, with a second diplexer circuit and a third bandpass filter circuit connected in this order between them, and (d) a path extending from the second diplexer circuit to the first receiving terminal for the second communications system, (B) a path connected to the second antenna terminal comprising (a) a path extending from the second antenna terminal to the second transmitting terminal for the first communications system, with a second switch circuit, a third diplexer circuit, a third high-frequency amplifier circuit and a fourth bandpass filter circuit connected in this order between them, (b) a path extending from the third diplexer circuit to the second transmitting terminal for the second communications system, with a fourth high-frequency amplifier circuit and a fifth bandpass filter circuit connected in this order between them, (c) a path extending from the second switch circuit to the second receiving terminal for the first communications system, with a fourth diplexer circuit and a sixth bandpass filter circuit connected in this order between them, and (d) a path extending from the fourth diplexer circuit to the second receiving terminal for the second communications system, and (C) a path connected to the third antenna terminal comprising (a) a path extending from the third antenna terminal to the third transmitting terminal for the first communications system, with a third switch circuit, a fifth diplexer circuit, a fifth high-frequency amplifier circuit and a seventh bandpass filter circuit connected in this order between them, (b) a path extending from the fifth diplexer circuit to the third transmitting terminal for the second communications system, with a sixth high-frequency amplifier circuit and a eighth bandpass filter circuit connected in this order between them, (c) a path extending from the third switch circuit to the third receiving terminal for the first communications system, with a sixth diplexer circuit and a ninth bandpass filter circuit connected in this order between them, and (d) a path extending from the sixth diplexer circuit to the third receiving terminal for the second communications system.

A bandpass filter circuit or a highpass filter circuit is preferably disposed between the second diplexer circuit and the first receiving terminal for the second communications system, and a bandpass filter circuit or a highpass filter circuit is preferably disposed between the third diplexer circuit and the second receiving terminal for the second communications system. A lowpass filter circuit is preferably connected to the output side of the high-frequency amplifier circuit. A detection circuit for transmitting signals is preferably disposed between the switch circuit and the diplexer circuit, and the switch circuit is preferably connected to pluralities of antennas terminals.

A low-noise amplifier circuit is preferably disposed between each receiving terminal and each antenna terminal. The low-noise amplifier circuits preferably share a power supply terminal, and the high-frequency amplifier circuits preferably share a power supply terminal. Each transmitting terminal is preferably a balanced terminal.

The high-frequency circuit device of the present invention preferably comprises an integral laminate board constituted by pluralities of dielectric ceramic layers having conductor patterns, the conductor patterns forming inductance elements and capacitance elements, and at least one semiconductor device mounted on the laminate board.

In the high-frequency circuit device of the present invention, it is preferable that part of the two or more filter circuits are connected to the first and second receiving terminals for the first communications system, and that shield electrodes are disposed between the above filter circuits connected to the first and second receiving terminals.

It is preferable that part of the two or more filter circuits are connected to the first transmitting terminal and the first and second receiving terminals for the first communications system, and that shield electrodes are disposed between a filter circuit connected to the first transmitting terminal and at least one of the filter circuits connected to the first and second receiving terminals.

At least one surface of the laminate board is preferably provided with at least two antenna terminal electrodes, at least one transmitting terminal electrode, at least two receiving terminal electrodes, at least one ground electrode, and at least one circuit-controlling terminal electrode, the antenna terminal electrode being arranged along a first side portion of the laminate board, and the transmitting terminal electrode being arranged along a second side portion opposing the first side portion.

Among the receiving terminal electrodes, those for the same communications system are preferably disposed apart. The receiving terminal electrodes are preferably arranged along the second side portion. The circuit-controlling terminal electrodes are preferably arranged along two opposing side portions on both sides of the first and second side portions.

The high-frequency circuit device according to a still further preferred embodiment of the present invention comprises an integral laminate board used between antennas and transmitting and receiving circuits, which comprises a circuit for controlling the connection of the antennas to the transmitting circuits and the receiving circuits, and is constituted by pluralities of dielectric ceramic layers having conductor patterns for forming inductance elements and capacitance elements; and at least one semiconductor device mounted on the laminate board, one surface of the laminate board being provided with antenna terminal electrodes, pluralities of transmitting terminal electrodes, pluralities of receiving terminal electrodes, pluralities of ground electrodes, and pluralities of circuit-controlling terminal electrodes; the antenna terminal electrodes, the transmitting terminal electrodes and the receiving terminal electrodes being arranged along a periphery of the one surface; and at least one of the circuit-controlling terminal electrodes being disposed in a region inside them.

At least one power supply terminal is preferably arranged along a periphery of the one surface. The ground electrodes or the circuit-controlling terminal electrodes are preferably disposed between the antenna terminal electrodes, the transmitting terminal electrodes and the receiving terminal electrodes except for balanced input/output terminal electrodes.

The communications apparatus of the present invention comprises any one of the above high-frequency circuit devices.

EFFECT OF THE INVENTION

The high-frequency circuit device of the present invention having the above features can be miniaturized and reduced in the number of parts, suitable for wireless communications apparatuses such as multi-band communications systems, MIMO communications systems, etc.

DESCRIPTION OF THE PREFERRED EMBODIMENTS

Figure 1A:
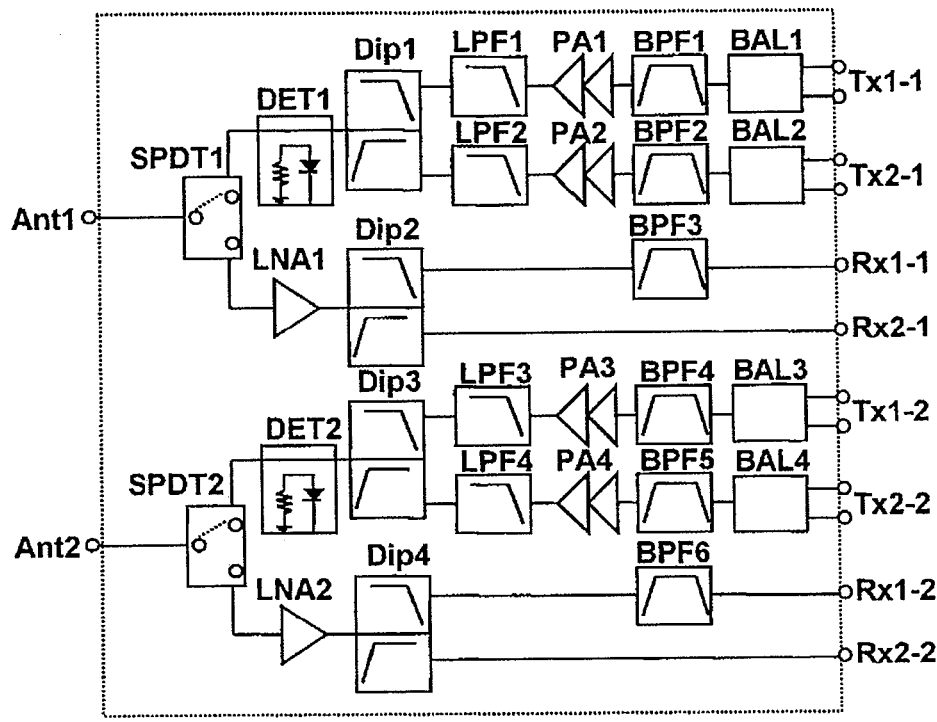
FIG. 1(a) is a block diagram showing the circuit of a high-frequency circuit device according to one embodiment of the present invention.

The high-frequency circuit device according to one embodiment of the present invention comprises at least first and second antenna terminals, at least a first transmitting terminal and at least first and second receiving terminals for one communications system (first communications system), one or more switch circuits, and two or more filter circuits, the first transmitting terminal and the first receiving terminal for the first communications system being connectable to the first antenna terminal, and the second receiving terminal for the first communications system being connectable to the second antenna terminal. The addition of a transmitting terminal and a receiving terminal for a second communications system in a different frequency provides a dual-band, high-frequency circuit device. The number of transmitting terminals (connectable to each antenna terminal) used for one communications system may be increased, and the number of antenna terminals and receiving terminals used for one communications system may be increased. With increased numbers of antenna terminals and receiving terminals, communications distance can be longer than a case where the same through-put is achieved by one antenna, thereby making it possible to provide stable through-put less influenced by the positions and directions of terminals.

A switch circuit is used to switch a path between the antenna terminal and the transmitting terminal, and a path between the antenna terminal and the receiving terminal. The switch circuit may be disposed downstream (on the transmitting/receiving terminal side) or upstream (on the antenna terminal side) of a diplexer circuit for branching transmitting/receiving paths of each communications system. In the former case, the diplexer circuit branches transmitting and receiving paths of pluralities of communications systems in different frequencies, and the switch circuit switches the connection of the transmitting and receiving paths in each communications system to a transmitting terminal and a receiving terminal. In the latter case, the switch circuit switches the connection of an antenna terminal to a transmitting path and a receiving path, the diplexer circuit in the transmitting path branching a transmitting path to transmitting terminals for pluralities of communications systems in different frequencies, and the diplexer circuit in the receiving path branching a receiving path to receiving terminals for pluralities of communications systems in different frequencies. Such structure reduces the number of switch circuits, resulting in low cost and miniaturization. This structure is suitable for MIMO-type, high-frequency circuit devices needing many switches because of large numbers of transmitting and receiving paths.

To attenuate unnecessary signals other than received signals and transmitting signals, one communications system is preferably provided with two or more filter circuits. The filter circuit is disposed in each transmitting path and each receiving path in one communications system. The filter circuit may be a highpass filter circuit, a bandpass filter circuit, a lowpass filter circuit, etc., depending on necessary filter characteristics.

A low-noise amplifier circuit is preferably disposed in the receiving path connecting the antenna terminal to the receiving terminal. When one communications system comprises at least first and second receiving terminals, the low-noise amplifier circuit is preferably arranged in a receiving path connected to each receiving terminal. Pluralities of low-noise amplifier circuits preferably share one power supply.

Pluralities of high-frequency amplifier circuits for amplifying transmitting signals preferably share one power supply. The high-frequency amplifier circuits are disposed in transmitting paths for pluralities of communications systems in different frequencies, but when one communications system comprises two or more transmitting paths, the high-frequency amplifier circuit is disposed in each transmitting path. When pluralities of high-frequency amplifier circuits share a power supply, the numbers of power supply circuits and terminals are reduced. This structure is suitable for reducing the size and cost of MIMO-type, high-frequency circuit devices comprising many circuit elements needing power supplies.

FIG. 1(a) shows the circuit of a high-frequency circuit device according to one embodiment of the present invention. This circuit comprises two antenna terminals Ant1, Ant2, two transmitting terminals Tx1-1, Tx1-2 and two receiving terminals Rx1-1, Rx1-2 for a first communications system, and two transmitting terminals Tx2-1, Tx2-2 and two receiving terminals Rx2-1, Rx2-2 for a second communications system.

The first antenna terminal Ant1 is connected to a first switch circuit SPDT1, which is connected to a first diplexer circuit Dip1 via a first detection circuit DET1. The first diplexer circuit Dip1 is connected via a lowpass filter LPF1 to a first high-frequency amplifier circuit PA1, which is connected to a first transmitting terminal Tx1-1 for the first communications system via a first bandpass filter BPF1 and a balanced-to-unbalanced circuit BAL1. The first diplexer circuit Dip1 is also connected via a lowpass filter LPF2 to a second high-frequency amplifier circuit PA2, which is connected to a first transmitting terminal Tx2-1 for the second communications system via a second bandpass filter BPF2 and a balanced-to-unbalanced circuit BAL2. The first switch circuit SPDT1 is also connected via a low-noise amplifier LNA1 to a second diplexer circuit Dip2, which is connected to a first receiving terminal Rx1-1 for the first communications system via a third bandpass filter BPF3, and to a first receiving terminal Rx2-1 for the second communications system.

The second antenna terminal Ant2 is connected to a second switch circuit SPDT2, which is connected to a third diplexer circuit Dip3 via a detection circuit DET2. The third diplexer circuit Dip3 is connected via a lowpass filter LPF3 to a third high-frequency amplifier circuit PA3, which is connected to a second transmitting terminal Tx1-2 for the first communications system via a fourth bandpass filter BPF4 and a balanced-to-unbalanced circuit BAL3. The third diplexer circuit Dip3 is also connected via a lowpass filter LPF4 to a fourth high-frequency amplifier circuit PA4, which is connected to a second transmitting terminal Tx2-2 for the second communications system via a fifth bandpass filter BPF5 and a balanced-to-unbalanced circuit BAL4. The second switch circuit SPDT2 is also connected via a low-noise amplifier LNA2 to a fourth diplexer circuit Dip4, which is connected to a second receiving terminal Rx1-2 for the first communications system via a sixth bandpass filter BPF6, and to a second receiving terminal Rx2-2 for the second communications system.

Figure 1B:
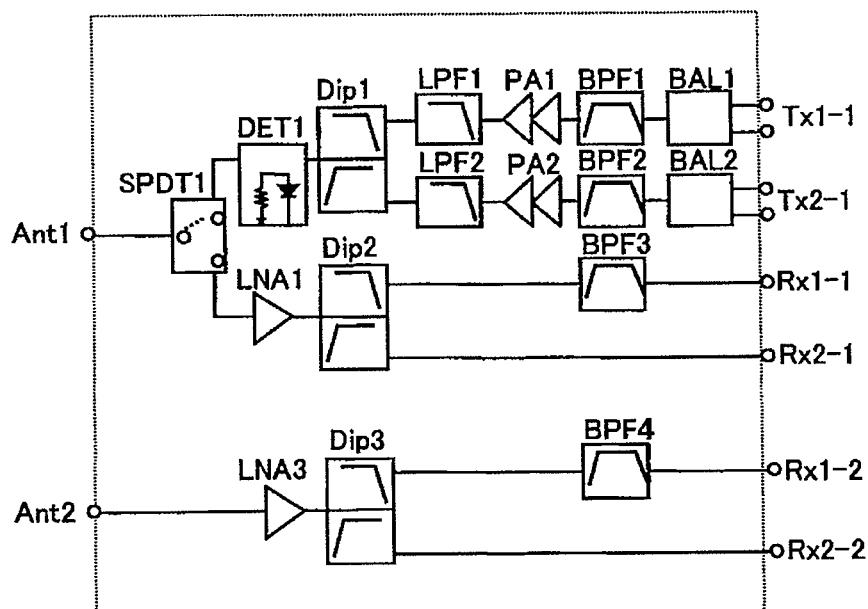
FIG. 1(b) is a block diagram showing the circuit of a high-frequency circuit device according to another embodiment of the present invention.

FIG. 1(b) shows the circuit of a high-frequency circuit device according to another embodiment of the present invention. This circuit is the same as shown in FIG. 1(a), except that the path from the switch circuit SPDT2 to the first and second transmitting terminals Tx1-2, Tx2-2 is removed from the path connected to the second antenna terminal Ant2.

Figure 2:
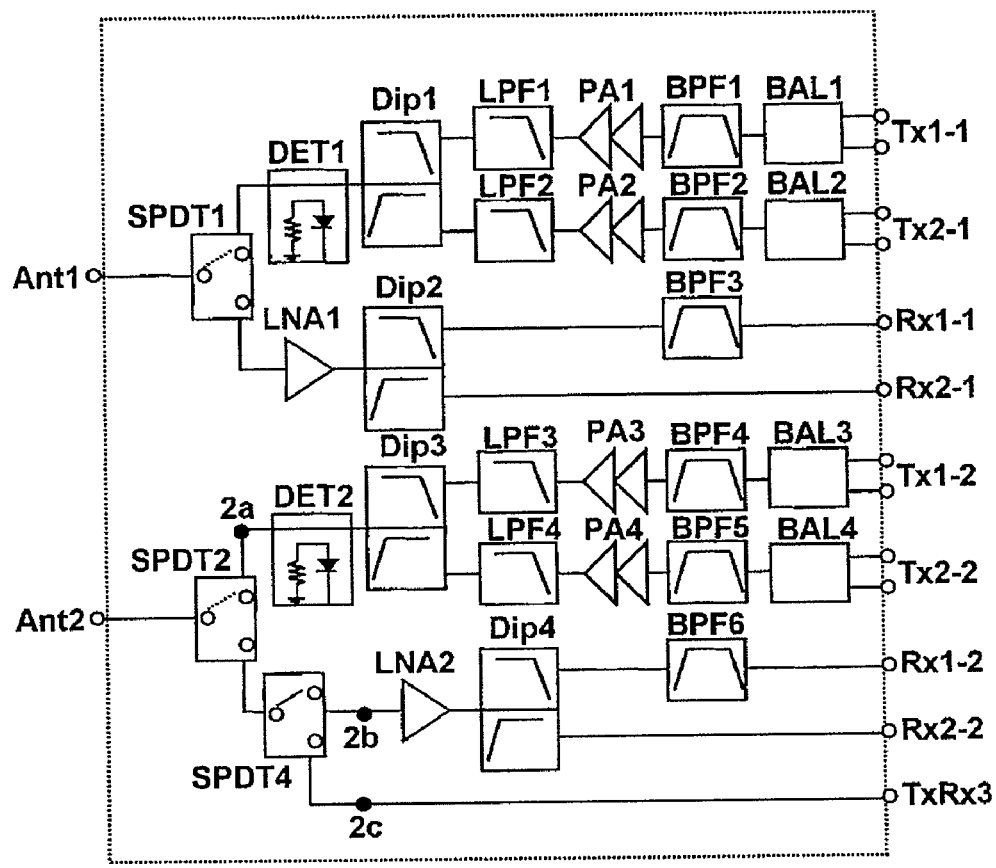
FIG. 2 is a block diagram showing the circuit of a high-frequency circuit device according to a further embodiment of the present invention.

FIG. 2 shows the circuit of a high-frequency circuit device according to a further embodiment of the present invention. This circuit is obtained by adding a transmitting/receiving terminal TxRx3 for a third communications system to the high-frequency circuit device shown in FIG. 1(a). Accordingly, it comprises a switch circuit SPDT4 between the second switch circuit SPDT2 and the low-noise amplifier LNA2.

Figure 23A:
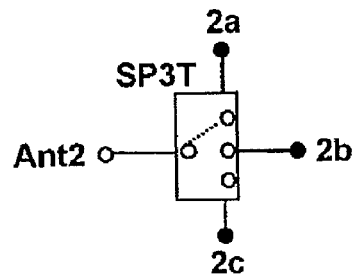
FIG. 23(a) is a block diagram showing another example of switch circuits used in the high-frequency circuit device of the present invention.
Figure 23B:
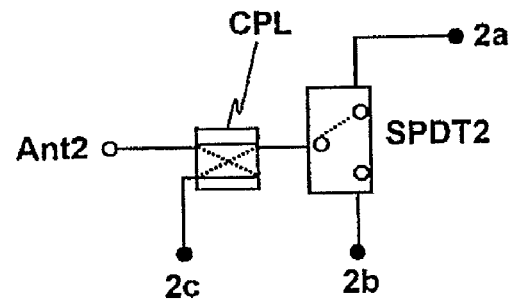
FIG. 23(b) is a block diagram showing a further example of switch circuits used in the high-frequency circuit device of the present invention.
Figure 23C:
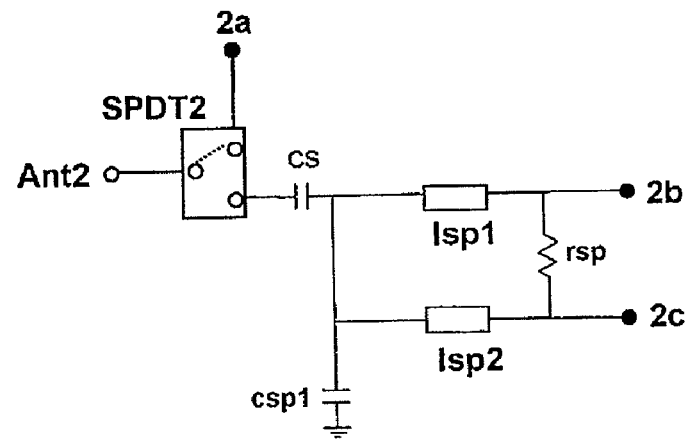
FIG. 23(c) is a block diagram showing a still further example of switch circuits used in the high-frequency circuit device of the present invention.

In place of the switch circuit SPDT4, an SP3T-type switch circuit may be disposed between the antenna terminal Ant2 and points 2a, 2b, 2c (FIG. 2) as shown in FIG. 23(a), a coupler circuit CPL may be disposed upstream of the switch circuit SPDT2 as shown in FIG. 23(b), or a distribution circuit may be disposed downstream of the switch circuit SPDT2 as shown in FIG. 23(c).

Figure 3:
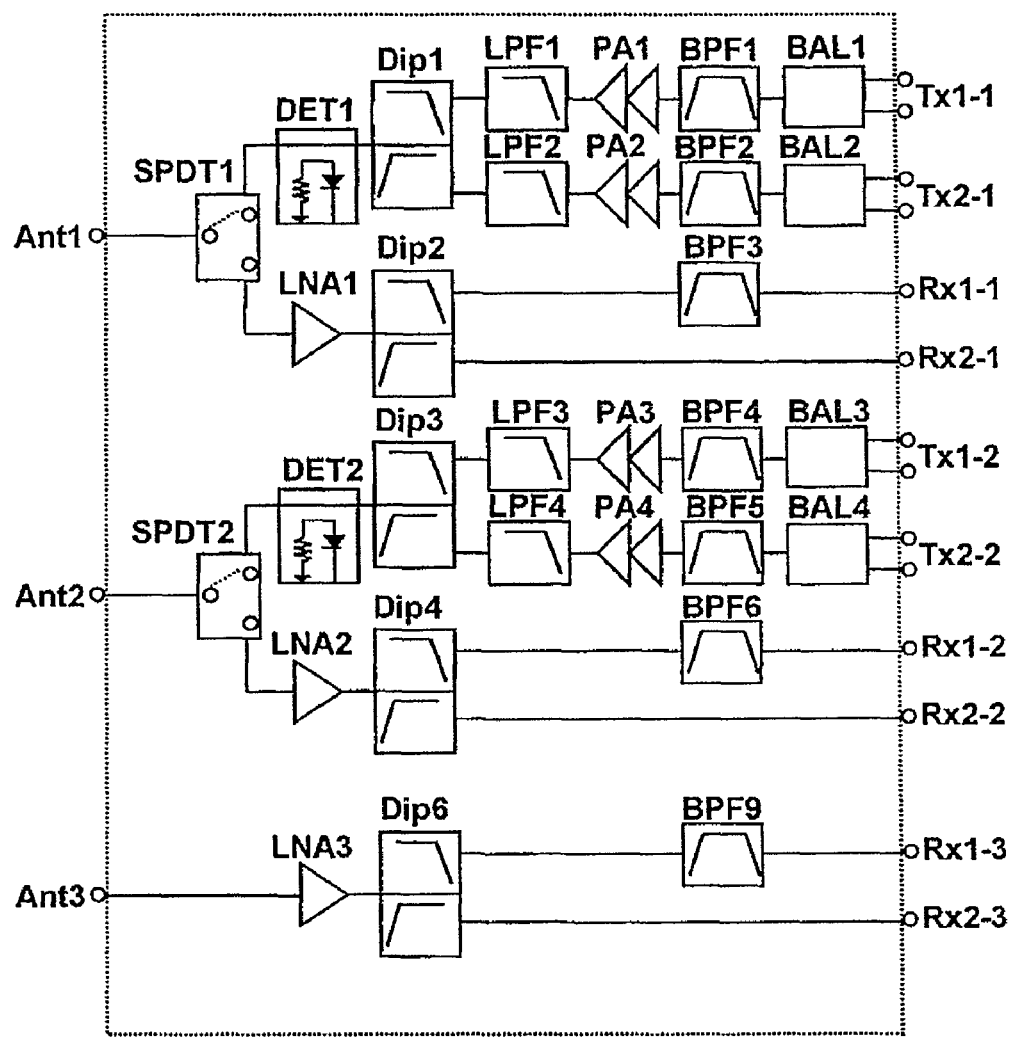
FIG. 3 is a block diagram showing the circuit of a high-frequency circuit device according to a still further embodiment of the present invention.

FIG. 3 shows the circuit of a high-frequency circuit device according to a still further embodiment of the present invention. This circuit is obtained by adding a third antenna terminal Ant3, a third receiving terminal Rx1-3 for a first communications system, and a third receiving terminal Rx2-3 for a second communications system to the high-frequency circuit device shown in FIG. 1(a). The third antenna terminal Ant3 is connected via a low-noise amplifier LNA3 to a diplexer circuit Dip6, which is connected to the third receiving terminal Rx1-3 for the first communications system via a bandpass filter BPF9, and to a third receiving terminal Rx2-3 for the second communications system.

Figure 4:
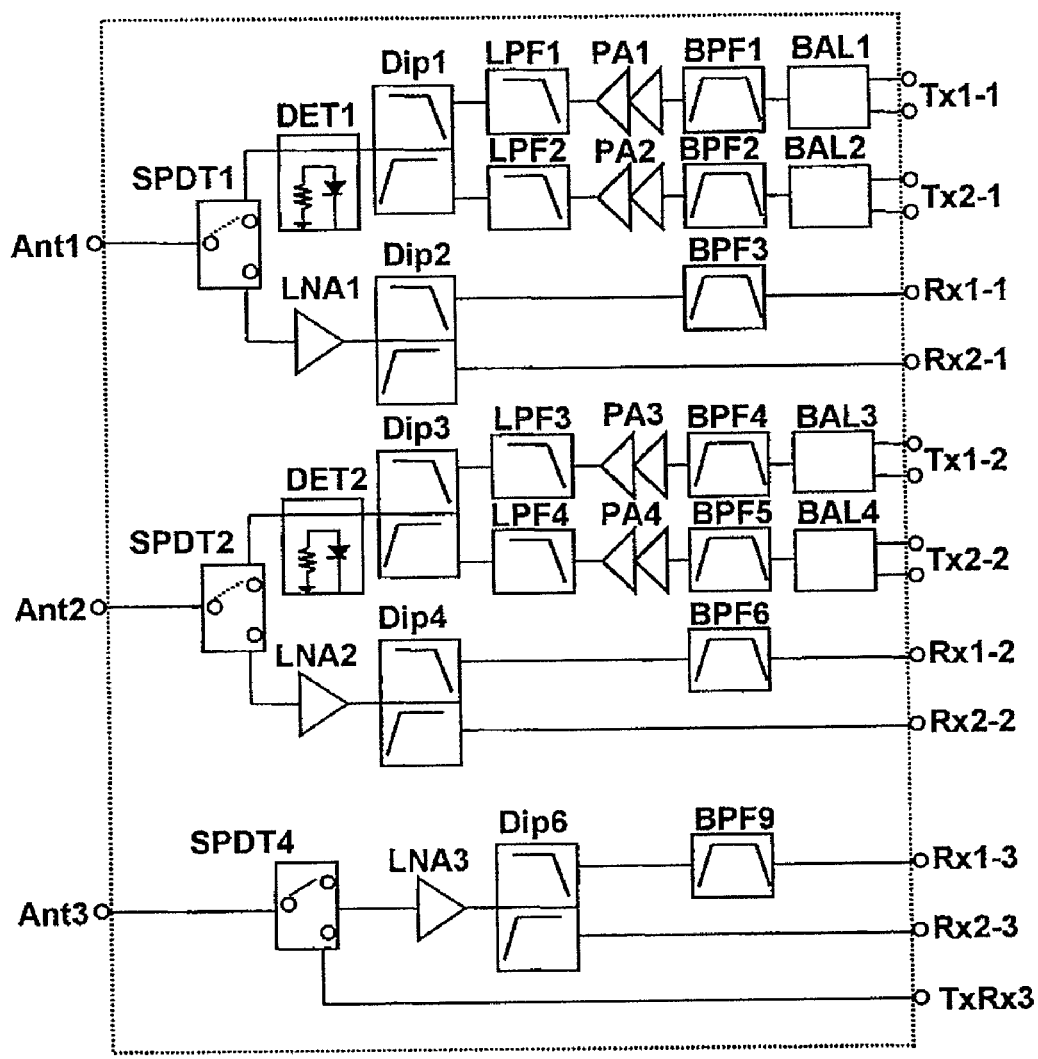
FIG. 4 is a block diagram showing the circuit of a high-frequency circuit device according to a still further embodiment of the present invention.

FIG. 4 shows the circuit of a high-frequency circuit device according to a still further embodiment of the present invention. This circuit is obtained by adding a transmitting/receiving terminal TxRx3 for the third communications system to the high-frequency circuit device shown in FIG. 3. Accordingly, it comprises a switch circuit SPDT4 between the third antenna terminal Ant3 and the low-noise amplifier LNA3. In place of the switch circuit SPDT4, a coupler or a distribution circuit connected to the transmitting/receiving terminal TxRx3 for the third communications system may be disposed.

Figure 5:
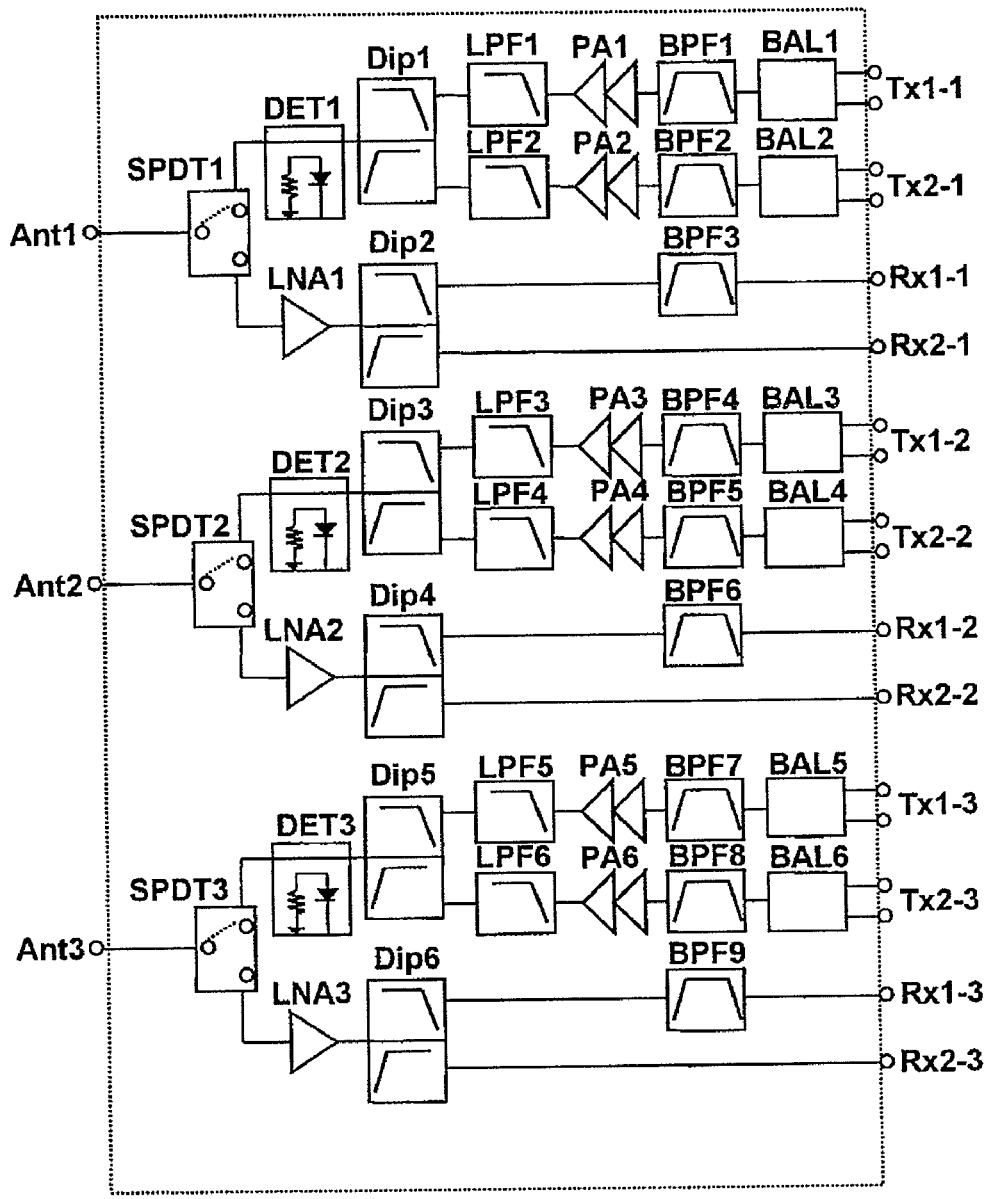
FIG. 5 is a block diagram showing the circuit of a high-frequency circuit device according to a still further embodiment of the present invention.

FIG. 5 shows the circuit of a high-frequency circuit device according to a still further embodiment of the present invention. This circuit is obtained by adding a third antenna terminal Ant3, a third transmitting terminal Tx1-3 and a third receiving terminal Rx1-3 for a first communications system, and a third transmitting terminal Tx2-3 and a third receiving terminal Rx2-3 for a second communications system to the high-frequency circuit device shown in FIG. 1(a). Accordingly, the same circuit as shown in FIG. 1(a) is disposed between the third antenna terminal Ant3 and the third transmitting terminal Tx1-3 and the third receiving terminal Rx1-3 for a first communications system, and the third transmitting terminal Tx2-3 and the third receiving terminal Rx2-3 for a second communications system. Specifically, the third switch circuit SPDT3 connected to the third antenna terminal Ant3 is connected via a detection circuit DET3 to a fifth diplexer circuit Dip5, which is connected to a fifth high-frequency amplifier circuit PA5 via a lowpass filter LPF5. The fifth high-frequency amplifier circuit PA5 is connected to the third transmitting terminal Tx1-3 for a first communications system via a seventh bandpass filter BPF7 and a balanced-to-unbalanced circuit BAL5. The fifth diplexer circuit Dip5 is also connected via a lowpass filter LPF6 to a sixth high-frequency amplifier circuit PA6, which is connected to the third transmitting terminal Tx2-3 for a second communications system via an eighth bandpass filter BPF8 and a balanced-to-unbalanced circuit BALE. The third switch circuit SPDT3 is also connected via a low-noise amplifier LNA3 to a sixth diplexer circuit Dip6, which is connected to the third receiving terminal Rx1-3 for a first communications system via a ninth bandpass filter BPF9, and to the third receiving terminal Rx2-3 for a second communications system.

Figure 6:
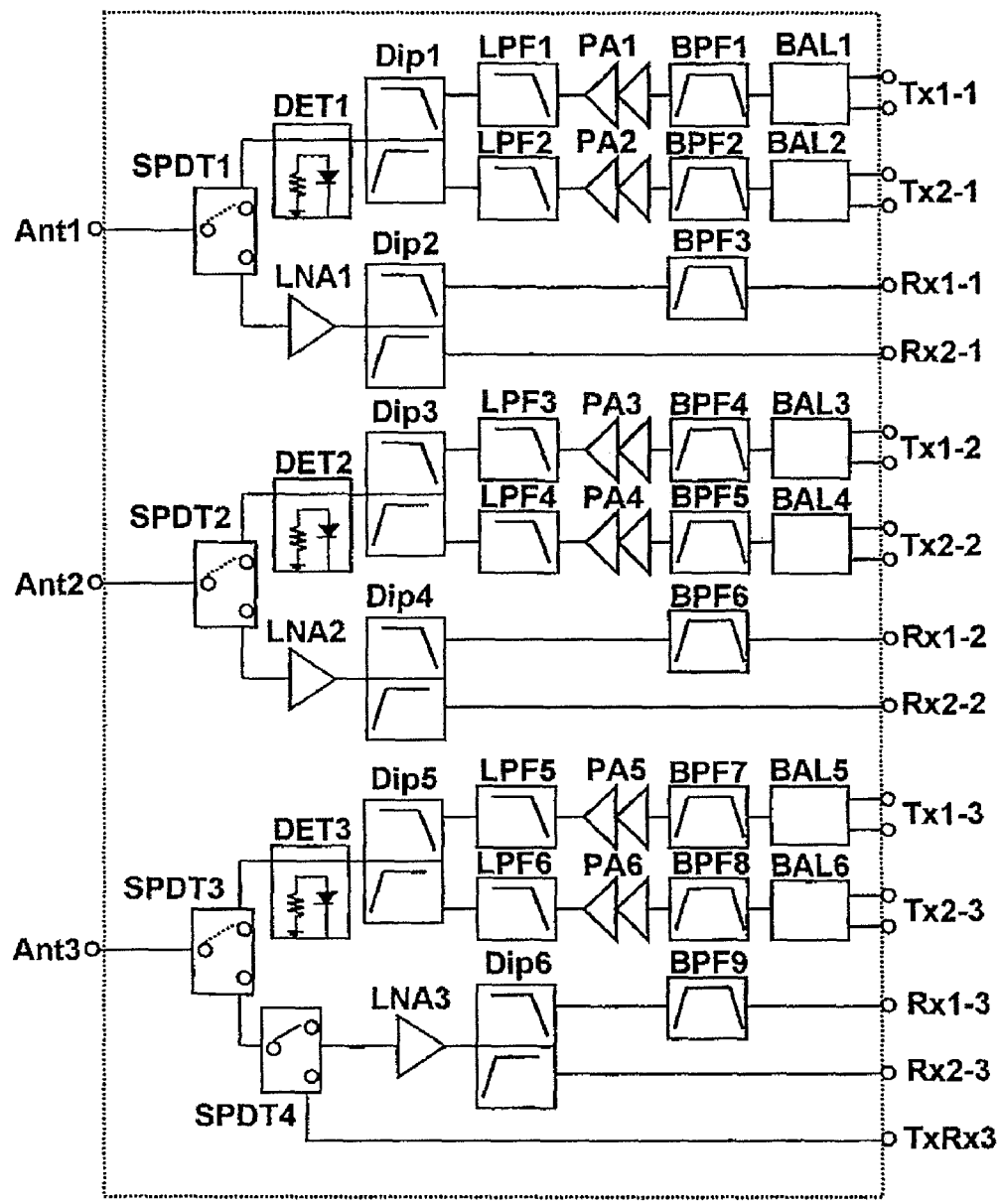
FIG. 6 is a block diagram showing the circuit of a high-frequency circuit device according to a still further embodiment of the present invention.

FIG. 6 shows the circuit of a high-frequency circuit device according to a still further embodiment of the present invention. This circuit is obtained by adding a transmitting/receiving terminal TxRx3 for a third communications system to the high-frequency circuit device shown in FIG. 5. Accordingly, it comprises a fourth switch circuit SPDT4 between the third switch circuit SPDT3 and the low-noise amplifier LNA3. In this embodiment, the switching of transmitting paths and receiving paths is conducted by the switch circuits SPDT1, SPDT2, SPDT3, and the lower-frequency communications system (first communications system) and the higher-frequency communications system (second communications system) are divided by the diplexer circuits Dip1-Dip6.

In this embodiment, each diplexer circuit Dip1-Dip6 is constituted by a combination of a lowpass filter and a highpass filter, though other filters (bandpass filter, notch filter, etc.) may be used. The lowpass filters LPF1-LPF6 can be omitted by adding a lowpass filter function to the diplexer circuits Dip1, Dip3, Dip5.

Each balanced-to-unbalanced circuit BAL1-BAL6 has a function to convert a balanced (differential) output of a transceiver IC to an unbalanced (single-end) output suitable as an input to the high-frequency amplifier circuit, though it may be omitted. In this embodiment, the outputs of the receiving terminals Rx1-1, Rx2-1, Rx1-2, Rx2-2, Rx1-3, Rx2-3 are unbalanced outputs. Accordingly, a balanced-to-unbalanced circuit directly connected to the transceiver IC may be added.

Each low-noise amplifier LNA1-LNA3 disposed between each diplexer circuit and each receiving terminal may be disposed outside the high-frequency circuit device.

Each detection circuit DET1-DET3 preferably comprises a directional coupler between the SPDT switch and the diplexer circuit, and a detecting diode circuit such as a Schottky diode, etc. This structure can reduce the number of detection circuits from six (one per each PA) to three. Of course, a coupler circuit CPL as a detection circuit may be disposed between the high-frequency amplifier circuit PA and the lowpass filter LPF, or a detection function of the high-frequency amplifier circuit PA may be utilized, as in conventional technologies.

In this embodiment, the first communications system can be a wireless LAN system having a 2.4-GHz band, and the second communications system can be a wireless LAN system having 5-GHz band. The standards of wireless LAN include, for instance, (a) IEEE802.11a using an OFDM (orthogonal frequency division multiples) modulation system for supporting high-speed data communications in a 5-GHz band at maximum 54 Mbps, (b) IEEE802.11b using a DSSS (direct sequence spread spectrum) system for supporting high-speed communications at 5.5 Mbps and 11 Mbps in a 2.4-GHz ISM (industrial, scientific and medical) band utilizable without license, and (c) IEEE802.11g using an OFDM modulation system for supporting high-speed data communications at maximum 54 Mbps in the same 2.4-GHz band as in IEEE802.11b. Wireless LAN data communications of these IEEE802.11 standards are now widely used, for instance, for personal computers (PCs), PC peripherals such as printers, hard disk drives and broadband rooters, electronic equipments such as FAXs, refrigerators, standard-definition televisions (SDTVs), high-definition televisions (HDTVs), digital cameras, digital video recorders and cell phones, signal-transmitting means in automobiles or aircrafts.

In the example shown in FIG. 1(a), the first communications system is a wireless LAN system of a 2.4-GHz band, and the second communications system is a wireless LAN system of a 5-GHz band, higher frequency than that of the first communications system. With two transmitting terminals and two receiving terminals in each communications system, the transmitting and receiving circuits connected to the first antenna terminal Ant1 and the transmitting and receiving circuits connected to the second antenna terminal Ant2 are simultaneously operated, providing a higher data communications speed than that of diversity circuits used in conventional wireless LAN equipments (transmitting and receiving by only one of two lines), and a longer communications distance than when the same through-put is achieved by one antenna. Accordingly, stable through-put less influenced by the positions and directions of terminals can be achieved.

In the example shown in FIG. 3, the addition of the third antenna terminal Ant3 and the third receiving terminals Rx1-3, Rx2-3 increases the number of receiving paths from 2 to 3, resulting in increase in receiving sensitivity and communications distance and improvement in through-put over the example shown in FIG. 1(a).

In the example shown in FIG. 5, the addition of the transmitting and receiving circuits connected to the third antenna terminal Ant3 increases the number of transmitting and receiving paths from 2 to 3, resulting in increase in transmitting signal intensity and receiving sensitivity over the example shown in FIG. 1(a), and increase in communications distance and improvement in through-put over the example shown in FIG. 3.

Because each example shown in FIGS. 2, 4 and 6 has a circuit structure comprising a transmitting/receiving terminal TxRx3 added to each example shown in FIGS. 1(a), 3 and 5, the use of the transmitting/receiving terminal TxRx3 as a Bluetooth transmitting/receiving terminal, for instance, provides a front-end part capable of handling pluralities of wireless systems (wireless LAN and Bluetooth in 2.4-GHz band and 5-GHz band).

Figure 24:
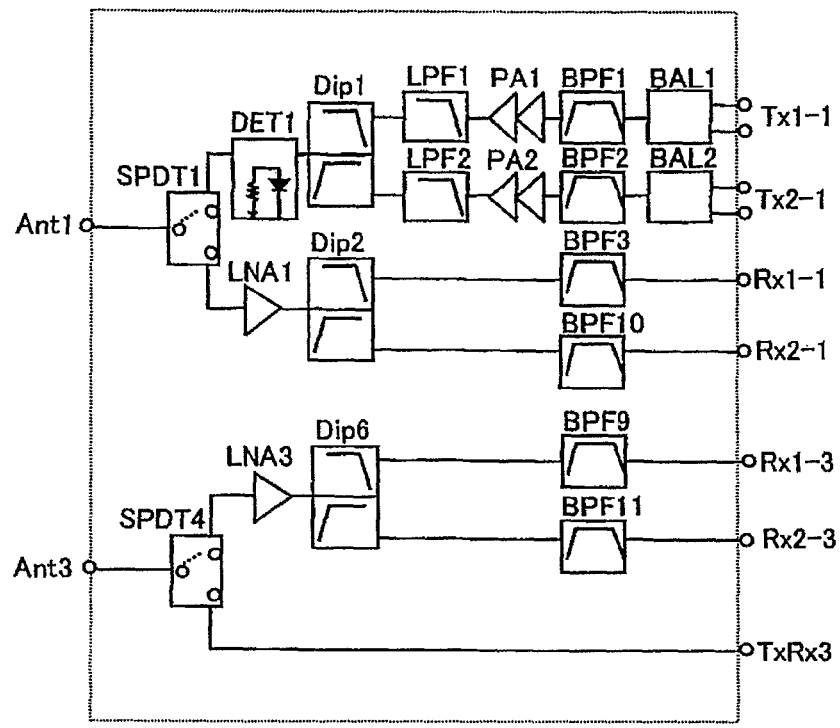
FIG. 24 is a block diagram showing the circuit of a high-frequency circuit device according to a still further embodiment of the present invention.

FIG. 24 shows the circuit of a high-frequency circuit device according to a still further embodiment of the present invention. This circuit is obtained by removing a circuit structure ranging from the second antenna terminal Ant2 to the second transmitting terminals Tx1-2, Tx2-2 and the second receiving terminals Rx1-2, Rx2-2 from the circuit shown in FIG. 4. The circuit in this embodiment comprises first and third antenna terminals Ant1, Ant3, one transmitting terminal Tx1-1 and two receiving terminals Rx1-1, Rx1-3 for a first communications system, and one transmitting terminal Tx2-1 and two receiving terminals Rx2-1, Rx2-3 for a second communications system. Namely, this circuit has an 1T2R structure, in which each communications system comprises one transmitting terminal and two receiving terminals.

The first antenna terminal Ant1 is connected to a first switch circuit SPDT1, which is connected to a first diplexer circuit Dip1 via a first detection circuit DET1. The lower-frequency side of the first diplexer circuit Dip1 is connected via a lowpass filter LPF1 to a first high-frequency amplifier circuit PA1, which is connected to a first bandpass filter BPF1. The first bandpass filter BPF1 is connected to a first transmitting terminal Tx1-1 for a first communications system via a balanced-to-unbalanced circuit BAL1. The high-frequency side of the first diplexer circuit Dip1 is connected via a lowpass filter LPF2 to a second high-frequency amplifier circuit PA2, which is connected to a second bandpass filter BPF2. The second bandpass filter BPF2 is connected to a first transmitting terminal Tx2-1 for a second communications system via a balanced-to-unbalanced circuit BAL2.

The first switch circuit SPDT1 is also connected via a low-noise amplifier LNA1 to a second diplexer circuit Dip2, a lower-frequency side of which is connected to a first receiving terminal Rx1-1 for a first communications system via a third bandpass filter BPF3. The high-frequency side of the second diplexer circuit Dip2 is connected to a first receiving terminal Rx2-1 for a second communications system via a tenth bandpass filter BPF10. As shown in FIG. 4, however, the second diplexer circuit Dip2 may be connected to the first receiving terminal Rx2-1 for a second communications system without a bandpass filter. The connection of a highpass filter HPF capable of attenuating a lower frequency band than the passband in place of the bandpass filter BPF can effectively reduce insertion loss. Thus, a structure in which a bandpass filter or a highpass filter is disposed on the high-frequency side of the receiving path is of course usable in the embodiments shown in FIGS. 1-7, etc.

The circuit shown in FIG. 24 further comprises a third antenna terminal Ant3, a third receiving terminal Rx1-3 for a first communications system, a third receiving terminal Rx2-3 for a second communications system, and a transmitting/receiving terminal TxRx3 for a third communications system. To have the transmitting/receiving terminal TxRx3 for the third communications system, a switch circuit SPDT4 is disposed between the antenna terminal Ant3 and the low-noise amplifier LNA3. The low-noise amplifier LNA3 is connected to a diplexer circuit Dip6, a lower-frequency side of which is connected to the third receiving terminal Rx1-3 for a first communications system via a bandpass filter BPF9. The higher-frequency side of the diplexer circuit Dip6 is connected to the third receiving terminal Rx2-3 for a second communications system via a bandpass filter BPF11. The switch circuit SPDT4 is connected to the transmitting/receiving terminal TxRx3 for the third communications system. As shown in FIG. 4, the diplexer circuit Dip6 may be connected to the third receiving terminal Rx2-3 for a second communications system without the bandpass filter BPF11. The connection of a highpass filter HPF in place of the bandpass filter BPF can effectively reduce insertion loss. The structures and arrangements of the switch circuits, the diplexer circuits, the low-noise amplifiers, the balanced-to-unbalanced circuits, the detection circuits, etc. may be the same as in another embodiment.

Figure 25:
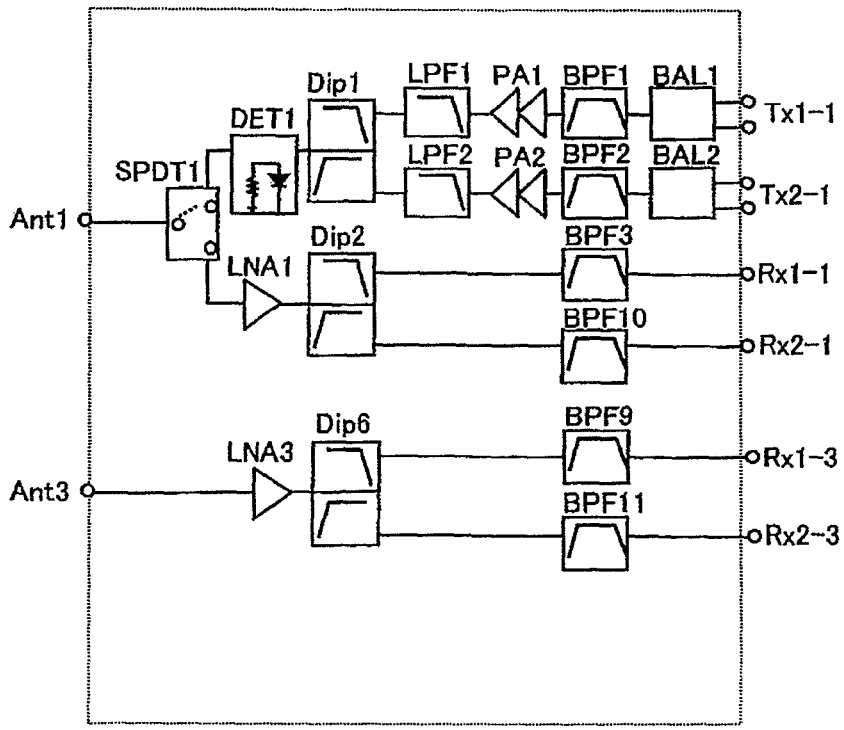
FIG. 25 is a block diagram showing the circuit of a high-frequency circuit device according to a still further embodiment of the present invention.

As shown in FIG. 25, the switch circuit SPDT4 and the transmitting/receiving terminal TxRx3 for the third communications system may be omitted.

A structure in the circuit shown in FIG. 4, which is not owned by the circuit shown in FIG. 24, is a circuit structure ranging from the antenna terminal Ant2 to the transmitting terminals Tx1-2, Tx2-2 and the receiving terminals Rx1-2, Rx2-2, which is an 1T1R structure comprising one transmitting terminal and one receiving terminal per one communications system. The 1T1R structure has been explained referring to FIG. 1(a). A discrete high-frequency circuit device having a 1T1R structure and a discrete high-frequency circuit device having a the above 1T2R structure can be combined to provide a 2T3R structure comprising two transmitting terminals and three receiving terminals per one communications system.

Figure 27:
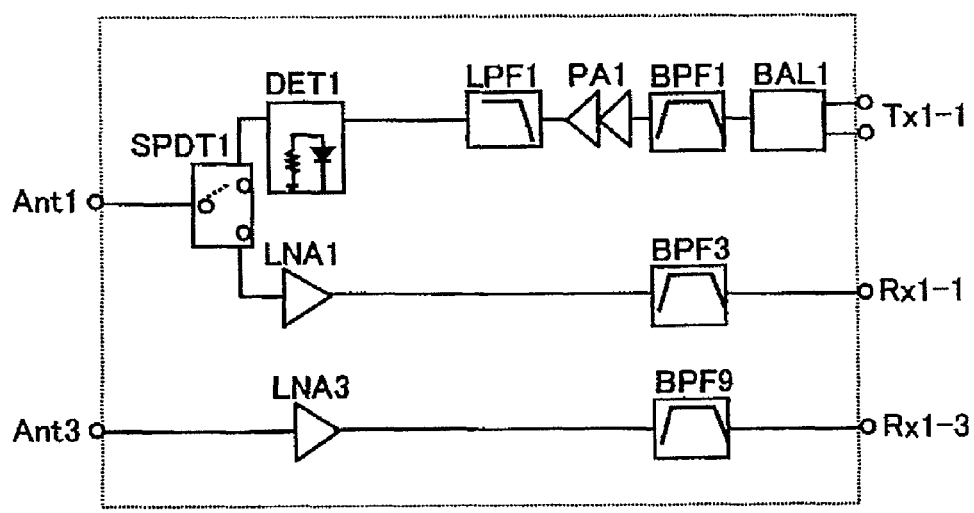
FIG. 27 is a block diagram showing the circuit of a high-frequency circuit device according to a still further embodiment of the present invention.
Figure 28A:
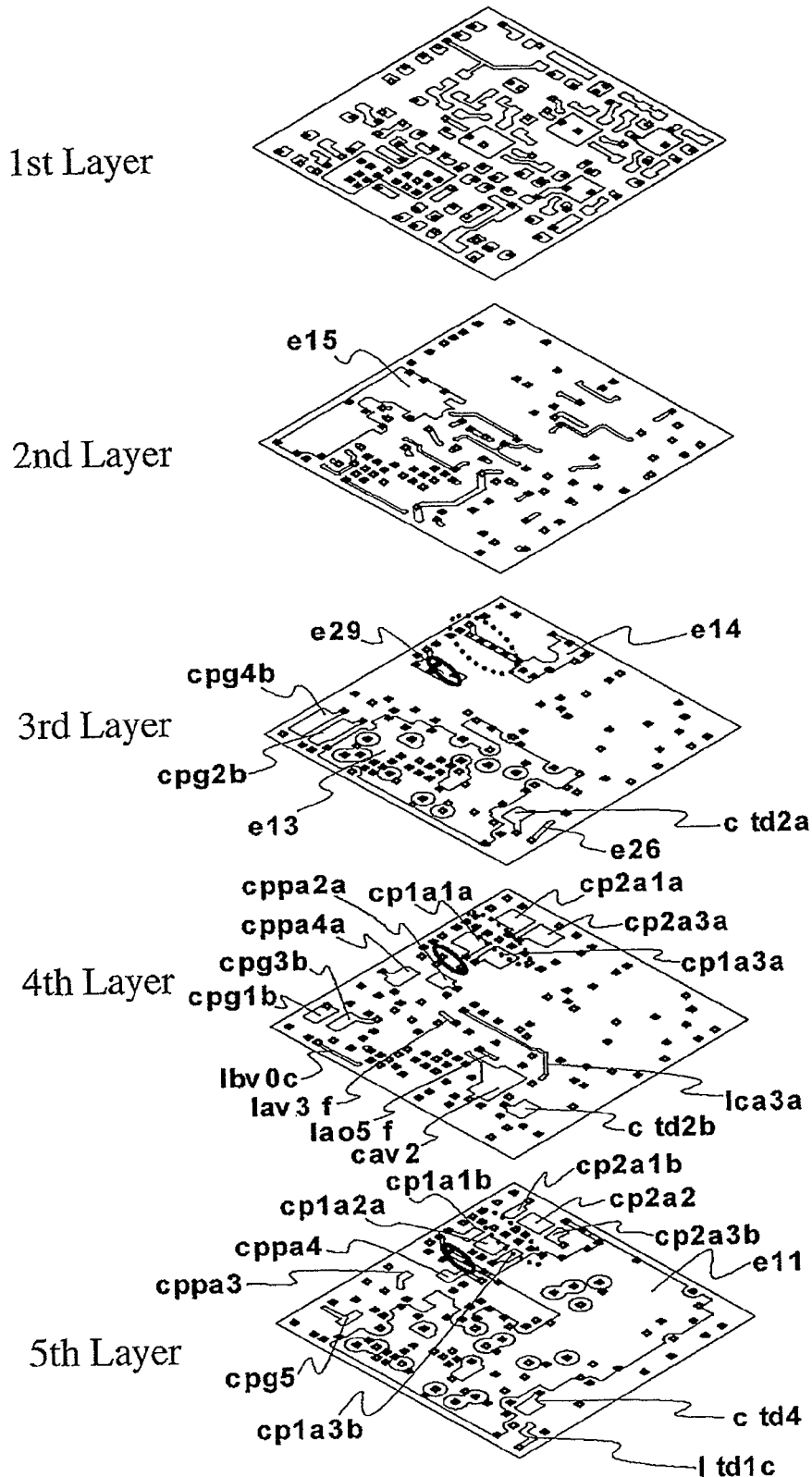
FIG. 28(a) is a perspective view showing conductor patterns on first to fifth layers in a laminate board constituting the high-frequency circuit device according to one embodiment of the present invention.
Figure 28B:
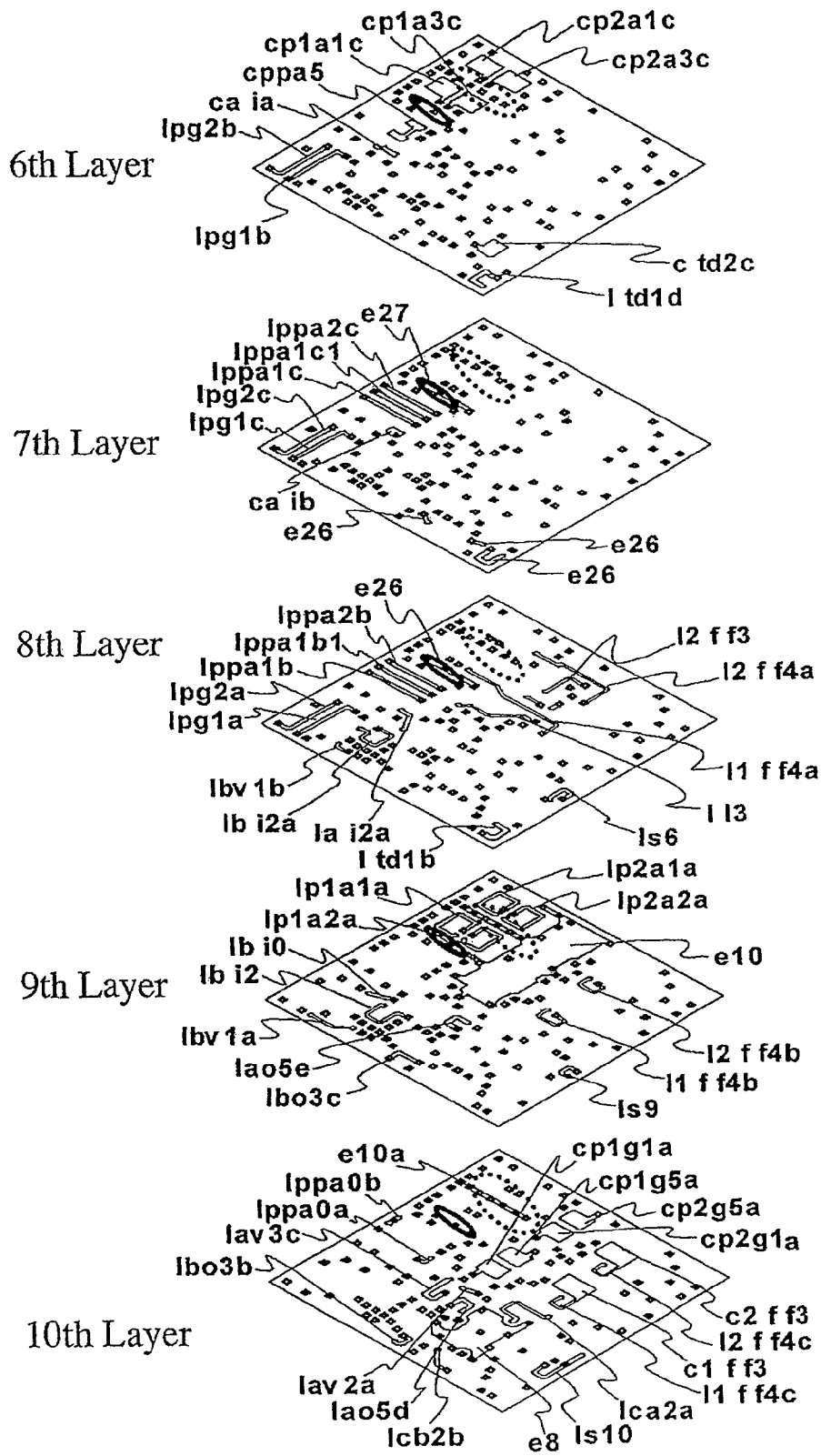
FIG. 28(b) is a perspective view showing conductor patterns on sixth to 10th layers in a laminate board constituting the high-frequency circuit device according to one embodiment of the present invention.
Figure 28C:
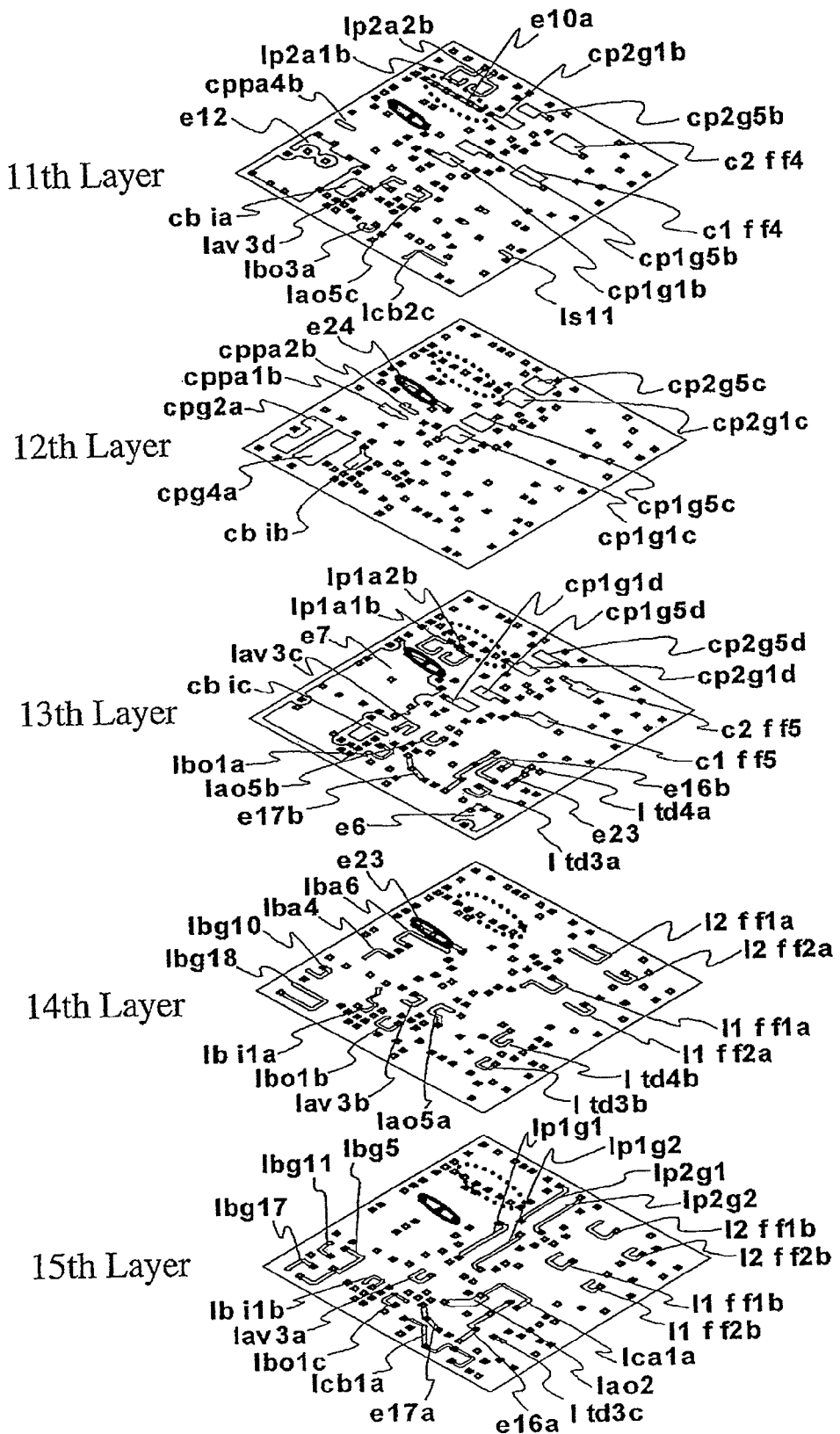
FIG. 28(c) is a perspective view showing conductor patterns on 11th to 15th layers in a laminate board constituting the high-frequency circuit device according to one embodiment of the present invention.
Figure 28D:
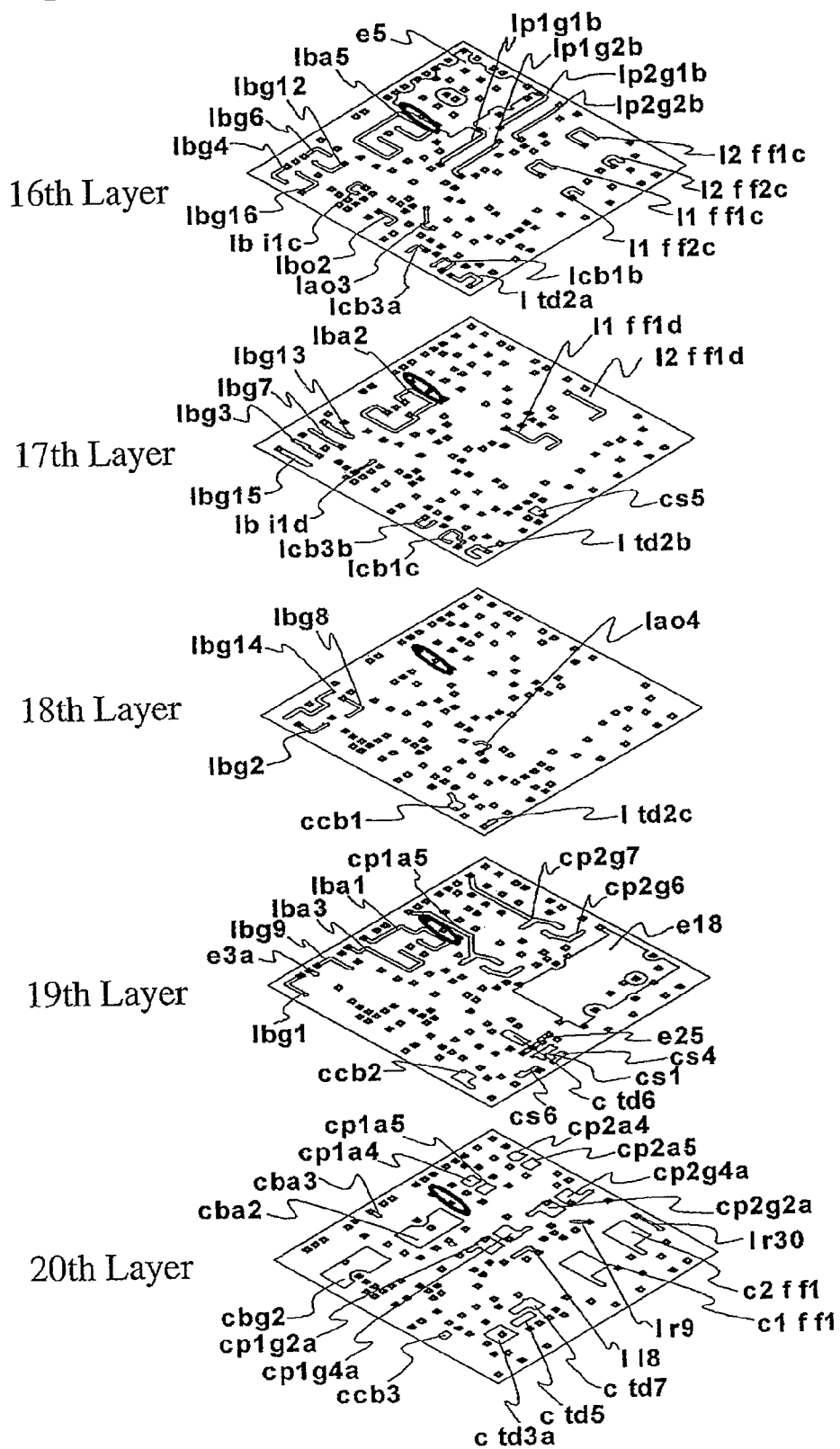
FIG. 28(d) is a perspective view showing conductor patterns on 16th to 20th layers in a laminate board constituting the high-frequency circuit device according to one embodiment of the present invention.
Figure 28E:
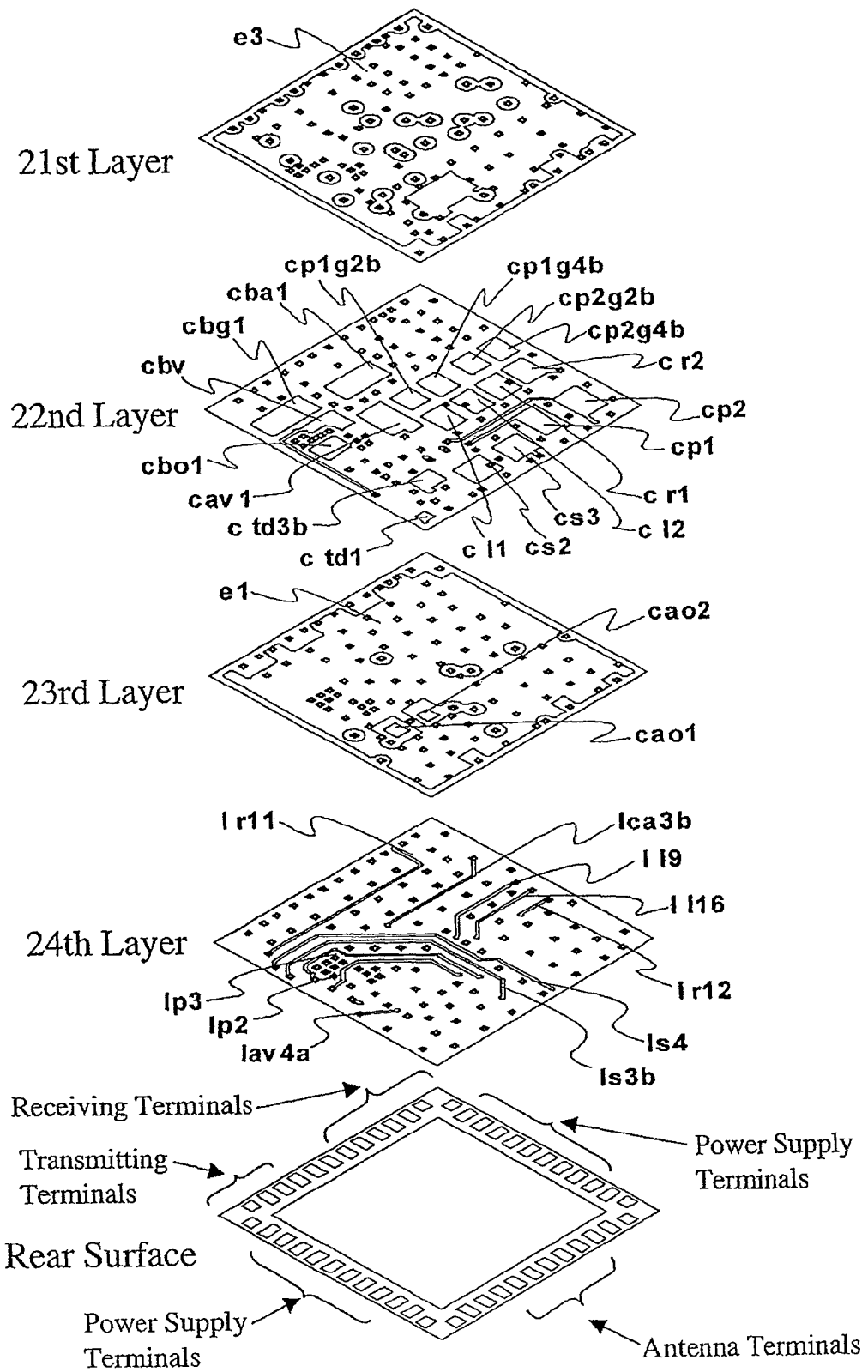
FIG. 28(e) is a perspective view showing conductor patterns on 21st to 24th layers in a laminate board constituting the high-frequency circuit device according to one embodiment of the present invention, and the arrangement of terminals on a rear surface.

The above embodiment is adapted to dual-band communications using the first and second communications systems, and in the case of a single-band communications using one communications system, the circuit structure connected to the transmitting terminal and the receiving terminal for a second communications system and the diplexer circuit need only be removed from the above embodiment. For instance, when a portion corresponding to the second communications system is removed, the circuit shown in FIG. 25 is turned to the structure shown in FIG. 27 for single-band communications. Namely, the first antenna terminal Ant1 is connected to the first switch circuit SPDT1, which is connected to the first high-frequency amplifier circuit PA1 via the detection circuit DET1 and the lowpass filter LPF1. The first high-frequency amplifier circuit PA1 is connected to the first bandpass filter BPF1, which is connected to the first transmitting terminal Tx1-1 for the first communications system via the balanced-to-unbalanced circuit BAL1. The first switch circuit SPDT1 is also connected to the low-noise amplifier LNA1, which is connected to the first receiving terminal Rx1-1 for a first communications system via the third bandpass filter BPF3. The second antenna terminal Ant3 is connected to the low-noise amplifier LNA3, which is connected to the second receiving terminal Rx1-3 for a first communications system via the bandpass filter circuit BPF9.

Figure 7:
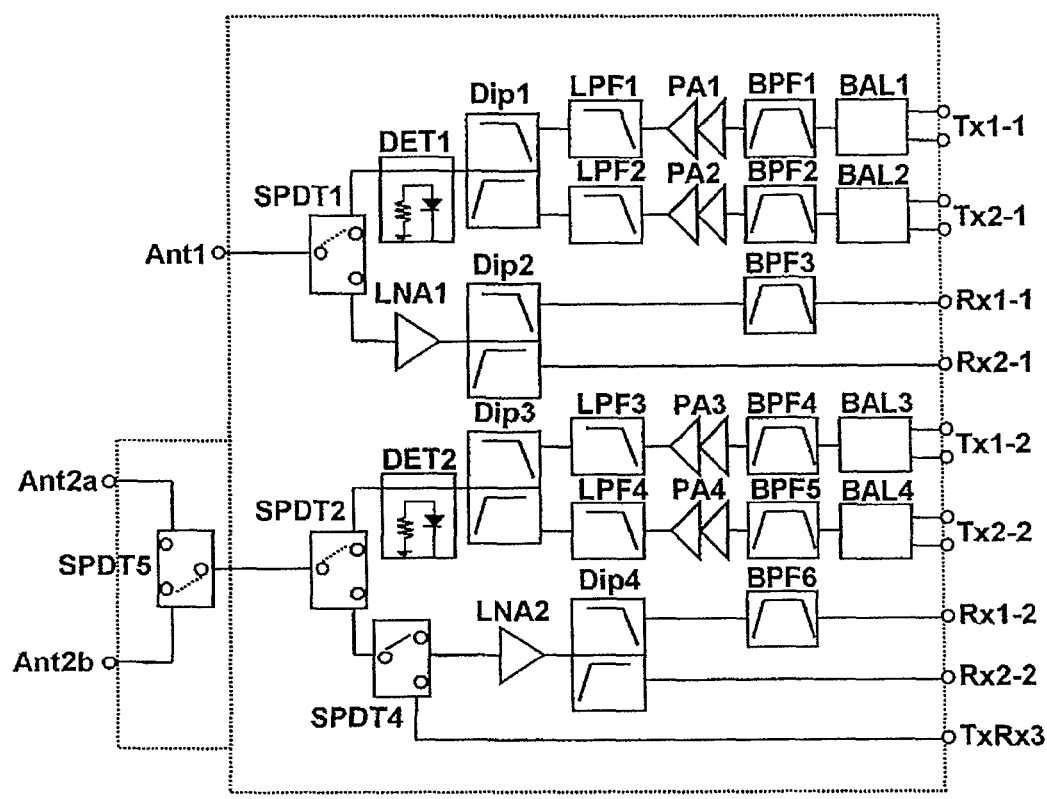
FIG. 7 is a block diagram showing the circuit of a high-frequency circuit device according to a still further embodiment of the present invention.

FIG. 7 shows the circuit of a high-frequency circuit device according to a still further embodiment of the present invention. This circuit is a modification of the circuit shown in FIG. 2, the second antenna terminal Ant2 connected to the switch circuit SPDT2 being divided to two antenna terminals Ant2a, Ant2b to obtain a diversity effect. Thus, the two antenna terminals Ant2a, Ant2b connected to the switch circuit SPDT5 are added. The two switch circuits SPDT2, SPDT5 may be replaced by a 2-input, 2-output-type switch circuit. The switch circuit SPDT5 may be mounted outside. Of course, this structure for a diversity effect may be used in other embodiments.

Figure 8:
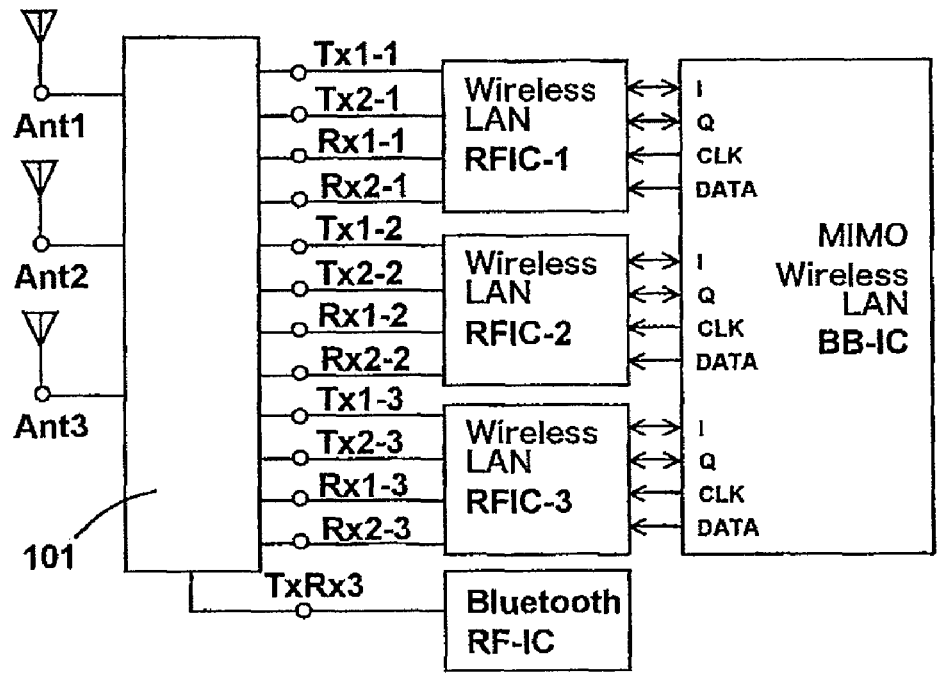
FIG. 8 is a block diagram showing a front-end part in a wireless LAN communications apparatus, as one example of communications apparatuses comprising the high-frequency circuit device according to one embodiment of the present invention.

FIG. 8 shows a front-end part in a wireless LAN communications apparatus as one example of communications apparatuses comprising the high-frequency circuit device of the present invention. Each antenna terminal Ant1 to Ant3 in the high-frequency circuit device of the present invention 101 is connected to an antenna. The first transmitting terminal Tx1-1 and the first receiving terminal Rx1-1 for the first communications system, and the first transmitting terminal Tx2-1 and the first receiving terminal Rx2-1 for the second communications system, which are connected to the first antenna terminal Ant1, are connected to a first wireless LAN RFIC-1. The second transmitting terminal Tx1-2 and the second receiving terminal Rx1-2 for the first communications system, and the second transmitting terminal Tx2-2 and the second receiving terminal Rx2-2 for the second communications system, which are connected to the second antenna terminal Ant2, are connected to a second wireless LAN RFIC-2. The third transmitting terminal Tx1-3 and the third receiving terminal Rx1-3 for the first communications system, and the third transmitting terminal Tx2-3 and the third receiving terminal Rx2-3 for the second communications system, which are connected to the third antenna terminal Ant3, are connected to a third wireless LAN RFIC-3. The first to third wireless LAN RFIC-1 to RFIC-3 are connected to a MIMO, wireless LAN baseband IC. The transmitting/receiving terminal TxRx3 for the third communications system is connected to Bluetooth RFIC.

Figure 9:
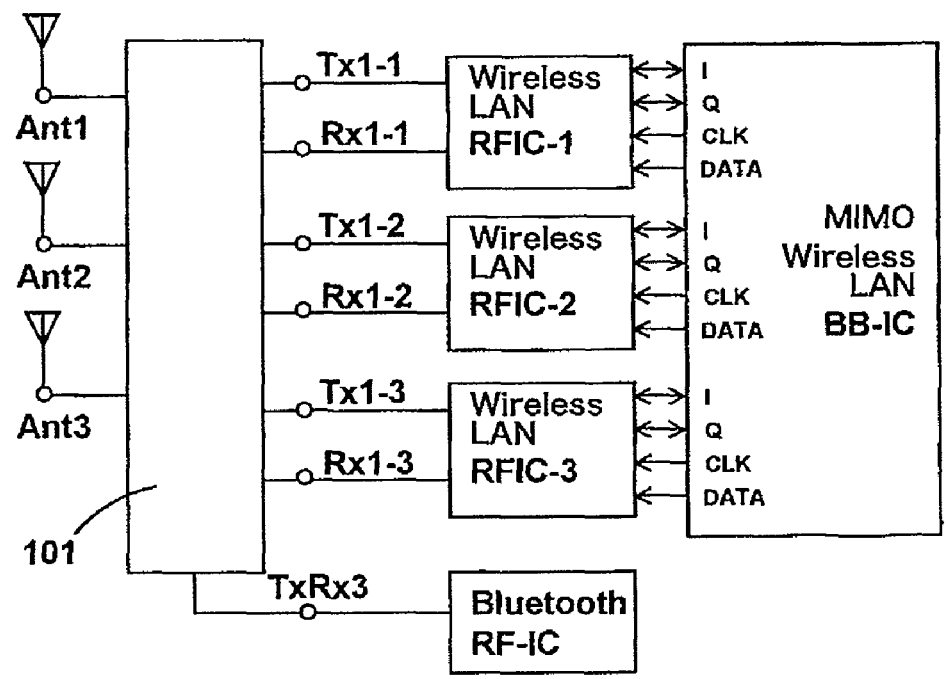
FIG. 9 is a block diagram showing a front-end part in a wireless LAN communications apparatus, as another example of communications apparatuses comprising the high-frequency circuit device according to another embodiment of the present invention.

FIG. 9 shows a front-end part in a wireless LAN communications apparatus as another example of communications apparatuses comprising the high-frequency circuit device of the present invention. Each antenna terminal Ant1 to Ant3 in the high-frequency circuit device 101 of the present invention is connected to an antenna. The first transmitting terminal Tx1-1 and the first receiving terminal Rx1-1 for the first communications system, which are connected to the first antenna terminal Ant1, are connected to a first wireless LAN RFIC-1. The second transmitting terminal Tx1-2 and the second receiving terminal Rx1-2 for the first communications system, which are connected to the second antenna terminal Ant2, are connected to a second wireless LAN RFIC-2. The third transmitting terminal Tx1-3 and the third receiving terminal Rx1-3 for the first communications system, which are connected to the third antenna terminal Ant3, are connected to a third wireless LAN RFIC-3. The first to third wireless LAN RFIC-1 to RFIC-3 are connected to a MIMO, wireless LAN baseband IC. The transmitting/receiving terminal TxRx3 for the third communications system is connected to Bluetooth RFIC.

Figure 10:
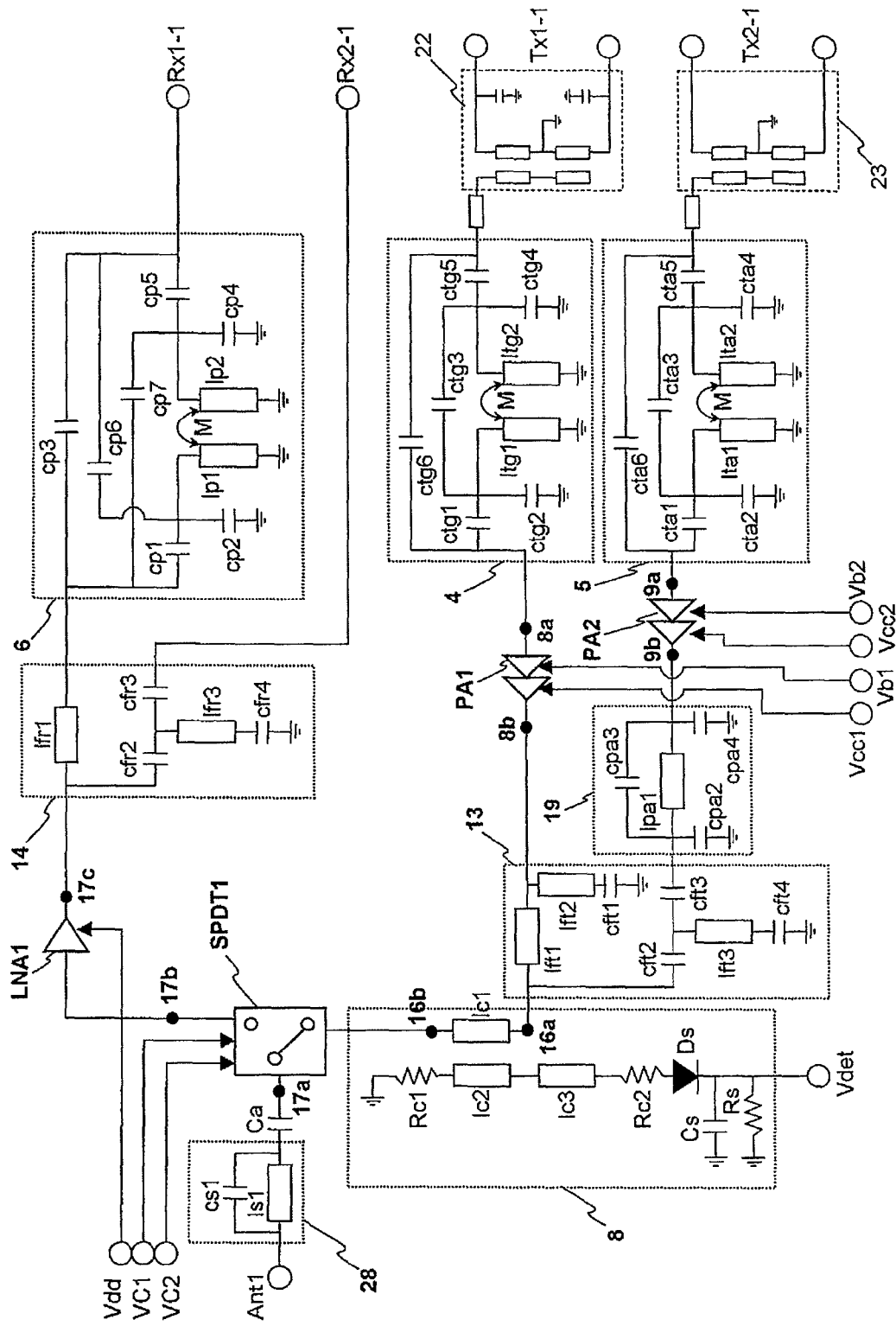
FIG. 10 is a view showing the equivalent circuit of part of the high-frequency circuit device according to one embodiment of the present invention.

FIG. 10 shows the equivalent circuit of part of the high-frequency circuit of the present invention. This equivalent circuit corresponds to a circuit portion, for instance, in the circuit shown in FIG. 1(a) between the first antenna terminal Ant1, and the first transmitting terminal Tx1-1 and the first receiving terminal Rx1-1 for the first communications system and the first transmitting terminal Tx2-1 and the first receiving terminal Rx2-1 for the second communications system.

A parallel resonance circuit 28 comprising an inductance element ls1 and a capacitance element cs1 is disposed between the first antenna terminal Ant1 and the switch circuit SPDT1, and the parallel resonance circuit 28 is connected to the switch circuit SPDT1 via a capacitance element Ca. The resonance frequency of the parallel resonance circuit 28 is preferably set at a second harmonic frequency (about 10 GHz) of 5-GHz-band transmitting signals, to suppress spurious from the second high-frequency amplifier circuit PA2, the switch circuit SPDT1, the detection circuit 8, etc.

Figure 14:
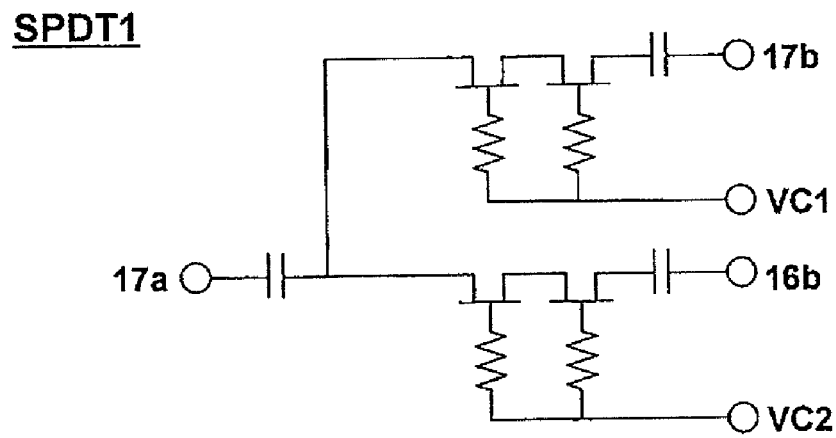
FIG. 14 is a view showing the equivalent circuit of one example of switch circuits used in the high-frequency circuit device of the present invention.

One example of equivalent circuits of the switch circuit SPDT1 is shown in FIG. 14, and it may of course be of another structure such as a diode switch circuit. This equivalent circuit comprises circuit-controlling terminals VC1, VC2 inputting voltage for controlling the switch circuit SPDT1.

Figure 13:
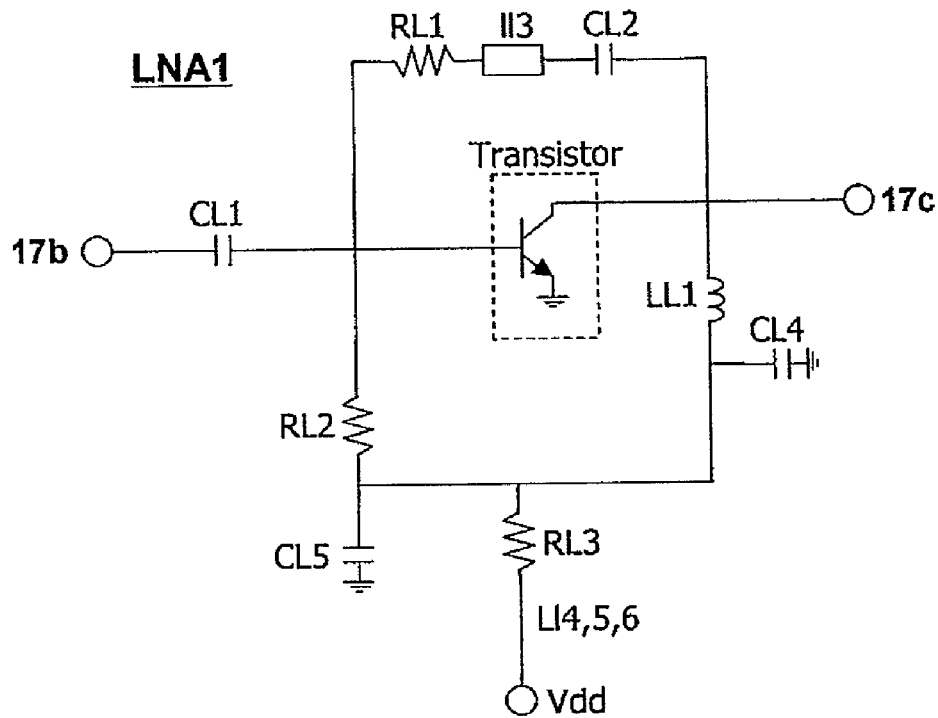
FIG. 13 is a view showing the equivalent circuit of one example of low-noise amplifier circuits used in the high-frequency circuit device of the present invention.

The switch circuit SPDT1 is connected to a low-noise amplifier LNA1, whose equivalent circuit is shown in FIG. 13. A power supply terminal Vdd applies voltage to a transistor collector via a resistor RL3 and an inductor LL1, and to a transistor base via a resistor RL2. Because receiving frequencies in a 2.4-GHz band and a 5-GHz band should be amplified simultaneously in this embodiment, the low-noise amplifier LNA1 desirably has wide-band characteristics operable in both 2.4-GHz band and 5-GHz band. To achieve this, part of power on the output side is fed back to the input side by means of a resistor RL1 and a capacitor CL2 disposed between the base and collector of the transistor.

The structure shown in FIG. 10 can be used not only in a receiving path connected to the first antenna terminal Ant1 but also in a receiving path connected to the second antenna terminal Ant2. In this case, because the receiving path connected to the second Ant2 comprises a low-noise amplifier LNA, the overall high-frequency circuit comprises two low-noise amplifiers. Using a power supply terminal for supplying voltage Vdd to both low-noise amplifier circuits, the number of power supply circuits can be reduced. Specifically, one power supply terminal with branched conductor patterns supplies voltage to each low-noise amplifier circuit.

The low-noise amplifier LNA1 is connected to the diplexer circuit (Dip2) 14, which comprises a lower-frequency-side filter (lowpass filter) constituted by a transmission line lfr1, and a higher-frequency-side filter (highpass filter) constituted by capacitance elements cfr2, cfr3, cfr4 and a transmission line lfr3.

The lower-frequency-side filter (lowpass filter) in the diplexer circuit 14 is connected to a bandpass filter circuit (BPF3) 6 constituted by capacitance elements cp1-cp7 and transmission lines lp1, lp2. The transmission line lp1 and the transmission line lp2 are magnetically coupled.

The bandpass filter circuit 6 is connected to the first receiving terminal Rx1-1 for the first communications system. The higher-frequency-side filter (highpass filter) in the diplexer circuit 14 is connected to the first receiving terminal Rx2-1 for the second communications system.

A detection circuit (DET1) 8 connected to the switch circuit SPDT1 comprises a coupler circuit in which a main line lc1 and a sub-line lc2 are coupled, the sub-line lc2 having one end grounded via a resistor Rc1 and the other end connected to a matching transmission line lc3, which is connected via a resistor Rc2 to a Schottky diode Ds and a voltage-smoothing circuit comprising a resistance element Rs and a capacitance element Cs, and further to a detection output terminal Vdet. The detection output terminal Vdet provides DC voltage corresponding to output power from the first and second high-frequency amplifier circuits PA1, PA2. The detection circuit 8 may be integrated with the high-frequency amplifier circuit.

The diplexer circuit (Dip1) 13 connected to the detection circuit 8 comprises a lower-frequency-side filter (lowpass filter) constituted by transmission lines lft1, lft2 and a capacitance element cft1, and a higher-frequency-side filter (highpass filter) constituted by capacitance elements cft2, cft3, cft4 and a transmission line lft3. These diplexer circuits 13, 14 are not restricted to have a combination of a lowpass filter and a highpass filter, but may have other filter structures (bandpass filter, notch filter, etc.).

A lowpass filter circuit (LPF2) 19 connected to the higher-frequency-side filter (highpass filter) of the diplexer circuit 13 is constituted by capacitance elements cpa2, cpa3, cpa4 and a transmission line lpa1. When the second high-frequency amplifier circuit PA2 generates little harmonics, the lowpass filter circuit 19 may be omitted. While the lowpass filter circuit LPF1 is connected to the lower-frequency side of the diplexer circuit Dip1 in the circuit shown in FIG. 1(a), a separate lowpass filter LPF1 is not needed in this embodiment, because the diplexer circuit Dip1 has a function as a lowpass filter comprising transmission lines lft1, lft2 and a capacitance element cft1.

Figure 11:
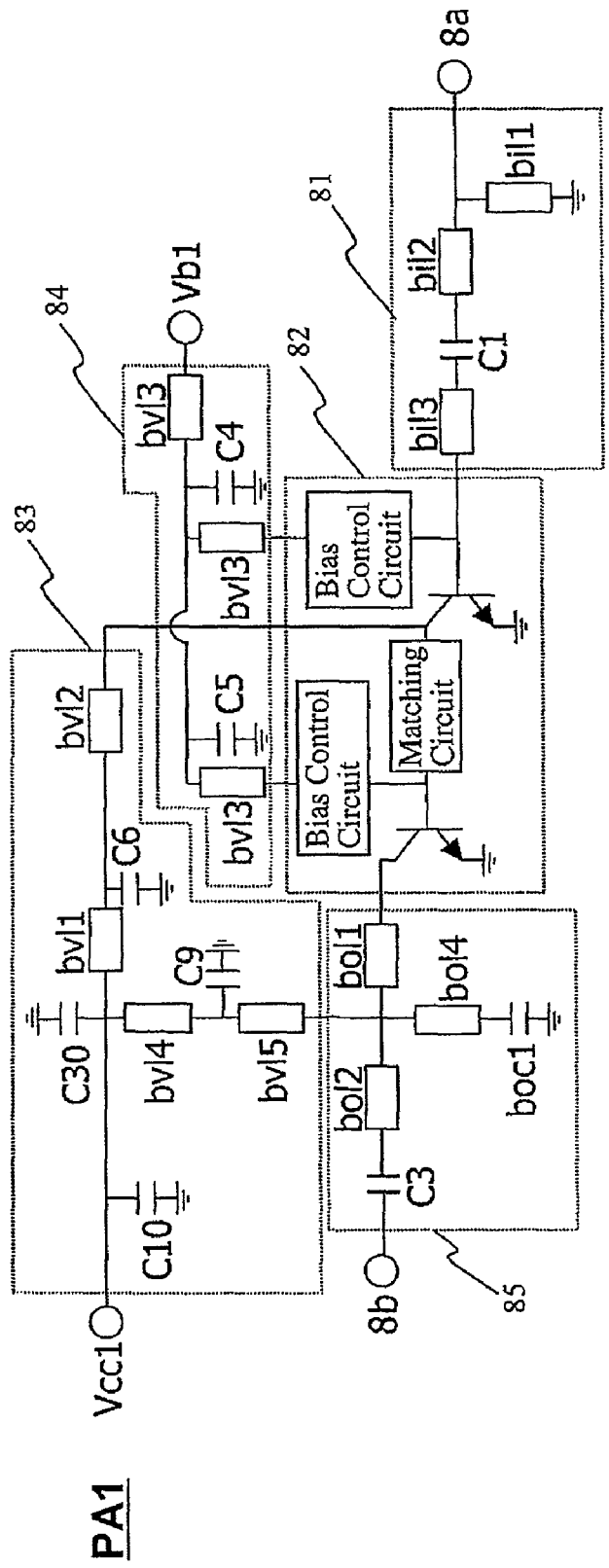
FIG. 11 is a view showing the equivalent circuit of one example of high-frequency amplifier circuits used in the high-frequency circuit device of the present invention.
Figure 12:
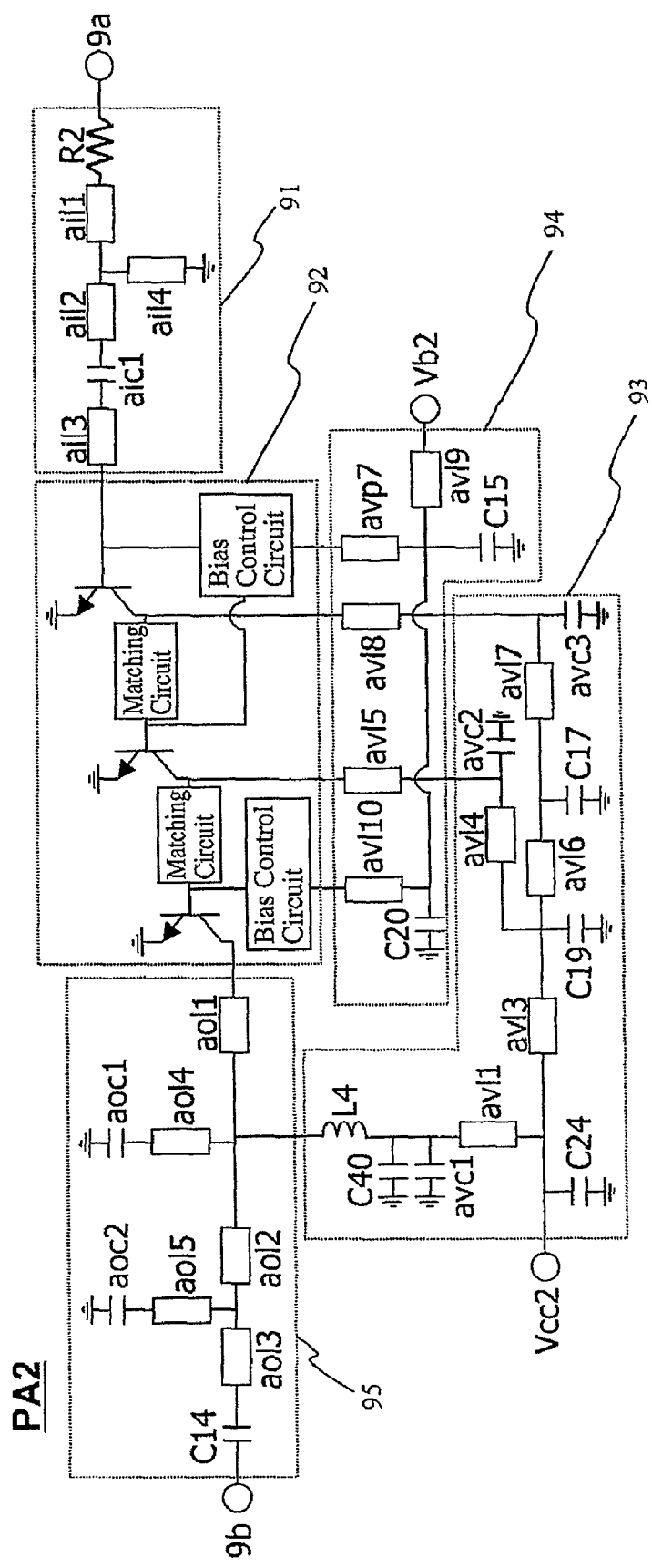
FIG. 12 is a view showing the equivalent circuit of another example of high-frequency amplifier circuits used in the high-frequency circuit device of the present invention.

Connected to the diplexer circuit 13 are first and second high-frequency amplifier circuits PA1, PA2 having the equivalent circuits shown in FIGS. 11 and 12. The first high-frequency amplifier circuit PA1 comprises an input-matching circuit 81, a power amplifier circuit 82 constituted by two-stage transistors, a constant-voltage-supplying circuit 83, a control voltage supply circuit 84 for controlling the output power of the first high-frequency amplifier circuit PA1, and an output-matching circuit 85. The second high-frequency amplifier circuit PA2 comprises an input-matching circuit 91, a power amplifier circuit 92 constituted by three-stage transistors, a constant-voltage-supplying circuit 93, a control voltage supply circuit 94 for controlling the output power of the second high-frequency amplifier circuit PA2, and an output-matching circuit 95. With inductance elements and capacitance elements used, each high-frequency amplifier circuit PA1, PA2 may be in the form of a microwave monolithic integrated circuit (MMIC). Vcc1 and Vb1 respectively denote supply voltage and bias voltage for the first high-frequency amplifier circuit PA1, and Vcc2 and Vb2 respectively denote supply voltage and bias voltage for the second high-frequency amplifier circuit PA2. With a structure having one power supply for supplying voltage Vcc1 to the first high-frequency amplifier circuit PA1 and voltage Vcc2 to the second high-frequency amplifier circuit PA2, for instance, a structure in which the high-frequency amplifier circuits PA1, PA2 receive voltage from one power supply terminal with branched conductor patterns, the numbers of power supply circuit patterns and terminals can be reduced.

A bandpass filter circuit (BPF1) 4 is connected to the first high-frequency amplifier circuit PA1. The bandpass filter circuit 4 comprises capacitance elements ctg1-ctg6 and transmission lines ltg1, ltg2, the transmission line ltg1 and the transmission line ltg2 being magnetically coupled. The bandpass filter circuit 4 is connected via a matching transmission line to a balanced-to-unbalanced circuit 22, whose balanced terminal is connected to the first transmitting terminal Tx1-1 for the first communications system. A bandpass filter circuit (BPF2) 5 is connected to the second high-frequency amplifier circuit PA2. The bandpass filter circuit 5 comprises capacitance elements cta1-cta6 and transmission lines lta1, lta2, the transmission line lta1 and the transmission line lta2 being magnetically coupled. The bandpass filter circuit 5 is connected via a matching transmission line to a balanced-to-unbalanced circuit 23, whose balanced terminal is connected to the first transmitting terminal Tx2-1 for the second communications system.

Figure 22:
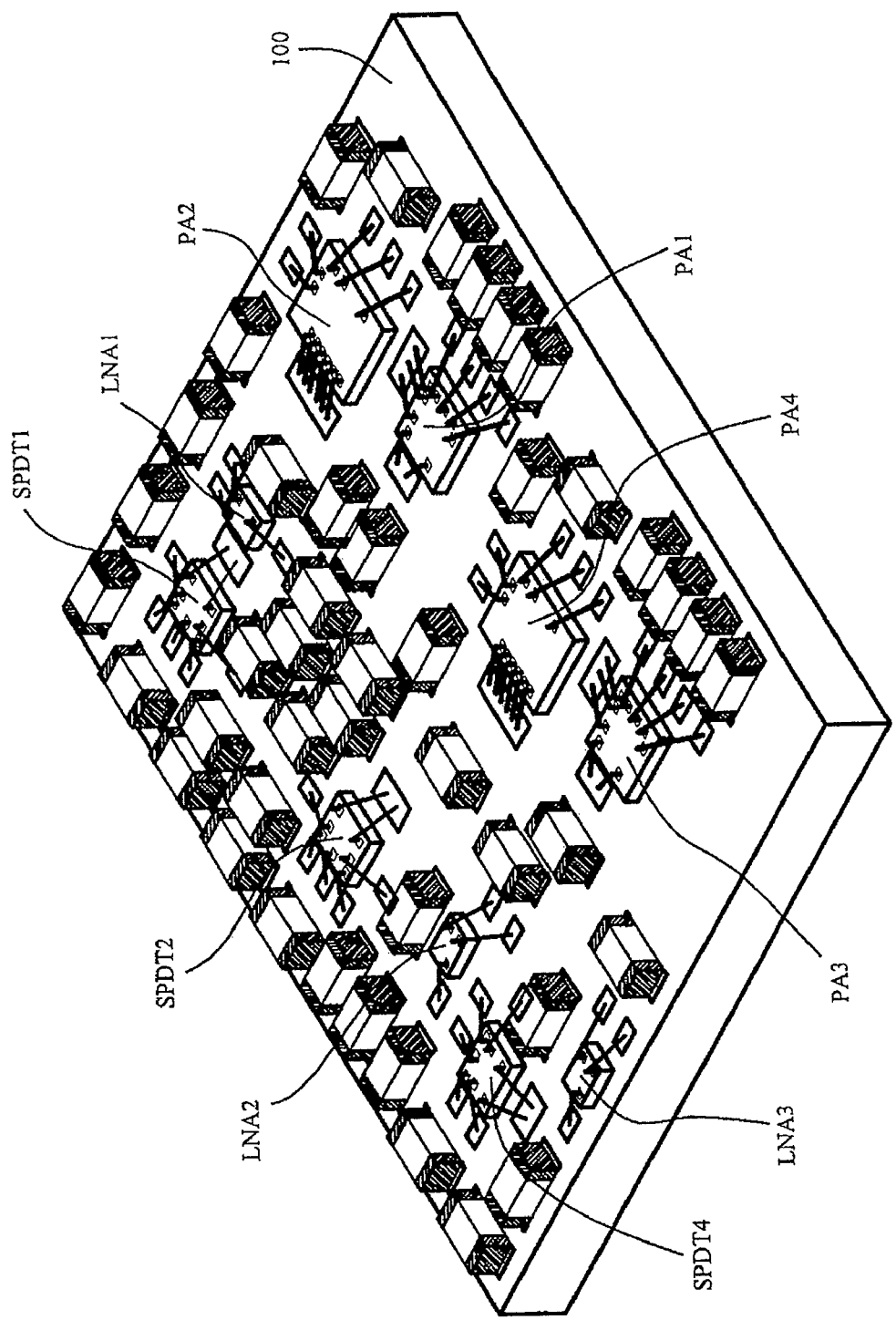
FIG. 22 is a perspective view showing the appearance of a laminate board constituting the high-frequency circuit device according to one embodiment of the present invention.

The high-frequency circuit device of the present invention can be in the form of a laminate device 100 as shown in FIG. 22, a device comprising multi-layer ceramic substrate. The basic circuit structure of this high-frequency circuit device is shown in FIGS. 4 and 10. An upper surface of the laminate board 100 is provided with plural land electrodes for mounting chip parts not contained in the laminate board, which are semiconductor devices for the switch circuits SPTD1, SPDT2, SPDT4, the high-frequency amplifier circuits PA1-PA4 and the low-noise amplifiers LNA1 to LNA3, as well as a Schottky diode, chip capacitors, chip inductors and chip resistors. The semiconductor devices mounted on the land electrodes may be in a bare form, resin-sealed or pipe-sealed. The land electrodes are connected through via-holes to connecting lines and circuit elements (transmission lines and capacitance elements) formed in the laminate board 100, to constitute the high-frequency circuit device of the present invention. Constituted as a laminate board, the high-frequency circuit device can be miniaturized with reduced number of parts. Of course, RFICs and baseband ICs constituting the transmitting/receiving circuits can be integrated with the laminate board 100.

The laminate board 100 can be produced, for instance, by printing each green sheet as thick as 10-200 μm made of a dielectric ceramic material sinterable at as low temperatures as 1000° C. or lower, with a conductive paste of low-resistivity Ag, Cu, etc. to form desired conductor patterns, and integrally laminating and sintering pluralities of green sheets having conductor patterns. The dielectric materials having dielectric constants of about 5-15 are, for instance, (a) materials comprising Al, Si and Sr as main components, and Ti, Bi, Cu, Mn, Na and K as sub-components, (b) materials comprising Al, Si and Sr as main components, and Ca, Pb, Na and K as sub-components, (c) materials comprising Al, Mg, Si and Gd, or (d) materials comprising Al, Si, Zr and Mg. In addition to the dielectric ceramic materials, resins and their composites with dielectric ceramic powder can be used. An HTCC (high-temperature co-fired ceramic) method using $Al_2O_3$-based dielectric ceramic materials for forming substrates, and high-temperature-sinterable metals such as tungsten, molybdenum, etc. for forming transmission lines, etc. may be used.

Insufficient isolation among inputs, power supplies and outputs in the high-frequency amplifier circuit constituted by the laminate board 100 is likely to cause malfunction and oscillation in the high-frequency amplifier circuit. To keep isolation among these circuits sufficiently, flat ground electrodes and via-holes connected to ground electrodes are properly arranged. Balun-constituting electrodes are also preferably as separate from the high-frequency amplifier circuits as possible, to reduce the intrusion of unnecessary noise from the high-frequency amplifier circuits, thereby improving receiving sensitivity.

In a portion of the laminate board 100 on which semiconductor devices for the high-frequency amplifier circuit are mounted, heat-dissipating thermal via-holes are formed from the upper surface to the rear surface. To suppress unnecessary noise irradiation, a wide ground electrode is properly formed on a green sheet.

The circuit extends three-dimensionally in the laminate board 100. To prevent unnecessary electromagnetic interference between conductor patterns constituting the circuit, the conductor patterns are preferably separated by ground electrodes (flat ground electrodes, via-holes connected to ground electrodes), or they are arranged preferably without overlap in a lamination direction.

Figure 21:
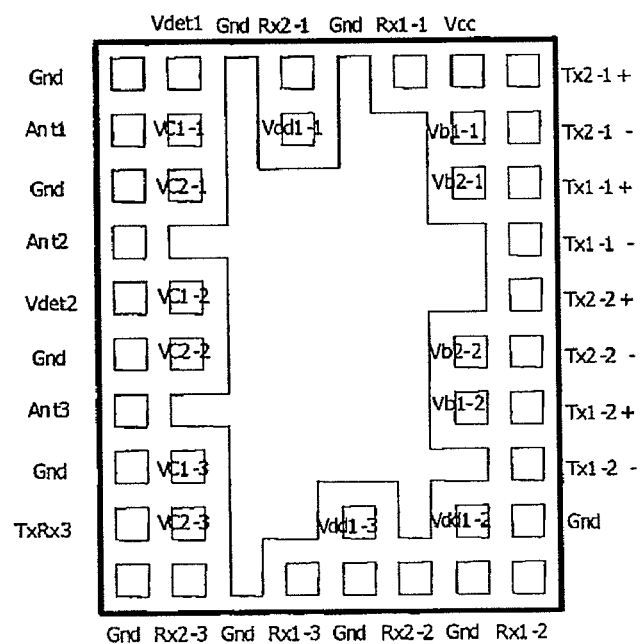
FIG. 21 is a plan view showing another example of the arrangement of terminal electrodes on a rear surface (mounting surface) of the laminate board according to one embodiment of the present invention.

A rear surface (mounting surface) of the laminate board 100 is provided with terminal electrodes as shown in FIG. 21. In this example, there are a wide ground electrode Gnd in a center portion, and terminal electrodes concentrically in two lanes along side portions.

Terminal electrodes on the outside lane are the first to third antenna terminal electrodes Ant1 to Ant3, the first transmitting terminal electrodes Tx1-1+, Tx1-1– and the second transmitting terminal electrodes Tx1-2+, Tx1-2– for the first communications system, the first transmitting terminal electrodes Tx2-1+, Tx2-1– and the second transmitting terminal electrodes Tx2-2+, Tx2-2– for the second communications system, the first to third receiving terminal electrodes Rx1-1-Rx1-3 for the first communications system, the first to third receiving terminal electrodes Rx2-1-Rx2-3 for the second communications system, the transmitting/receiving terminal electrode TxRx3 for the third communications system, the circuit-controlling terminal electrodes Vdet1, Vdet2, Vcc, and the ground electrodes Gnd. The circuit-controlling terminal electrode Vdet1 is a detection output terminal electrode of the first detection circuit DET1, and the circuit-controlling terminal electrode Vdet2 is a detection output terminal electrode of the second detection circuit DET2. The circuit-controlling terminal electrode Vcc is commonly used to apply voltage to the high-frequency amplifier circuits PA1-PA4. The voltage-supplying terminal electrode Vcc arranged in the outside lane is easily connected to mounted elements such as chip capacitors, etc. necessary for a voltage-supplying circuit.

To increase isolation between the input and output terminals of high-frequency signals, ground electrodes Gnd or circuit-controlling terminal electrodes are disposed between the input and output terminals. However, because the impedance conversion of 50:100, 50:150, etc. should be conducted simultaneously in a balanced-to-unbalanced circuit, and because impedance at its output terminal should be higher than 50Ω, the ground Gnd is desirably not adjacent to the balanced terminal. Because the balanced output has higher resistance to common-mode noise than the unbalanced output, balanced terminals of different systems may be arranged side by side.

Terminal electrodes in the inside lane are circuit-controlling terminal electrodes VC1-1, VC2-1, VC1-2, VC2-2, VC1-3, VC2-3, Vdd1-3, Vdd1-2, Vb2-2, Vb1-2, Vb1-1, Vb2-1, Vdd1-1. The terminal electrodes VC1-1, VC2-1 are used to control the first switch circuit SPDT1, the terminal electrodes VC1-2, VC2-2 are used to control the second switch circuit SPDT2, the terminal electrodes VC1-3, VC2-3 are used to control the fourth switch circuit SPDT4, the terminal electrode Vdd1-1 is used to control the first low-noise amplifier LNA1, the terminal electrode Vdd1-2 is used to control the second low-noise amplifier LNA2, and the terminal electrode Vdd1-3 is used to control the third low-noise amplifier LNA3. The terminal electrode Vb1-1 is used to control the first high-frequency amplifier circuit PA1, the terminal electrode Vb2-1 is used to control the second high-frequency amplifier circuit PA2, the terminal electrode Vb1-2 is used to control the third high-frequency amplifier circuit PA3, and the terminal electrode Vb2-2 is used to control the fourth high-frequency amplifier circuit PA4.

Although the terminal electrodes are in LGA (land grid array) in this embodiment, they may of course be in BGA (ball grid array), etc.

Figure 20:
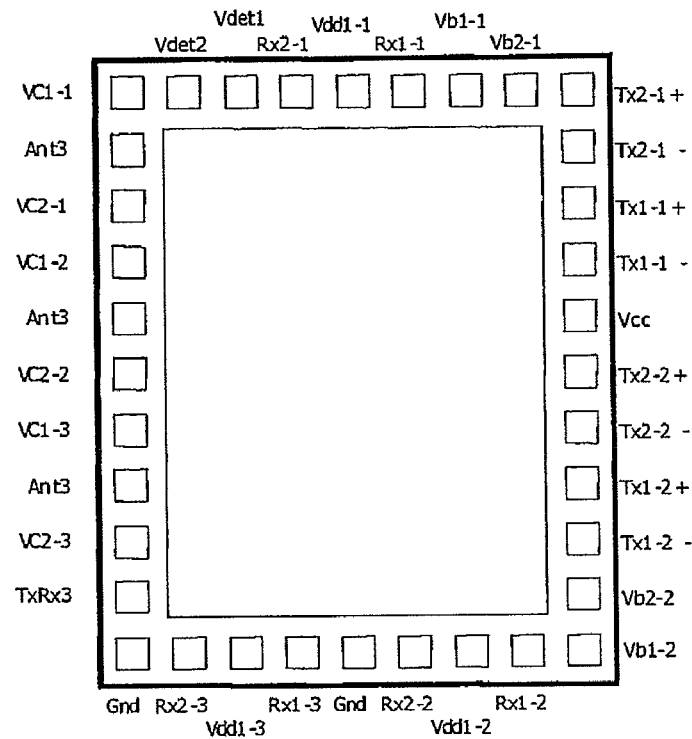
FIG. 20 is a plan view showing one example of the arrangement of terminal electrodes on a rear surface (mounting surface) of the laminate board according to one embodiment of the present invention.

As contrast to the arrangement of terminals shown in FIG. 21, FIG. 20 shows an example in which all of the input and output terminal electrodes of high-frequency signals, the circuit-controlling terminal electrodes and the ground electrodes are arranged in one peripheral lane around a center ground electrode. With the terminal arrangement shown in FIG. 20, many terminal electrodes are exposed to side portions of the laminate board 100, the laminate board 100 is inevitably large. To miniaturize the laminate board 100 with the terminal arrangement shown in FIG. 20, fewer ground electrodes GND should be used than in the example shown in FIG. 21, resulting in lower isolation between the input and output terminal electrodes of high-frequency signals. As a result, the oscillation of the high-frequency amplifier circuit occurs due to unstable Gnd potential, and spurious increases due to the deteriorated filter characteristics.

Referring to FIGS. 15-19, the arrangement of terminals for high-frequency signals in the high-frequency circuit device in the form of the laminate board 100 will be explained.

Figure 15:
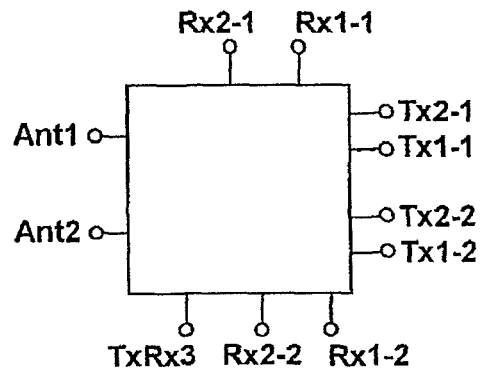
FIG. 15 is a view showing one example of the arrangement of high-frequency signal terminals in the high-frequency circuit device of the present invention.

FIG. 15 shows the arrangement of terminals when the high-frequency circuit device of FIG. 2 is formed as the laminate board 100. The first and second antenna terminal electrodes Ant1, Ant2 are arranged in one side portion of the laminate board 100, and the transmitting terminal electrodes Tx1-1, Tx1-2, Tx2-1, Tx2-2 are arranged in its opposing side portion. The first receiving terminal electrodes Rx1-1, Rx2-1 are arranged in one of its lateral side portions, and the second receiving terminal electrodes Rx1-2, Rx2-2 and the transmitting/receiving terminal electrode TxRx3 for the third communications system are arranged in its opposing side portion.

Figure 16:
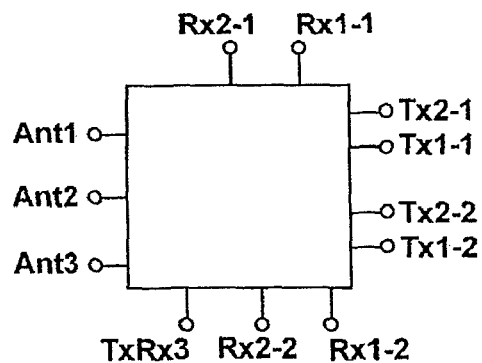
FIG. 16 is a view showing another example of the arrangement of high-frequency signal terminals in the high-frequency circuit device of the present invention.

FIG. 16 shows the arrangement of terminals when the high-frequency circuit device of FIG. 7 is formed as the laminate board 100. This terminal arrangement is the same as shown in FIG. 15, except that the third antenna terminal electrode Ant3 (Ant2b in FIG. 7) is added on the same side portion as the first and second antenna terminal electrodes Ant1, Ant2 (Ant2a in FIG. 7).

Figure 17:
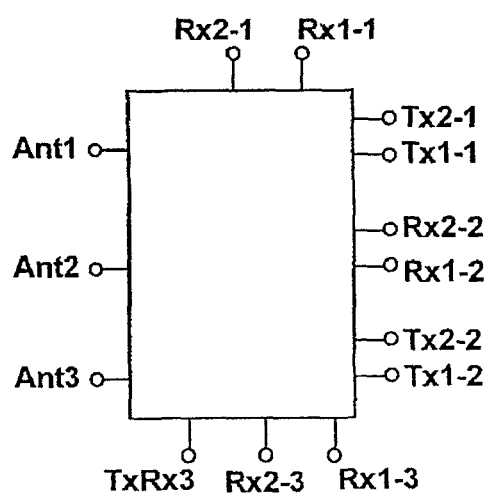
FIG. 17 is a view showing a further example of the arrangement of high-frequency signal terminals in the high-frequency circuit device of the present invention.

FIG. 17 shows an example in which terminal electrodes are arranged circumferentially on one surface of the laminate board 100 constituting the high-frequency circuit device of FIG. 4. The first to third antenna terminal electrodes Ant1 to Ant3 are arranged in one side portion of the laminate board 100, and the first transmitting terminal electrodes Tx1-1, Tx2-1, the second receiving terminal electrodes Rx1-2, Rx2-2 and the second transmitting terminal electrodes Tx2-1, Tx2-2 are arranged in this order in its opposing side portion. The first receiving terminal electrodes Rx1-1, Rx2-1 are arranged in one of its lateral side portions, and the third receiving terminal electrodes Rx1-3, Rx2-3 and the transmitting/receiving terminal electrode TxRx3 for the third communications system are arranged in its opposing side portion.

Figure 18:
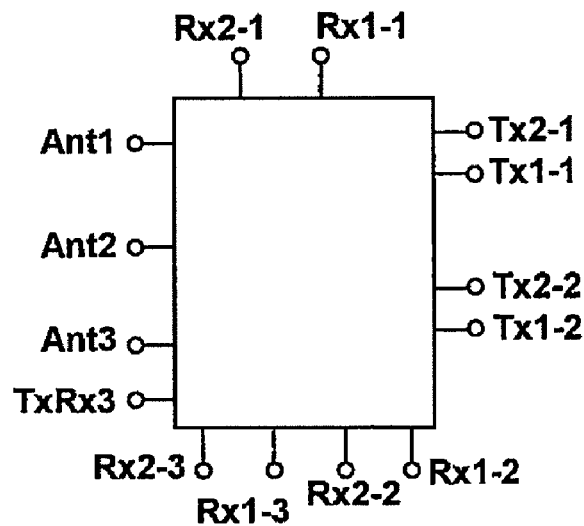
FIG. 18 is a view showing a still further example of the arrangement of high-frequency signal terminals in the high-frequency circuit device of the present invention.

FIG. 18 shows an example in which terminal electrodes are arranged circumferentially on one surface of the laminate board 100 constituting the high-frequency circuit device of FIG. 4. This terminal arrangement is the same as shown in FIG. 17, except that the transmitting/receiving terminal TxRx3 for the third communications system is arranged in the same side portion as the antenna terminal electrodes, and that the second receiving terminal electrodes Rx1-2, Rx2-2 are arranged in the same side portion as the third receiving terminal electrodes Rx1-3, Rx2-3.

Figure 19:
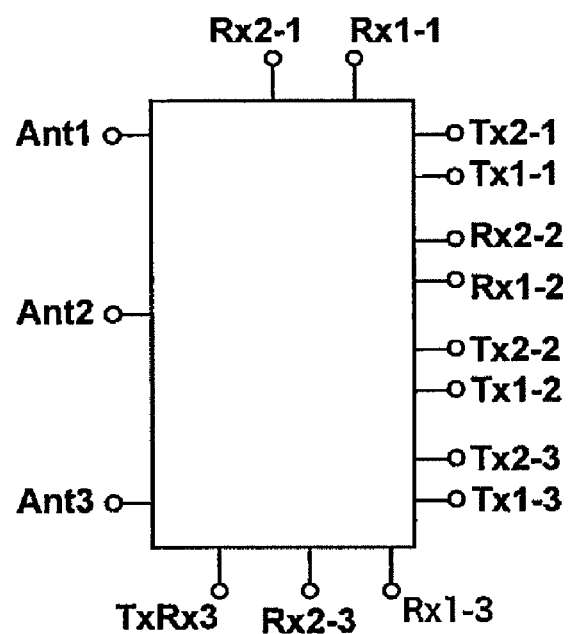
FIG. 19 is a view showing a still further example of the arrangement of high-frequency signal terminals in the high-frequency circuit device of the present invention.

FIG. 19 shows an example in which terminal electrodes are arranged circumferentially on one surface of the laminate board 100 constituting the high-frequency circuit device of FIG. 6. The first to third antenna terminal electrodes Ant1 to Ant3 are arranged in one side portion of the laminate board 100, the first transmitting terminals Tx1-1, Tx2-1, the second receiving terminal electrodes Rx1-2, Rx2-2, the second transmitting terminals Tx2-1, Tx2-2 and the third transmitting terminal electrodes Tx1-3, Tx2-3 are arranged in this order in its opposing side portion, the first receiving terminal electrodes Rx1-1, Rx2-1 are arranged in one of its lateral side portions, and the third receiving terminal electrodes Rx1-3, Rx2-3 and the transmitting/receiving terminal electrode TxRx3 for the third communications system are arranged in its opposing side portion.

Figure 26:
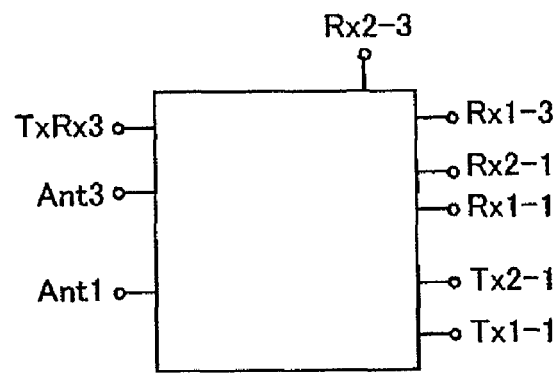
FIG. 26 is a view showing one example of the arrangement of high-frequency signal terminals in the high-frequency circuit device of the present invention.

FIG. 26 shows terminals arranged circumferentially on one surface of the laminate board constituting the high-frequency circuit device of FIG. 24. The antenna terminal electrodes Ant1, Ant3 and the transmitting/receiving terminal electrode TxRx3 for the third communications system are arranged in one side portion, and the transmitting terminal electrodes Tx1-1, Tx2-1 and the receiving terminals Rx1-1, Rx2-1, Rx1-3 are arranged in its opposing side portion. The third receiving terminal Rx2-3 for the second communications system is arranged in one of its lateral side portions.

As described above, with the antenna terminal electrodes and the transmitting terminal electrodes arranged separate from each other in opposing side portions, their interference can be reduced, thereby making it possible to avoid troubles such as the oscillation of the high-frequency amplifier circuit that occurs when output signals from the high-frequency amplifier circuit return to its input, etc. With the first and second receiving terminals not adjacent to each other (for instance, by GND terminals or power supply terminals interposed therebetween, or by arrangement on different side portions), it is possible to avoid received signals in other systems from acting as receiving-sensitivity-deteriorating noises. The antenna terminals, the transmitting terminals and the receiving terminals acting as the input and output terminals of high-frequency signals are preferably not adjacent to each other, with ground electrodes or circuit-controlling terminal electrodes disposed therebetween.

Figure 29A:
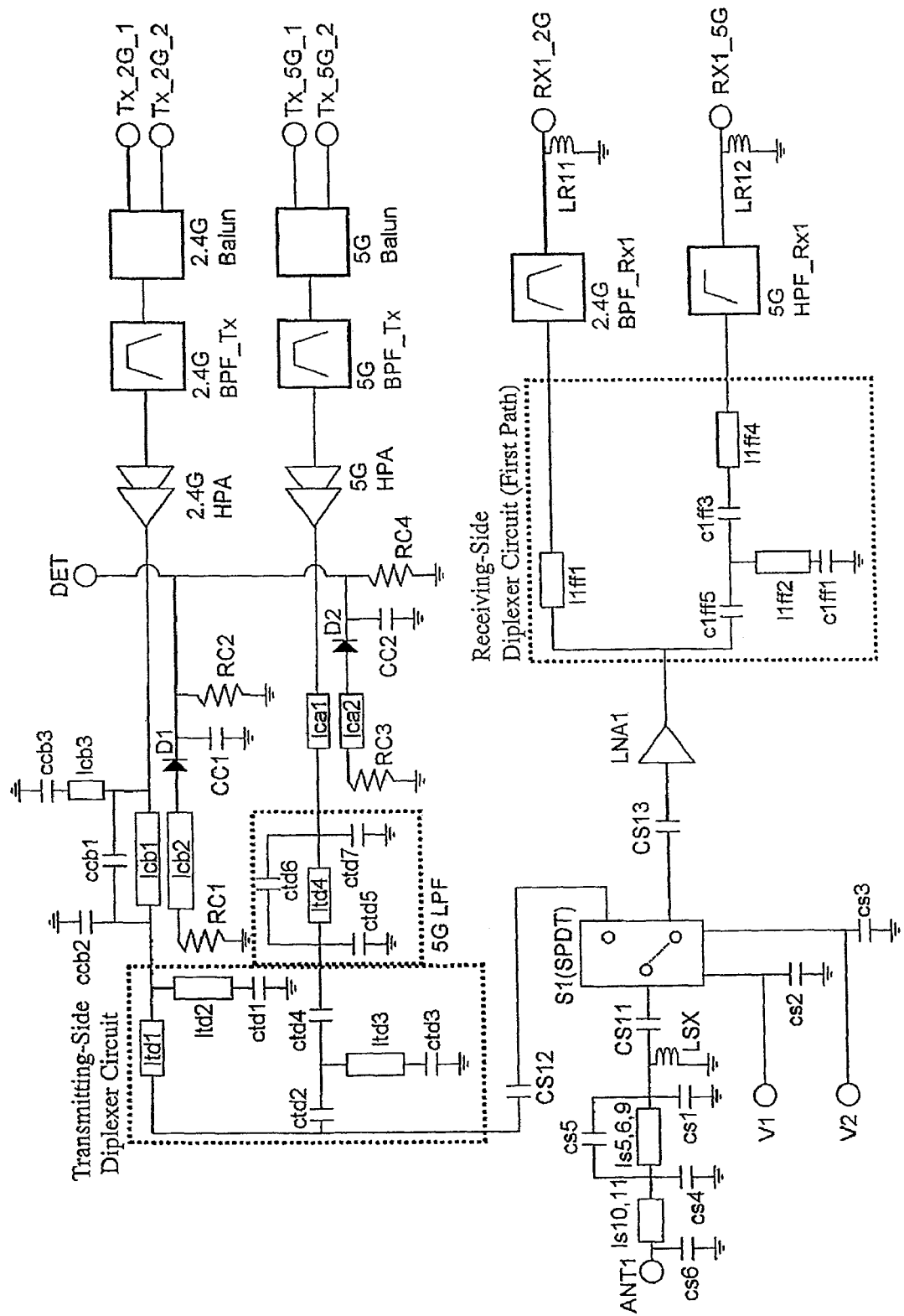
FIG. 29(a) is a block diagram showing the equivalent circuit of a first path connected to a first antenna terminal in the high-frequency circuit device of FIG. 28.
Figure 29B:
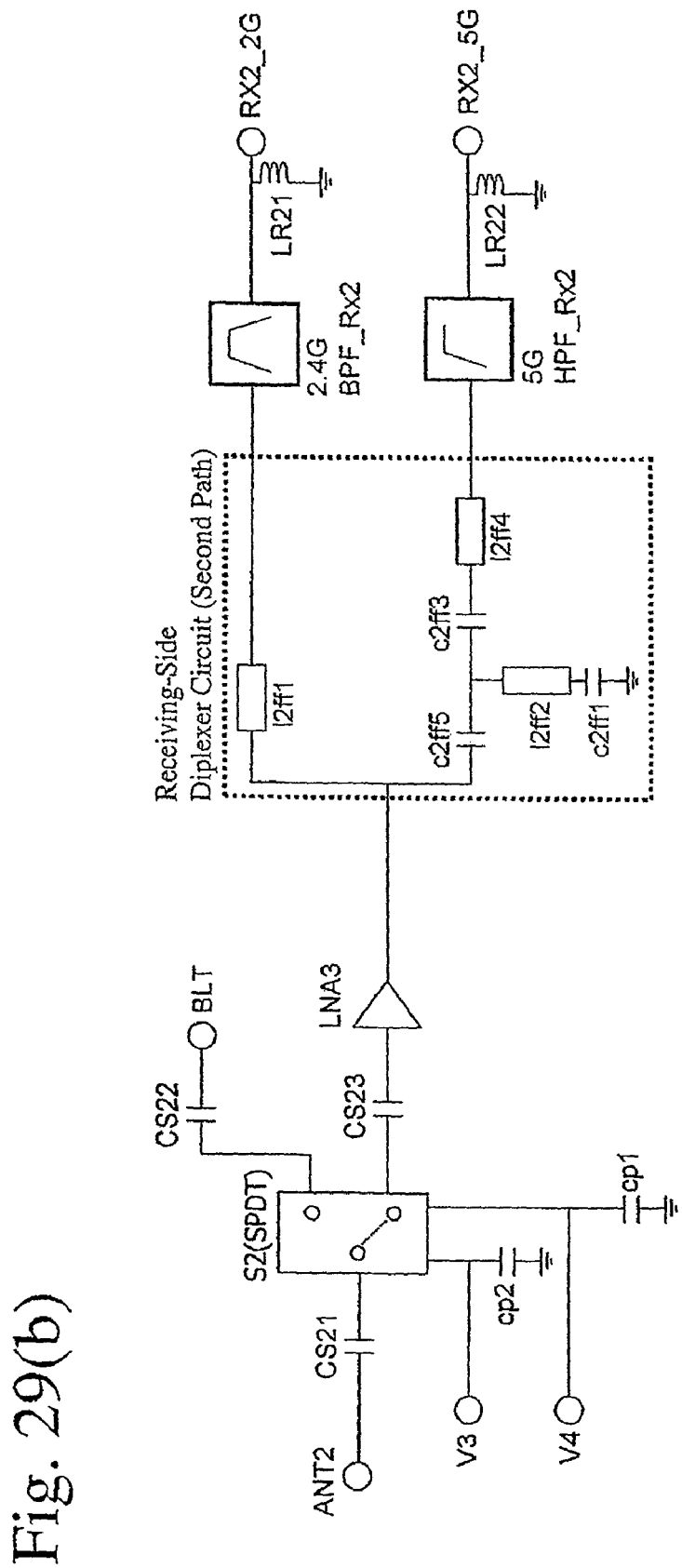
FIG. 29(b) is a block diagram showing the equivalent circuit of a second path connected to a second antenna terminal in the high-frequency circuit device of FIG. 28.
Figure 30A:
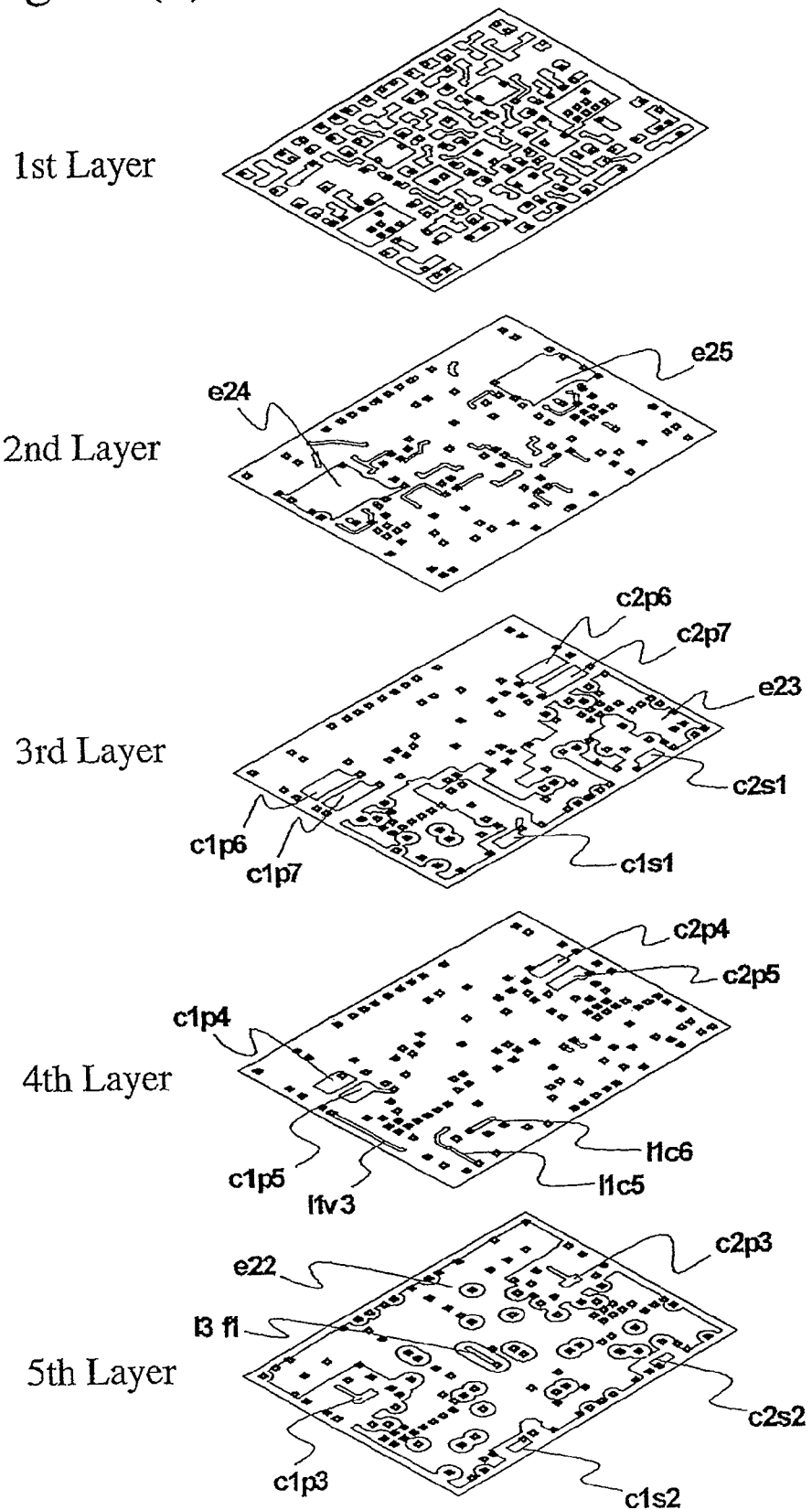
FIG. 30(a) is a perspective view showing conductor patterns on first to fifth layers in a laminate board constituting the high-frequency circuit device according to another embodiment of the present invention.
Figure 30B:
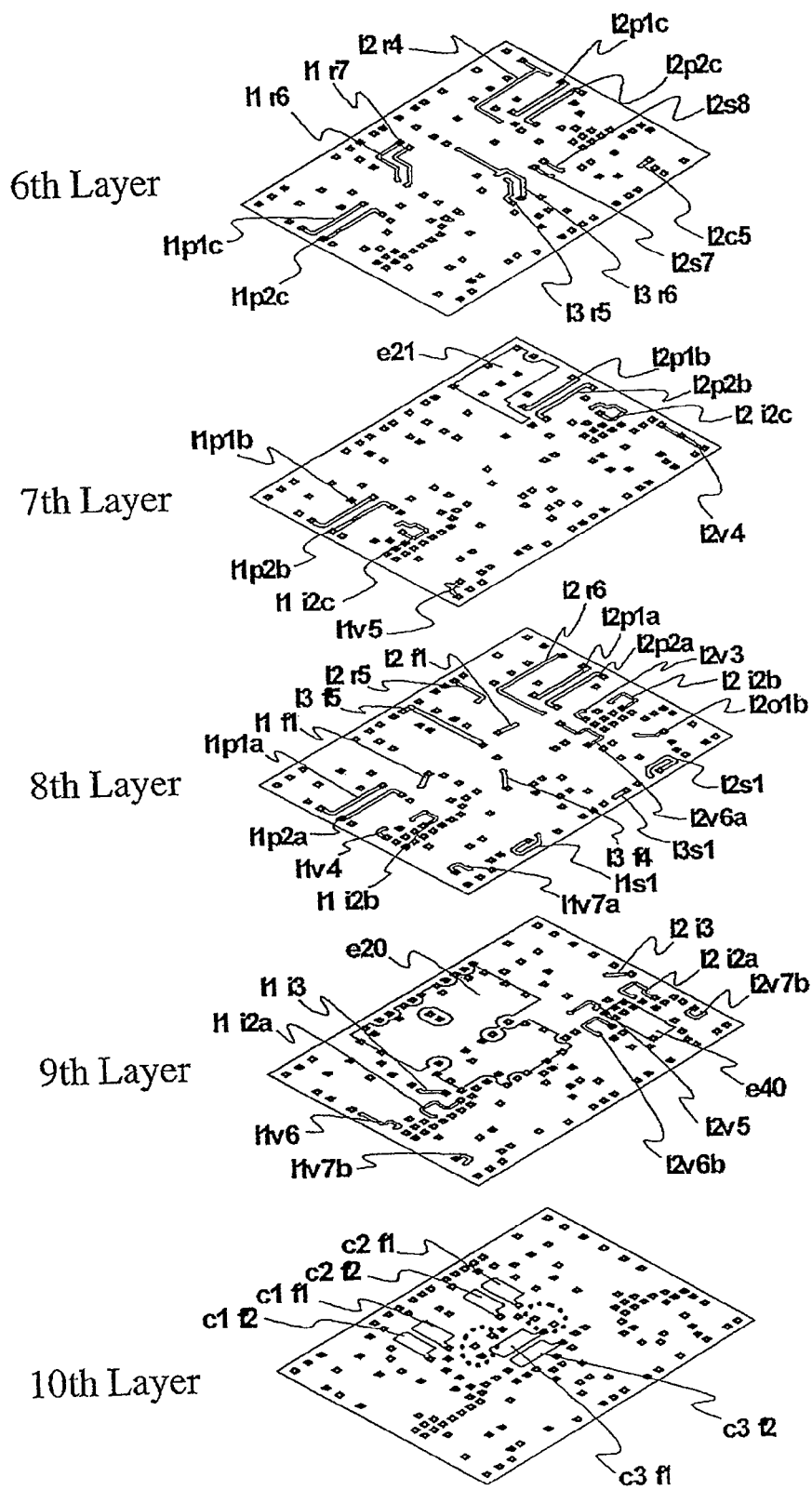
FIG. 30(b) is a perspective view showing conductor patterns on sixth to 10th layers in a laminate board constituting the high-frequency circuit device according to another embodiment of the present invention.
Figure 30C:
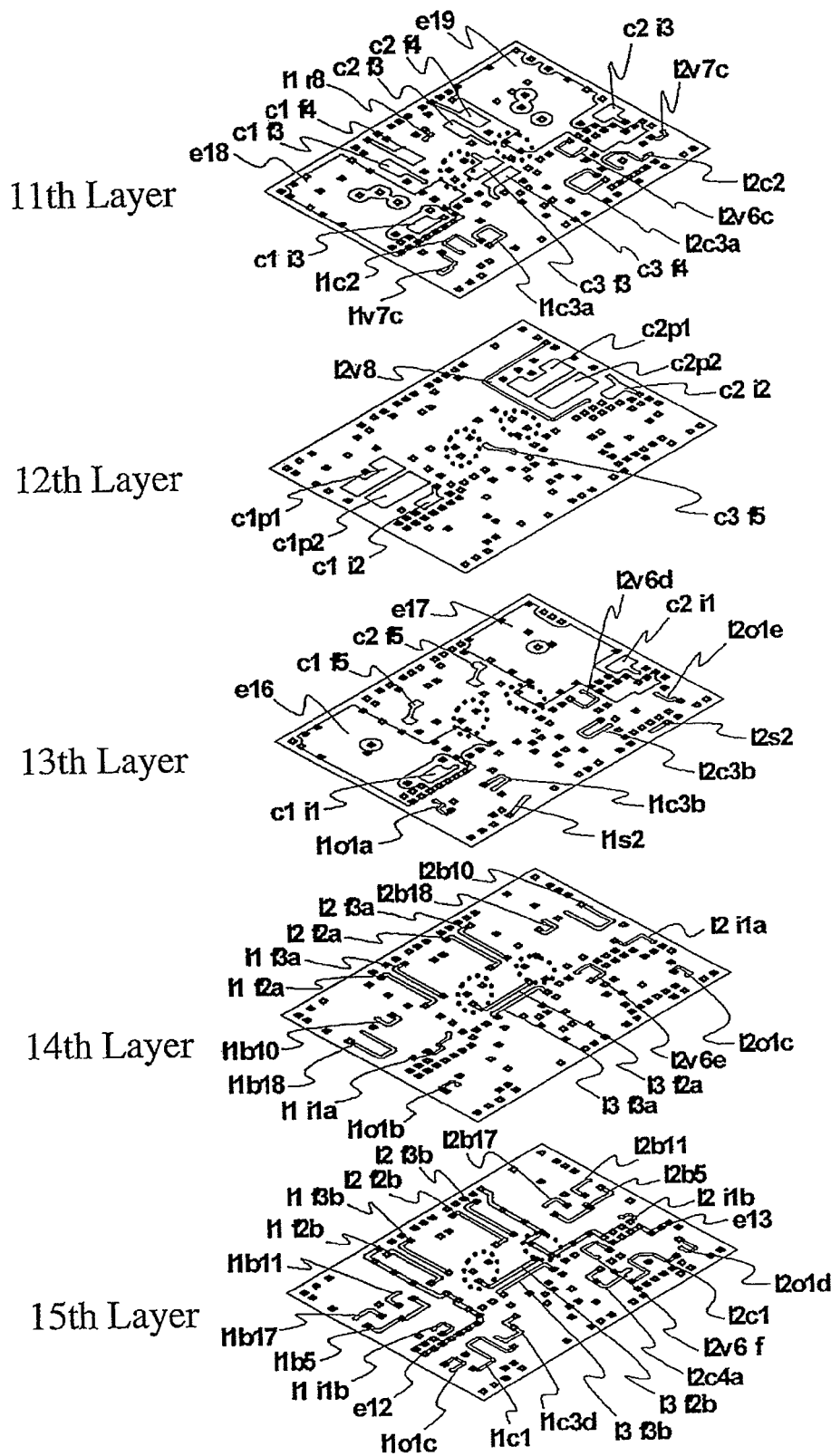
FIG. 30(c) is a perspective view showing conductor patterns on 11th to 15th layers in a laminate board constituting the high-frequency circuit device according to another embodiment of the present invention.
Figure 30D:
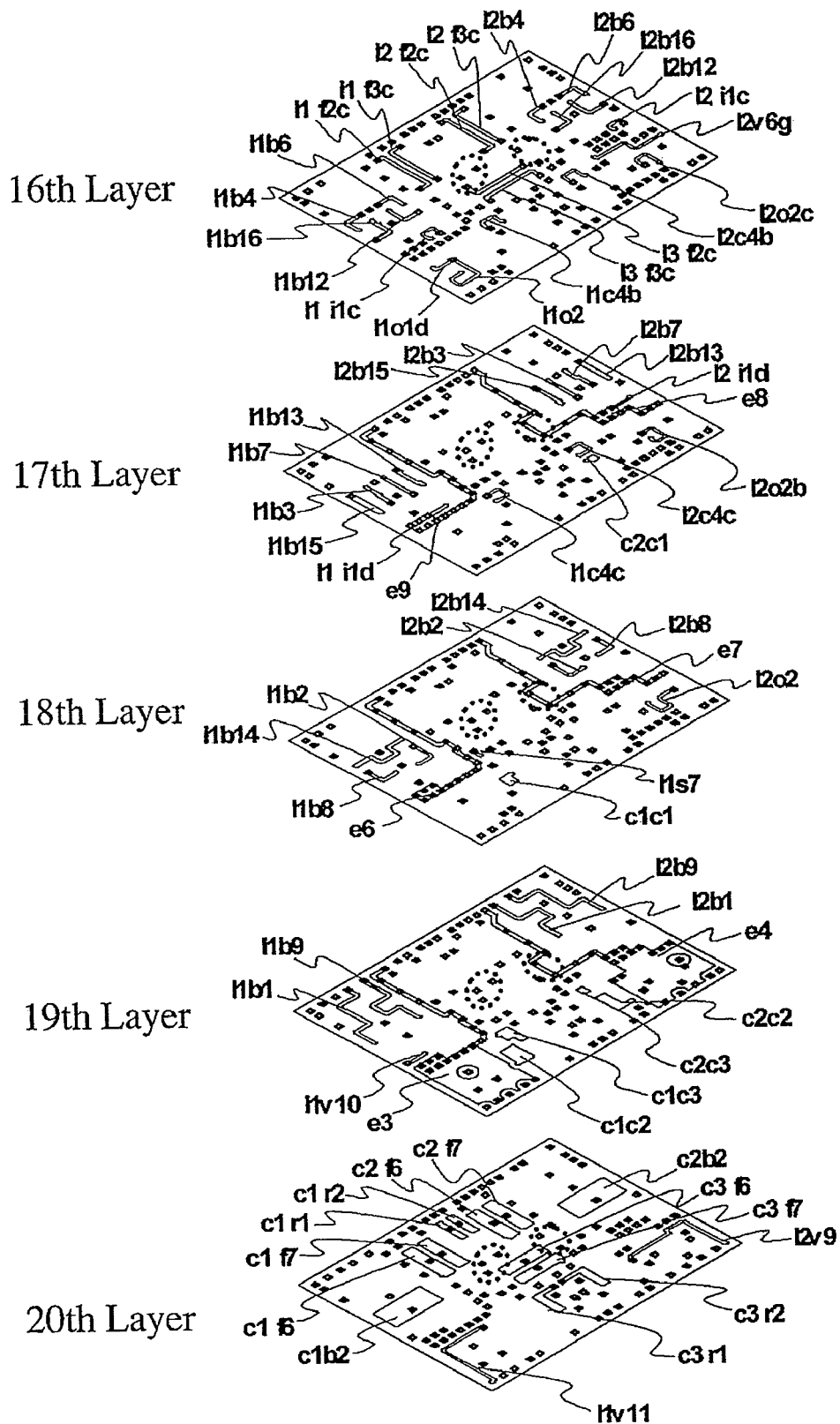
FIG. 30(d) is a perspective view showing conductor patterns on 16th to 20th layers in a laminate board constituting the high-frequency circuit device according to another embodiment of the present invention.
Figure 30E:
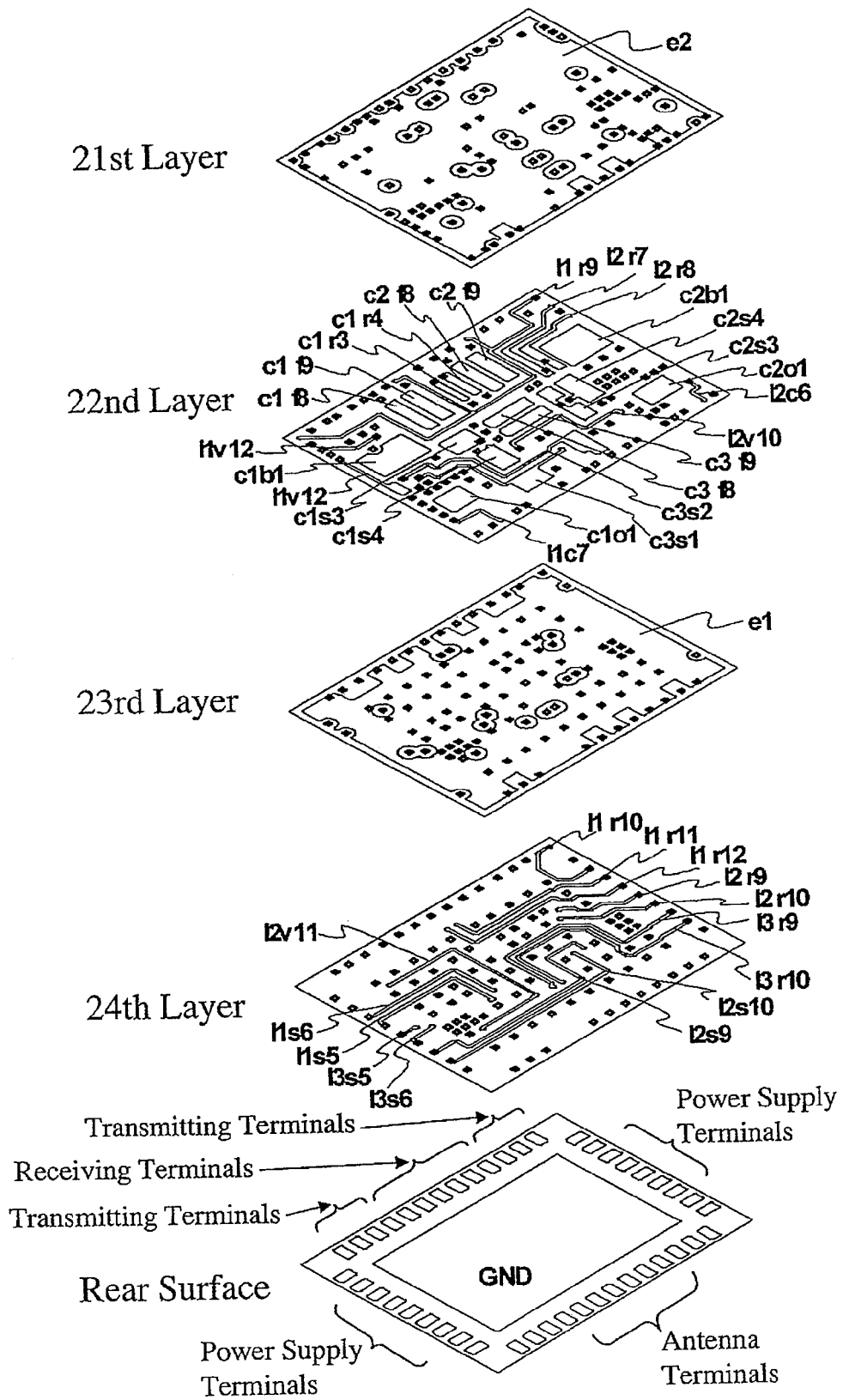
FIG. 30(e) is a perspective view showing conductor patterns on 21st to 24th layers in a laminate board constituting the high-frequency circuit device according to another embodiment of the present invention and the arrangement of terminals on a rear surface.

FIGS. 28(a) to 28(e) show part of conductor patterns on each layer in the high-frequency circuit device of the present invention, which is formed as an integral laminate board formed by pluralities of dielectric layers with conductor patterns. The laminate board shown in FIG. 28 comprises 24 dielectric layers, with a rear surface of the 24th layer provided with terminal electrodes connected to external circuits. FIG. 29(a) shows the equivalent circuit of a first path connected to a first antenna terminal in this high-frequency circuit device, and FIG. 29(b) shows the equivalent circuit of a second path connected to a second antenna terminal. This high-frequency circuit device is a dual-band, wireless LAN front-end module comprising a first communications system in a frequency band of 2.4 GHz and a second communications system in a frequency band of 5 GHz, which is of a 1T2R type having one transmitting terminal and two receiving terminals per one communications system.

Figure 32:
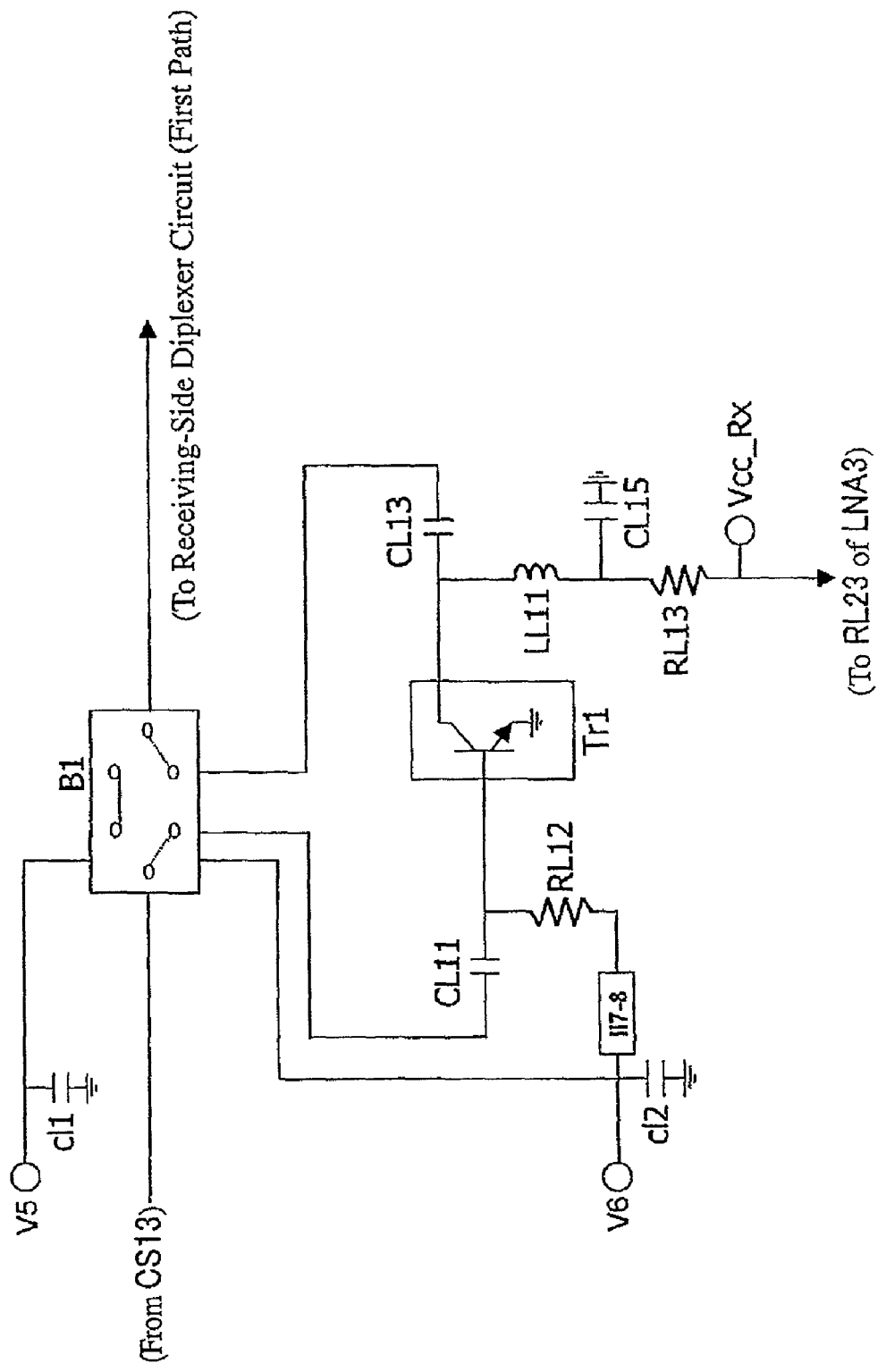
FIG. 32 is a view showing the equivalent circuit of one example of low-noise amplifier circuits used in the high-frequency circuit device of the present invention.

In the first path, a lowpass filter circuit constituted by inductance elements ls5, ls6, ls9-ls11 and capacitance elements cs1, cs4, cs5, cs6 is disposed between the antenna terminal Ant1 and the single-pole, double-throw (SPDT) switch circuit S1, and a capacitance element CS11 is connected to the switch circuit S1. This lowpass filter circuit is preferably set to attenuate second and third harmonics of a 5-GHz band. V1 and V2 are terminals for inputting voltage for controlling the switch circuit S1. A low-noise amplifier LNA1 is connected to the switch circuit S1 via a capacitance element CS13. The equivalent circuit of the low-noise amplifier LNA1 is shown in FIG. 32. VccRx is a power supply of LNA1 for applying voltage to a collector of a transistor Tr1 via a resistor RL13 and an inductor LL11. Voltage is applied to a base of the transistor Tr1 via a resistor RL12. B1 is a bypass switch for preventing excess input signals from saturating the low-noise amplifier. Because receiving frequencies in a 2.4-GHz band and a 5-GHz band should be simultaneously amplified in this embodiment, it desirably has wideband, low-noise amplifying characteristics operable in both 2.4-GHz band and 5-GHz band.

Figure 33:
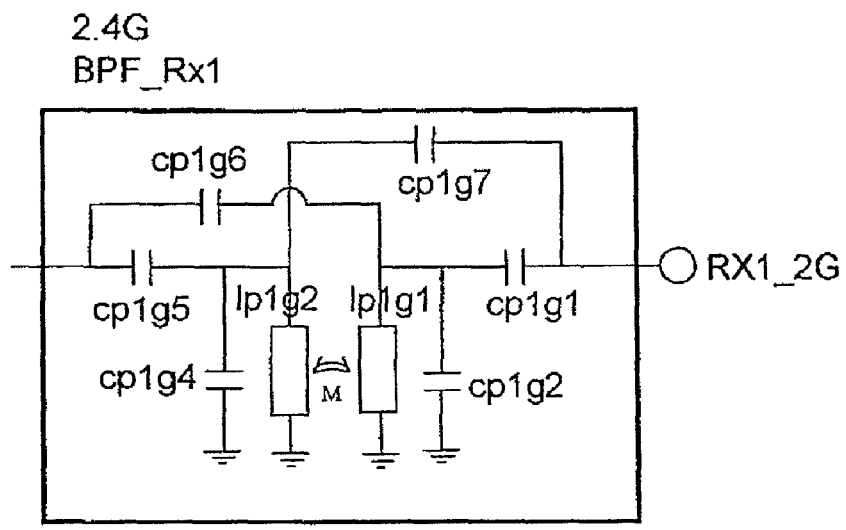
FIG. 33 is a view showing the equivalent circuit of one example of bandpass filter circuits used in the high-frequency circuit device of the present invention.
Figure 34:
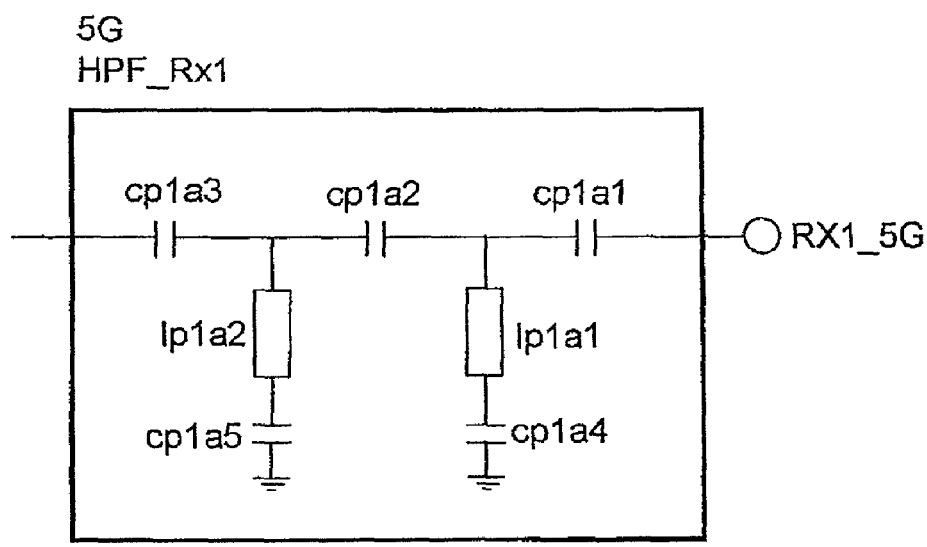
FIG. 34 is a view showing the equivalent circuit of one example of highpass filter circuits used in the high-frequency circuit device of the present invention.

A receiving-side diplexer circuit is connected to the low-noise amplifier LNA1. This diplexer circuit comprises a lower-frequency-side filter (lowpass filter) constituted by a transmission line 11$f$1, and a higher-frequency-side filter (highpass filter) constituted by capacitance elements c1$f$1, c1$f$3, c1$f$5 and transmission lines 11$f$2, 11$f$4. A bandpass filter circuit 2.4G BPF_Rx1 is connected to the lower-frequency-side filter (lowpass filter) of this diplexer circuit. As shown in FIG. 33, the bandpass filter circuit 2.4G BPF_Rx1 is constituted by capacitance elements cp1$g$1, cp1$g$2, cp1$g$4-cp1$g$7 and transmission lines lp1$g$1, lp1$g$2, the transmission line lp1$g$1 and the transmission line lp1$g$2 being magnetically coupled. A first receiving terminal Rx1-2G for a first communications system is connected to the bandpass filter circuit 2.4G BPF Rx1. A highpass filter circuit 5G HPF_Rx1 is connected to the higher-frequency-side filter (highpass filter) of the diplexer circuit. As shown in FIG. 34, the highpass filter circuit 5G HPF_Rx1 is constituted by capacitance elements cp1$a$1-cp1$a$5 and transmission lines lp1$a$1, lp1$a$2. A first receiving terminal Rx1-5G for a second communications system is connected to the highpass filter circuit 5G HPF_Rx1.

A transmitting-side diplexer circuit is connected to the switch circuit S1. This transmitting-side diplexer circuit comprises a lower-frequency-side filter (lowpass filter) constituted by transmission lines ltd1, ltd2 and a capacitance element ctd1, and a higher-frequency-side filter (highpass filter) constituted by capacitance elements ctd2-ctd4 and a transmission line ltd3. The structure of this diplexer circuit is not restricted to a combination of a lowpass filter and a highpass filter but may be properly modified, and other filters such as a bandpass filter, a notch filter, etc. may be used.

A detection circuit is connected to the transmitting-side diplexer circuit. A lower-frequency-side detection circuit has a coupler circuit in which a main line lcb1 and a sub-line lcb2 are coupled, the sub-line lcb2 having one end grounded via a resistor RC1, and the other end connected to a Schottky diode D1 and a voltage-smoothing circuit constituted by a resistance element RC2 and a capacitance element CC1 and further to a detection output terminal DET. The detection output terminal DET provides DC voltage depending on the output power of the high-frequency amplifier circuit 2.4G HPA. A higher-frequency-side detection circuit has a coupler circuit in which a main line lca1 and a sub-line lca2 are coupled, the sub-line lca2 having one end grounded via a resistor RC3, and the other end connected to a Schottky diode D1 and a voltage-smoothing circuit constituted by a resistance element RC4 and a capacitance element CC2, and further to the detection output terminal DET. The detection output terminal DET provides DC voltage depending on the output power of the high-frequency amplifier circuit 5G HPA. The detection output terminal DET is shared as an output terminal by the lower-frequency-side detection circuit and the lower-frequency-side detection circuit. The detection circuit DET may be integrated with the high-frequency amplifier circuit.

A lowpass filter circuit constituted by capacitance elements ctd5-ctd7 and a transmission line ltd4 is connected between the higher-frequency-side filter (highpass filter) of the transmitting-side diplexer circuit and the higher-frequency-side detection circuit. This lowpass filter circuit may be omitted, when the high-frequency-side amplifier circuit 5G HPA generates little harmonics. A lowpass filter circuit constituted by ccb1, ccb2, ccb3, lcb1, lcb3 is connected between the lower-frequency-side filter (lowpass filter) of the transmitting-side diplexer circuit and the high-frequency amplifier circuit 2.4G HPA. The transmission line lcb1 in this lowpass filter circuit is used as a main line of the lower-frequency-side detection circuit.

Figure 35:
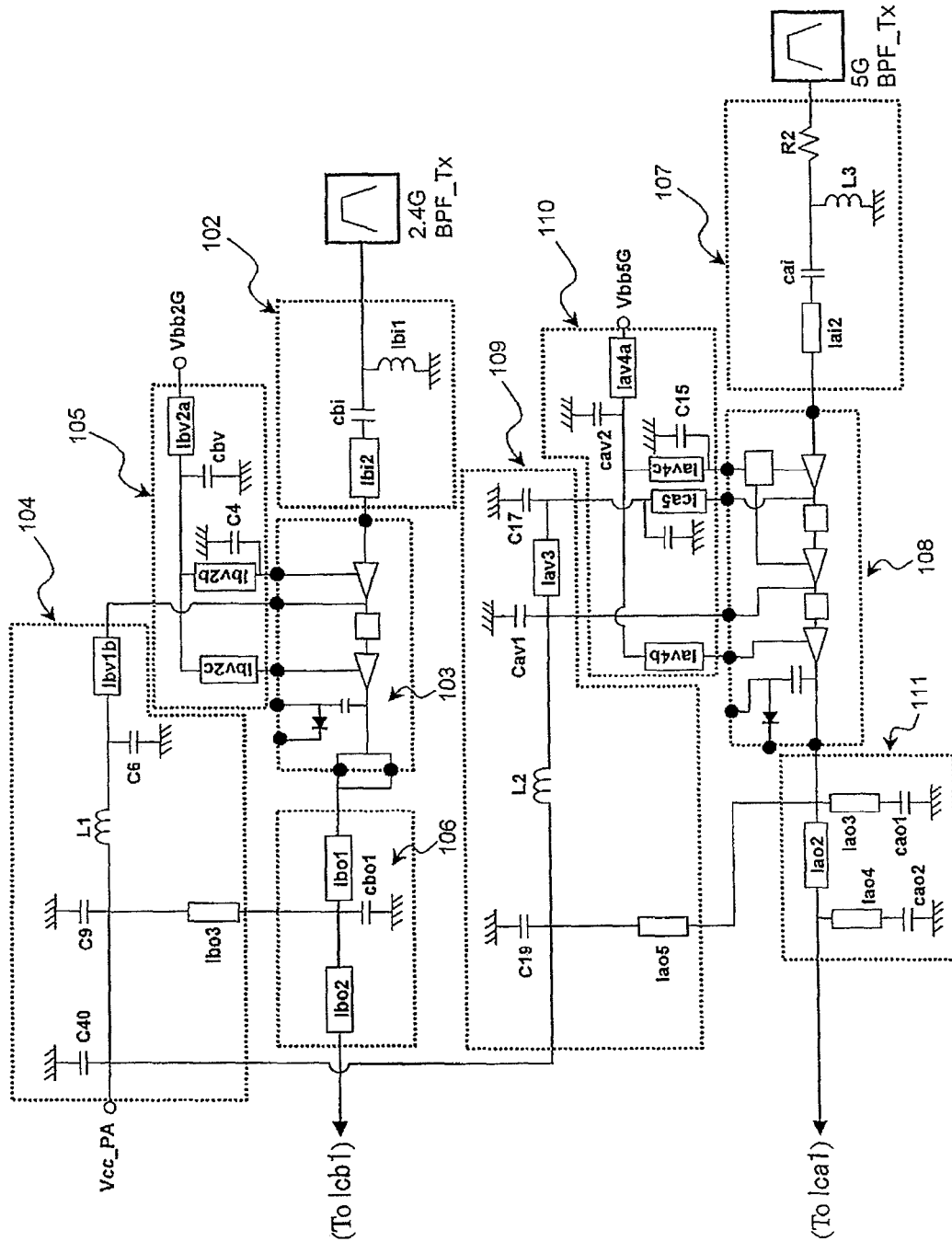
FIG. 35 is a view showing the equivalent circuit of a further example of high-frequency amplifier circuits used in the high-frequency circuit device of the present invention.

The equivalent circuits of the high-frequency amplifier circuits 2.4G HPA and 5G HPA connected to the transmitting-side diplexer circuit are shown in FIG. 35. The lower-frequency-side, high-frequency amplifier circuit is shown in an upper half of FIG. 35, while the higher-frequency-side, high-frequency amplifier is shown in a lower half of FIG. 35. Because power supply lines for these high-frequency amplifier circuits are connected to a common power supply terminal VccPA, the numbers of power supply circuit patterns, power supply terminals, mounted chip capacitors, etc. are reduced. The lower-frequency-side, high-frequency amplifier circuit 2.4G HPA comprises an input-matching circuit 102, a power amplifier circuit 103 constituted by two-stage transistors, a constant-voltage-supplying circuit 104, a control voltage supply circuit 105 for controlling the output power of the high-frequency amplifier circuit 2.4G HPA, and an output-matching circuit 106. The higher-frequency amplifier circuit 5G HPA comprises an input-matching circuit 107, a power amplifier circuit 108 constituted by three-stage transistors, a constant-voltage-supplying circuit 109, a control voltage supply circuit 110 for controlling the output power of the high-frequency amplifier circuit 5G HPA, and an output-matching circuit 111. These circuits use inductance elements and capacitance elements. These high-frequency amplifier circuits may be in the form of MMIC. Vbb2G and Vbb5G are bias voltages for the lower-frequency-side and higher-frequency-side amplifier circuits.

Figure 36:
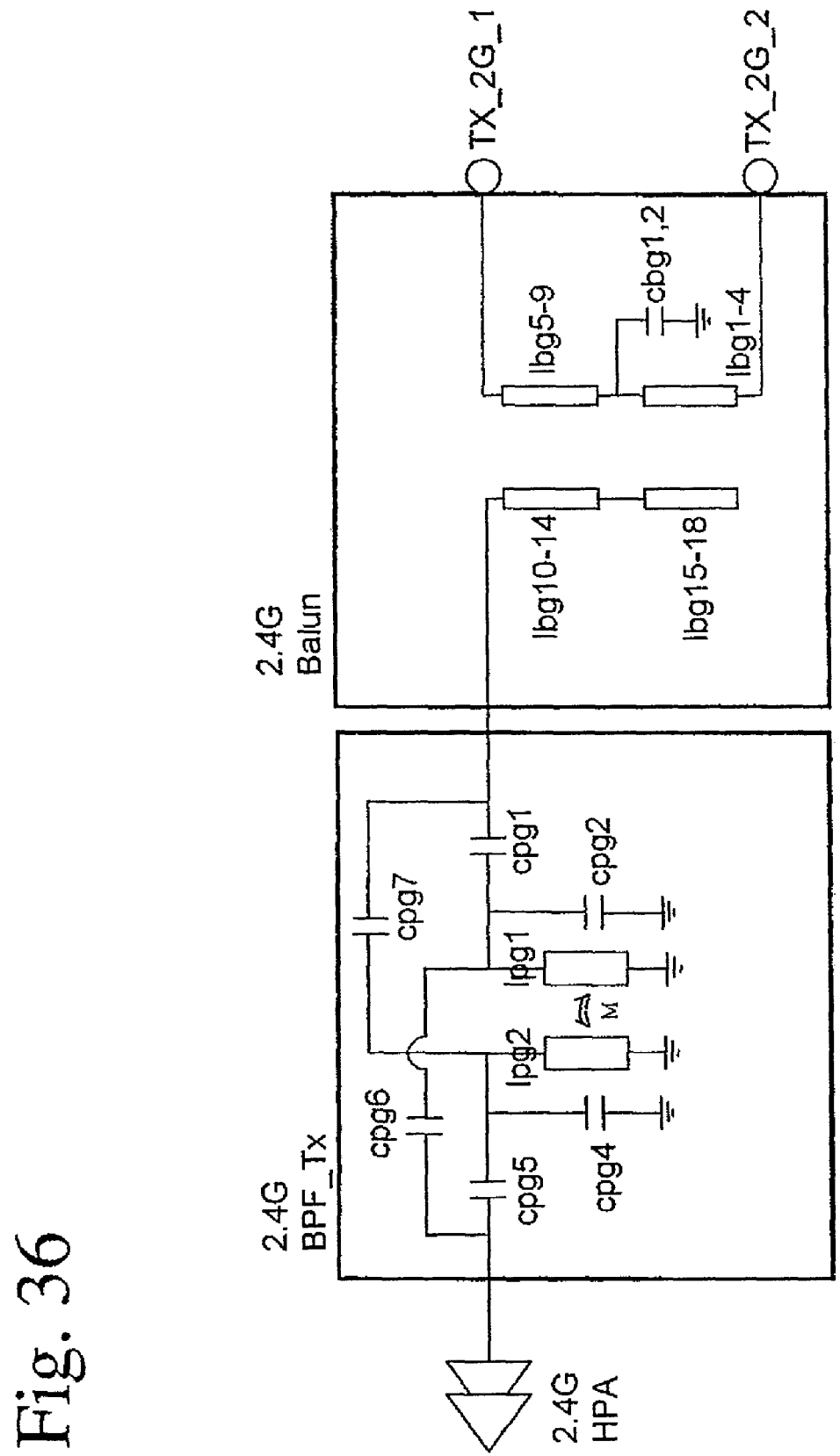
FIG. 36 is a view showing the equivalent circuit of another example of bandpass filter circuits used in the high-frequency circuit device of the present invention.

A bandpass filter circuit 2.4G BPF_Tx is connected to the high-frequency amplifier circuit 2.4G HPA. As shown in FIG. 36, the bandpass filter circuit 2.4G BPF_Tx comprises capacitance elements cpg1, cpg2, cpg4-cpg7 and transmission lines lpg1, lpg2, the transmission line lpg1 and the transmission line lpg2 being magnetically coupled. A balanced-to-unbalanced circuit 2.4G Balun is connected to the bandpass filter circuit 2.4G BPF_Tx, and balanced terminals of the balanced-to-unbalanced circuit 2.4G Balun are connected to lower-frequency-side, first transmitting terminals TX-2G-1, TX-2G-2 for the first communications system.

Figure 37:
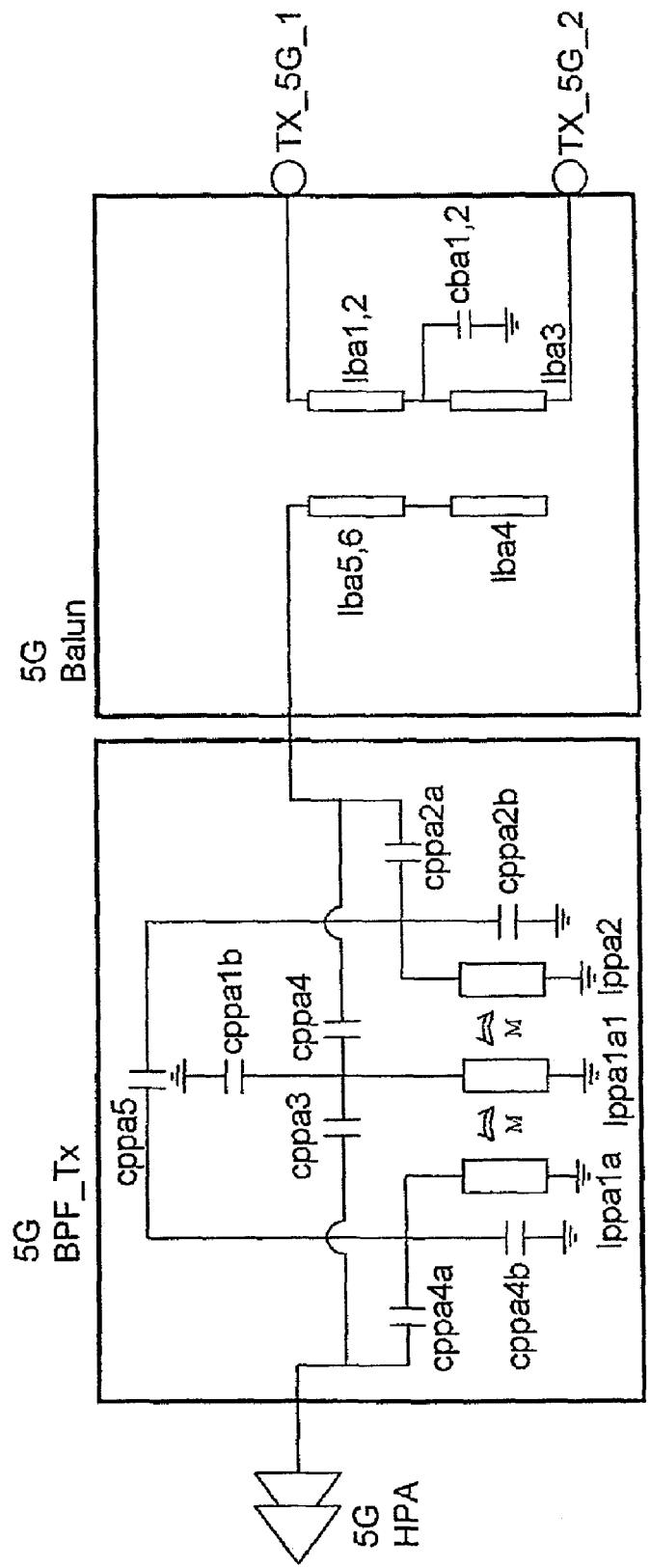
FIG. 37 is a view showing the equivalent circuit of a further example of bandpass filter circuits used in the high-frequency circuit device of the present invention.

A bandpass filter circuit 5G BPF_Tx is connected to the high-frequency amplifier circuit 5G HPA. As shown in FIG. 37, the bandpass filter circuit 5G BPF_Tx comprises capacitance elements cppa1$b$, cppa2$a$, cppa2$b$, cppa3, cppa4, cppa4$a$, cppa4$b$, cppa5 and transmission lines lppa$a$, lppa1$a$1, lppa2, the transmission lines lppa1$a$, lppa1$a$1 and lppa2 being magnetically coupled to constitute a three-stage bandpass filter circuit. A balanced-to-unbalanced circuit 5G Balun is connected to the bandpass filter circuit 5G BPF_Tx, and balanced terminals of the balanced-to-unbalanced circuit 5G Balun are connected to high-frequency-side, first transmitting terminals TX-5G-1, TX-5G-2 for a second communications system.

Figure 38:
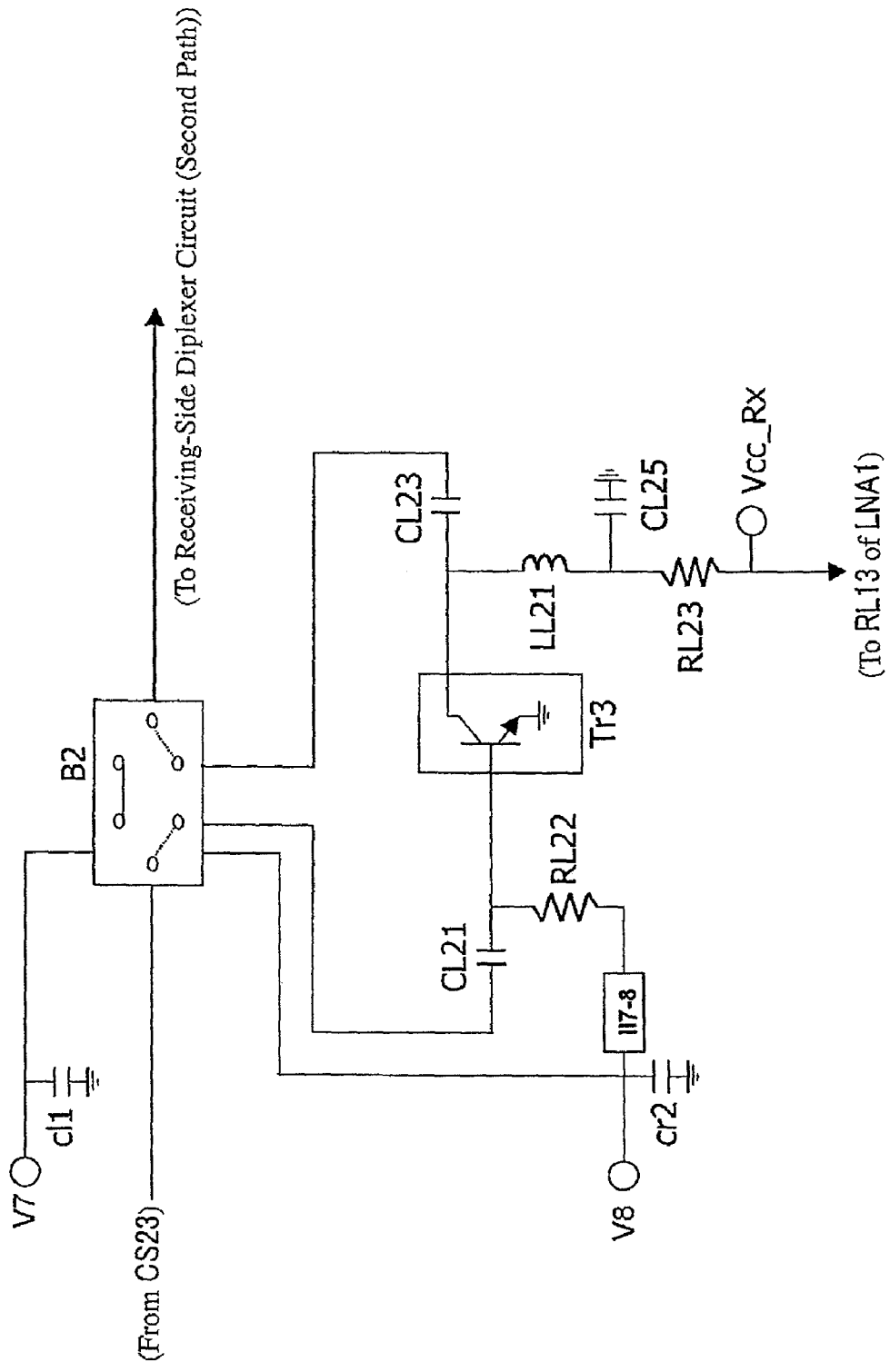
FIG. 38 is a view showing the equivalent circuit of another example of low-noise amplifier circuits used in the high-frequency circuit device of the present invention.

As shown in FIG. 29(b), the antenna terminal Ant2 is connected to a single-pole, double-throw (SPDT) switch circuit S2 via a capacitance element CS21. V3 and V4 are terminals for supplying voltage for controlling the switch circuit S2. Connected to the switch circuit S2 are a Bluetooth terminal BLT via a capacitance element CS22, and a low-noise amplifier LNA3 via a capacitance element CS23. The equivalent circuit of the low-noise amplifier LNA3 is shown in FIG. 38. In this equivalent circuit, VccRx is a power supply of LNA3 for applying voltage to a collector of a transistor Tr3 via a resistor RL23 and an inductor LL21. The power supply VccRx is shared by the low-noise amplifiers LNA1 and LNA3 to miniaturize the high-frequency circuit device. Voltage is applied to a base of the transistor Tr3 via a resistor RL22. B2 is a bypass switch for preventing excess signals from saturating the low-noise amplifier. Because receiving frequencies in a 2.4-GHz band and a 5-GHz band should be simultaneously amplified in this embodiment, it desirably has wide-band, low-noise amplifying characteristics operable in both 2.4-GHz and 5-GHz bands.

Figure 39:
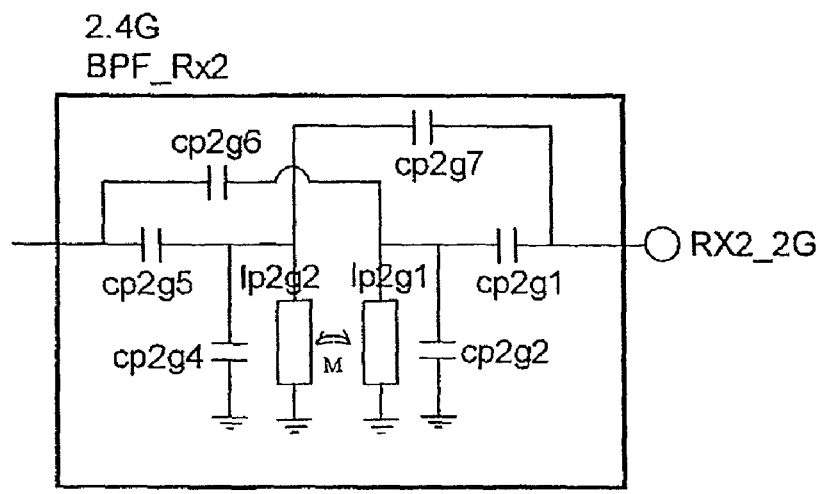
FIG. 39 is a view showing the equivalent circuit of a further example of bandpass filter circuits used in the high-frequency circuit device of the present invention.
Figure 40:
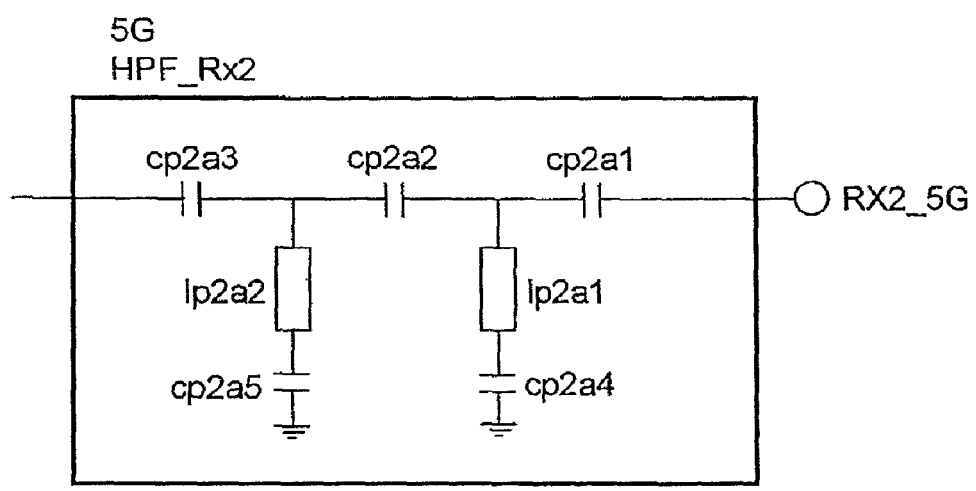
FIG. 40 is a view showing the equivalent circuit of another example of highpass filter circuits used in the high-frequency circuit device of the present invention.

A receiving-side diplexer circuit is connected to the low-noise amplifier LNA3. The receiving-side diplexer circuit comprising a lower-frequency-side filter (lowpass filter) constituted by a transmission line l2ff1, and a higher-frequency-side filter (highpass filter) constituted by capacitance elements c2ff1, c2ff3, c2ff5 and transmission lines l2ff2, l2ff4. The lower-frequency-side filter (lowpass filter) of the receiving-side diplexer circuit is connected to a bandpass filter circuit 2.4G BPF_Rx2. As shown in FIG. 39, the bandpass filter circuit 2.4G BPF_Rx2 comprises capacitance elements cp2g1, cp2g2, cp2g4-cp2g7 and transmission lines lp2g1, lp2g2, the transmission line lp2g1 and the transmission line lp2g2 being magnetically coupled. A second receiving terminal Rx2-2G for a first communications system is connected to the bandpass filter circuit 2.4G BPF_Rx2. The higher-frequency-side filter (highpass filter) of the receiving-side diplexer circuit is connected to a highpass filter circuit 5G HPF_Rx2. As shown in FIG. 40, the highpass filter circuit 5G HPF_Rx2 comprises capacitance elements cp2a1-cp2a5 and transmission lines lp2a1, lp2a2. A second receiving terminal Rx2-5G for a second communications system is connected to the highpass filter circuit 5G HPF_Rx2.

When the high-frequency circuit device having the equivalent circuit shown in FIGS. 29(a) and 29(b) is formed as a laminate board, conductor patterns on each layer are explained referring to FIG. 28. Part of capacitance elements and inductance elements among circuit elements are constituted by conductor patterns formed on the dielectric layers. Semiconductor elements, part of capacitance elements and inductance elements, and resistance elements are mounted on the laminate board. Terminal electrodes for power supplies, control voltage supplies, input signals, output signals, antennas and grounds are arranged circumferentially along the side portions of a rear surface of the laminate board, and a rectangular ground electrode is formed inside the terminal electrodes. When the rear surface of the laminate board has first and second opposing side portions, and third and fourth opposing side portions perpendicular to them, any antenna terminal electrodes are arranged along the first side portion, the transmitting terminal electrodes and part of the receiving terminal electrodes are arranged along the second side portion, and the remaining receiving terminal electrodes are arranged in whichever closer to the second side portion among the third and fourth side portions. Any circuit-controlling terminal electrodes such as the power supply terminal electrodes, the control voltage supply terminal electrodes, etc. are arranged along the third and fourth side portions. Such arrangement of terminal electrodes provides the shortest path for flowing high-frequency signals between a front-end module and RF-IC, which are connected as shown in FIG. 8 or 9, thereby getting communications equipments to have low loss with reduced influence of external noise.

In FIG. 28, symbols starting with "c" denote capacitance elements, symbols starting with "l" denote inductance elements, and symbols starting with "e" denote ground electrodes. Black points denote through-holes. A 24th layer has power supply lines connected to the power supply terminals on the rear surface. A power supply line lr11 is shared by the receiving-side, low-noise amplifiers in the first and second paths, and connected via through-holes to the first layer, on which it is branched to low-noise amplifiers in the first and second paths. A power supply for the high-frequency amplifier circuit is connected via through-holes to the first layer, on which it is branched to a 2.4-GHz, high-frequency amplifier circuit and a 5-GHz, high-frequency amplifier circuit. The 23rd layer is provided with a ground electrode on a substantially entire surface, and the power supply line layer is sandwiched by the ground electrode on the 23rd layer and the ground electrode on the rear side. Capacitance elements C and inductance elements L are formed on dielectric layers above the 23rd layer. The 5-GHz receiving path connected to the first antenna terminal and the 5-GHz receiving path connected to the second antenna terminal are formed on the fourth to 20th layers.

The highpass filter circuits are formed in corner portions of the fourth to 16th layers, cp1a1a, cp1a3a, cp1a1b, cp1a2a and cp1a3b being electrodes constituting capacitance elements C in the highpass filter in the receiving path connected to the first antenna terminal, lp1a1a, lp1a2a, lp1a1b and lp1a2b being electrodes constituting inductance elements L in the highpass filter in the receiving path connected to the first antenna terminal, cp2a1a, cp2a3a, cp2a1b, cp2a2 and cp2a3b being electrodes constituting capacitance elements C in the highpass filter in the receiving path connected to the second antenna terminal, and lp2a1a, lp2a2a, lp2a1b and lp2a2b being electrodes constituting inductance elements L in the highpass filter in the receiving path connected to the second antenna terminal. These electrodes for the highpass filter circuits are close to each other for the purpose of miniaturizing the high-frequency circuit device. Accordingly, shield electrodes are disposed between the filter circuits. In the example shown in FIG. 28, shield electrodes are through-hole electrodes aligned straight (each encircled by an elliptical dotted line) and connected to the ground electrodes. The aligned through-hole electrodes penetrate dielectric layers between the third and 16th layers, such that they are connected to the ground electrodes. Part of a ground electrode on the third layer is an electrode strip, to which through-hole electrodes longitudinally aligned with predetermined intervals are connected. A substantially rectangular ground electrode on the 16th layer is disposed such that it overlaps the highpass filter circuit when viewed from above, thereby shielding other circuits formed on layers under the 16th layer. The ninth to 11th dielectric layers for forming inductance elements are provided with ground electrode strips like the third layer. The use of through-hole electrodes as shield electrodes provides high isolation. The aligned through-hole electrodes may penetrate the overall laminate board, but shields need only penetrate necessary portions.

The bandpass filter circuits disposed in transmitting paths of 2.4 GHz and 5 GHz connected to the first antenna terminal are formed mainly on the third to 12th layers. The bandpass filter circuits are formed on the left side of the highpass filter circuits in the figure. The bandpass filter circuit in the transmitting path of 2.4 GHz connected to the first antenna terminal has capacitance elements C constituted by electrodes cpg1b, cpg2a, cpg2b, cpg3b, cpg4a, cpg4b and cpg5, and inductance elements L constituted by electrodes lpg1a-lpg1c, and lpg2a-lpg2c. The bandpass filter circuit in the transmitting path of 5 GHz connected to the first antenna terminal has capacitance elements C constituted by electrodes cppa1b, cppa2a, cppa2b, cppa4, cppa4a, cppa4b, cppa5, and inductance element L constituted by electrodes lppa0a, lppa0b, lppa1b, lppa1b1, lppa1c1, lppa2b and lppa2c.

The 14th to 23rd layers are provided with electrodes constituting balanced-to-unbalanced circuits connected to transmitting terminals of 2.4 GHz and 5 GHz. A balanced-to-unbalanced circuit Tx2.4G Balun disposed between the bandpass filter circuit 2.4G BPF- in the transmitting path of 2.4 GHz and the transmitting terminals TX-2G-1, TX-2G-2 comprises a capacitance element C constituted by electrodes cbg1 and cbg2, and inductance elements L constituted by electrodes lbg1-lbg4 and lbg6-lbg18. A balanced-to-unbalanced circuit Tx5G Balun disposed between the bandpass filter circuit 5G BPF- in the transmitting path of 5 GHz and the transmitting terminals TX-5G-1, TX-5G-2 comprises capacitance elements C constituted by electrodes cba1-cba3, and inductance elements L constituted by electrodes lba1-lba6. The balanced-to-unbalanced circuits formed on underlying layers overlap the transmitting-side bandpass filter circuit. To miniaturize the high-frequency circuit device, the bandpass filter circuits and the balanced-to-unbalanced circuits are disposed close to the receiving-side highpass filter circuit.

Because the filter circuits in the receiving path are close to those in the transmitting path, shield electrodes are disposed between them. In the example shown in FIG. 28, the shield electrodes are through-hole electrodes (each encircled by an elliptic solid line) connected to the ground electrode. The shield electrodes also shield the balanced-to-unbalanced circuit connected to the transmitting terminal from the filter circuits in the receiving path. The through-hole electrodes aligned straight penetrate the third to 23rd dielectric layers, such that they are connected to ground electrodes formed on the third, 21st and 23rd layers. The ground electrode on the third layer is an electrode strip, to which through-hole electrodes aligned longitudinally with predetermined intervals are connected. The ground electrodes on the 21st and 23rd layers are substantially rectangular such that they cover the entire layers. In the example shown in FIG. 28, the fifth, seventh, eighth, ninth, 12th and 14th layers are provided with electrode strips, to which through-hole electrodes straight aligned are connected. With the through-hole electrodes used as shield electrodes, isolation can be increased to 15 dB or more when the filter circuits in the receiving path are close to those in the transmitting path. This embodiment provides a 1T2R-type, dual-band, wireless LAN module as small as 1.5 mm in height and 73.5 mm$^3$ in volume, in which the filter circuits are made closer by shield electrodes and share a power supply.

Another example of conductor patterns on each layer in a laminate board constituting the high-frequency circuit device of the present invention is shown in FIGS. 30(a) to 30(e). In this example, the laminate board has 24 dielectric layers, a rear surface of the 24th layer being provided with terminal electrodes for external connection. As is clear from the equivalent circuit shown in FIG. 31, this high-frequency circuit device is a single-band, wireless-LAN, front-end module having a first communications system in a 2.4-GHz frequency band, which is of a 2T3R type having two transmitting terminals and three receiving terminals per one communications system.

Figure 31A:
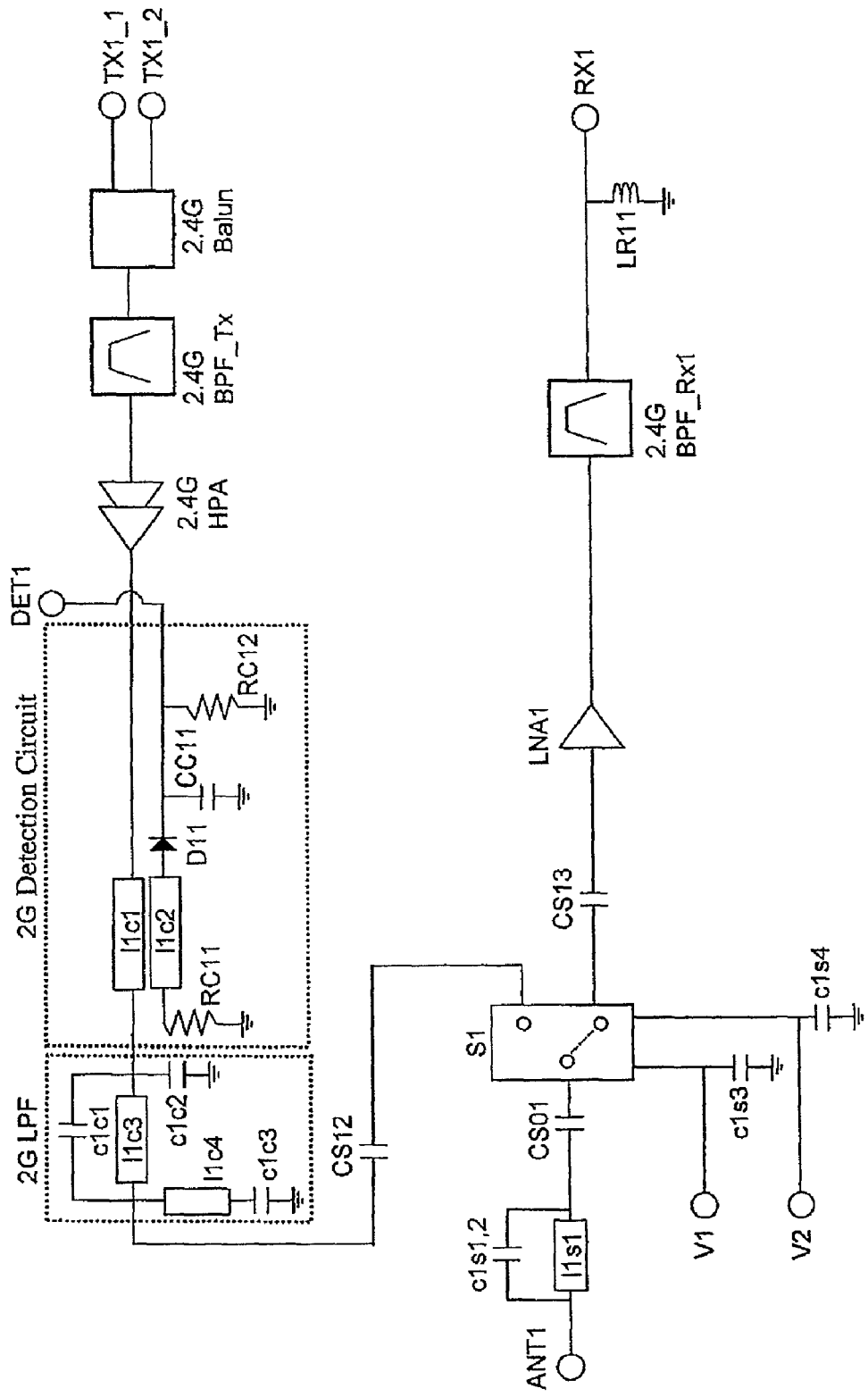
FIG. 31(a) is a block diagram showing the equivalent circuit of a first path connected to a first antenna terminal in the high-frequency circuit device of FIG. 30.
Figure 31B:
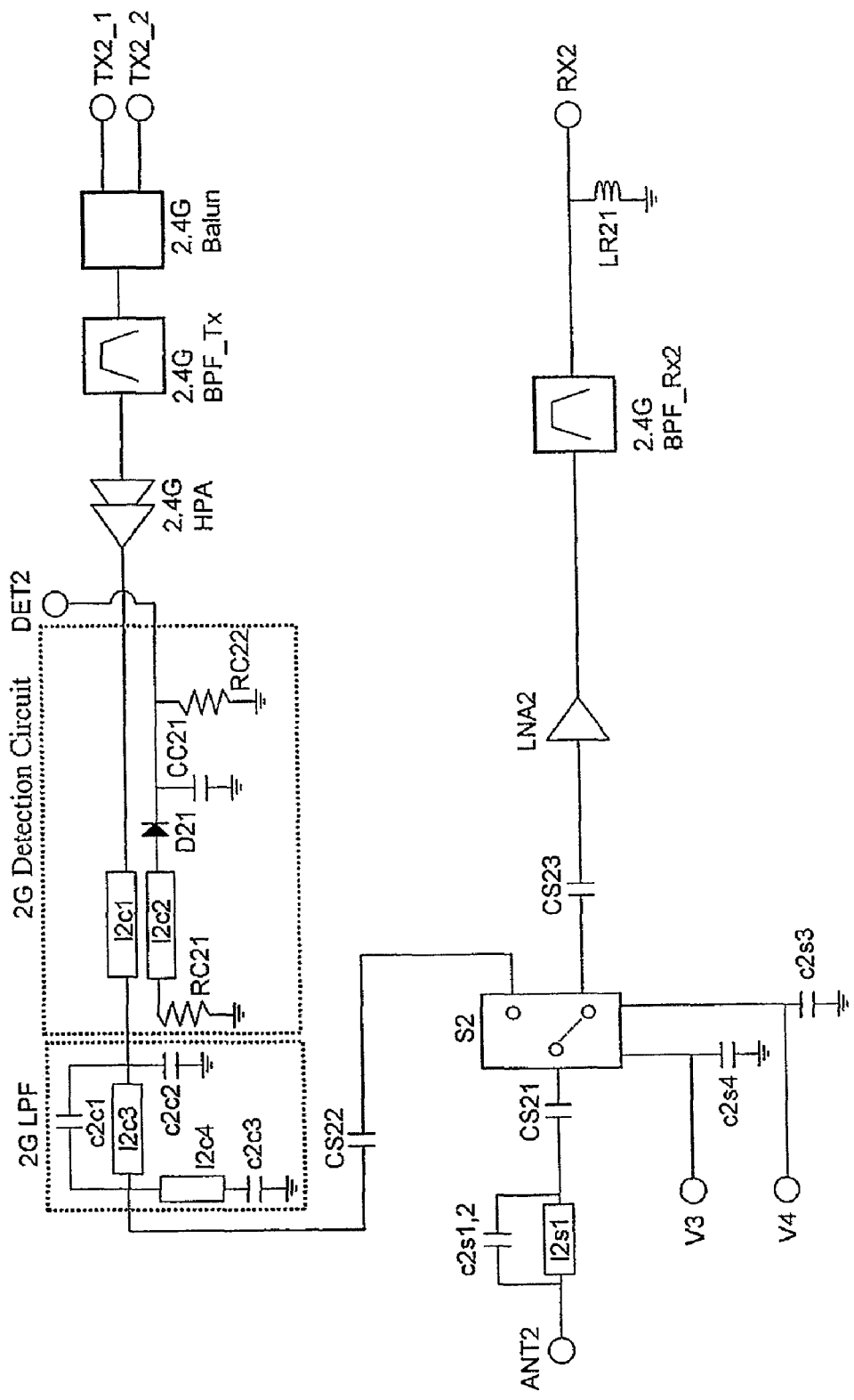
FIG. 31(b) is a block diagram showing the equivalent circuit of a second path connected to a second antenna terminal in the high-frequency circuit device of FIG. 30.
Figure 31C:
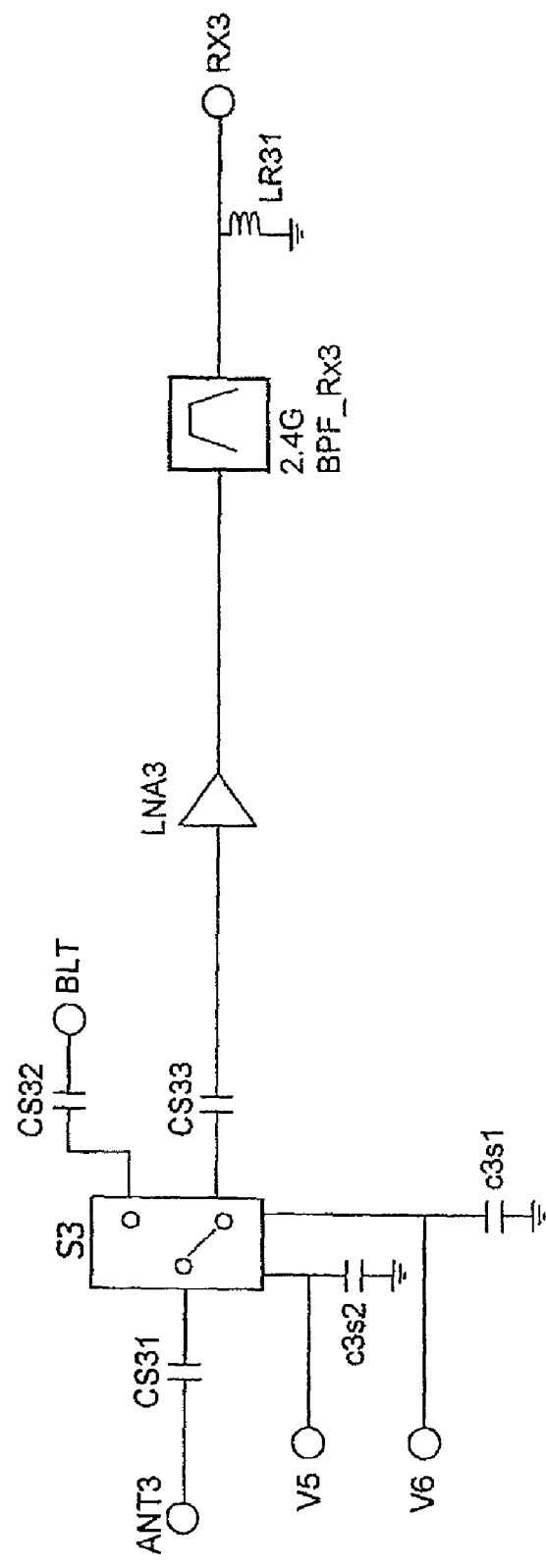
FIG. 31(c) is a block diagram showing the equivalent circuit of a third path connected to a third antenna terminal in the high-frequency circuit device of FIG. 30.

FIG. 31(a) shows the equivalent circuit of a first path connected to a first antenna terminal, FIG. 31(b) shows the equivalent circuit of a second path connected to a second antenna terminal, and FIG. 31(c) shows the equivalent circuit of a third path connected to a third antenna terminal. In the first path, the first antenna terminal Ant1 is connected to first transmitting terminals TX1-1, TX1-2 and a first receiving terminal RX1 via a switch circuit S1 for switching their connection. The first path is the same as shown in FIGS. 28 and 29, except that it does not have a diplexer circuit because of the single band, and that it does not have a 5-GHz transmitting/receiving path. Namely, filter circuits disposed between the first antenna terminal and the first transmitting terminals TX1-1, TX1-2 and the first receiving terminal RX1, a high-frequency amplifier circuit, a low-noise amplifier circuit, a balanced-to-unbalanced circuit, etc. are the same as shown in FIGS. 28 and 29. Thus, their explanation will be omitted. In the second path, a second antenna terminal Ant2 is connected to second transmitting terminals TX2-1, TX2-2 and a second receiving terminal RX2 via a switch circuit S2 for switching their connection. A circuit structure between the second antenna terminal Ant2 and the second transmitting terminals TX2-1, TX2-2 and the second receiving terminal RX2 is the same as in the first path. In the third path, a third antenna terminal Ant2 is connected to a third receiving terminal RX3 via a switch circuit S3. Because this path has the same structure as shown in FIGS. 28 and 29(b) except that it does not have a diplexer circuit and a 5-GHz receiving path, its explanation will be omitted.

This embodiment is the same as shown in FIGS. 28 and 29 in that the power supply lines of the high-frequency amplifier circuits are connected to a common power supply terminal VccPA, and that the low-noise amplifiers in the receiving paths are connected to a common power supply Vcc-LNA. With these structures, the high-frequency circuit device is miniaturized.

Conductor patterns on each layer in a laminate board constituting the high-frequency circuit device having the equivalent circuit shown in FIG. 31 will be explained referring to FIG. 30. The laminate board is provided circumferentially along side portions of the rear surface with the terminal electrodes of power supplies, control voltage supplies, input signals, output signals, antennas and grounds, and a rectangular ground electrode is formed inside the terminal electrodes. The rear surface of the laminate board has first and second opposing side portions, and third and fourth opposing side portions perpendicular to the first and second side portions. Pluralities of antennas terminal electrodes are arranged along the first side portion, transmitting terminal electrodes and receiving terminal electrodes are arranged along the second side portion, and circuit-controlling terminal electrodes such as power supply terminal electrodes, control voltage supply terminal electrodes, etc. are arranged along the third and fourth side portions. The other circuit structures are the same as shown in FIGS. 28 and 29.

In FIG. 30, the bandpass filter circuit connected to the first receiving terminal comprises capacitance elements C constituted by electrodes c1f1-c1f7, and inductance elements L constituted by electrodes l1f2a, l1f3a, l1f2b, l1f3b, l1f2c, l1f3c. The bandpass filter circuit connected to the second receiving terminal comprises capacitance elements C constituted by electrodes c2f1-c2f7, and inductance elements L constituted by electrodes l2f2a, l2f3a, l2f2b, l2f3b, l2f2c, l2f3c. The bandpass filter circuit connected to the third receiving terminal comprises capacitance elements C constituted by electrodes c3/1-c3/7, and inductance elements L constituted by electrodes l2f2a, l2f3a, l2f2b, l2f3b, l2f2c, l2f3c.

Figure 41A:
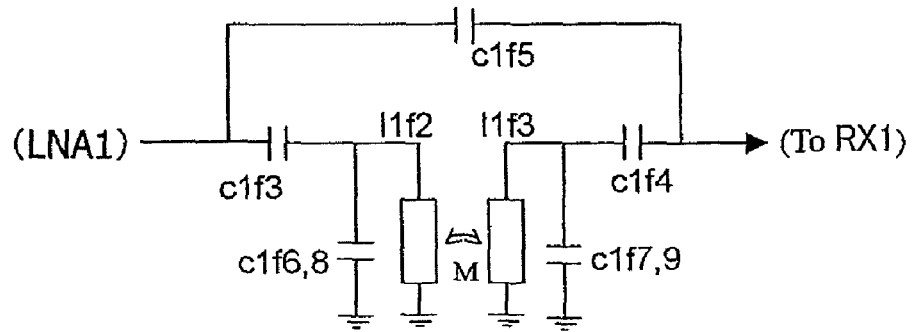
FIG. 41(a) is a view showing the equivalent circuit of a further example of bandpass filter circuits used in the high-frequency circuit device of the present invention.
Figure 41B:
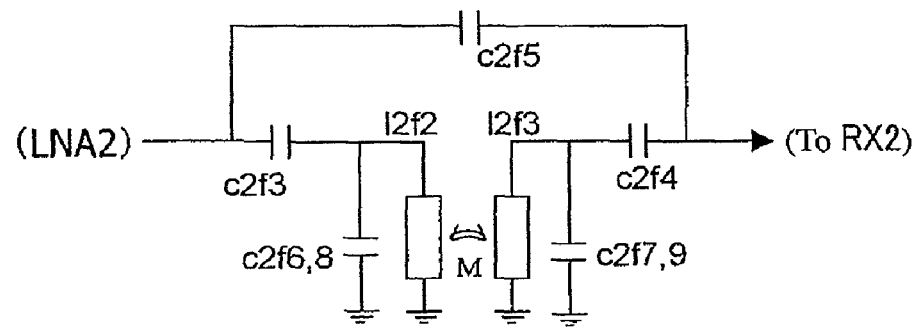
FIG. 41(b) is a view showing the equivalent circuit of a further example of bandpass filter circuits used in the high-frequency circuit device of the present invention.
Figure 41C:
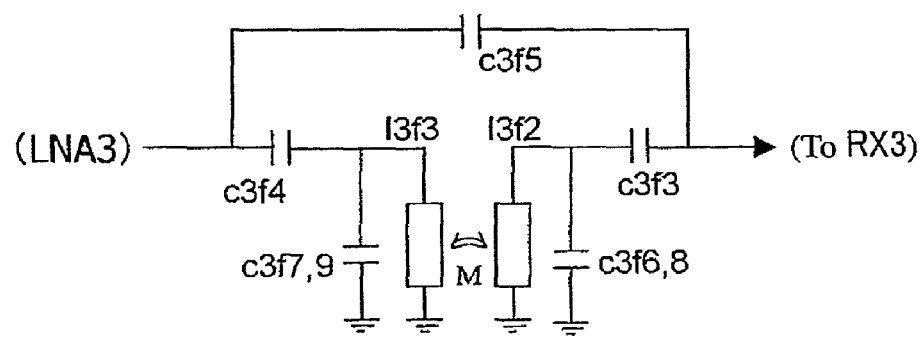
FIG. 41(c) is a view showing the equivalent circuit of a further example of bandpass filter circuits used in the high-frequency circuit device of the present invention.

FIGS. 41(a) to 41(c) show the equivalent circuits of the bandpass filter circuits connected to the first to third receiving terminals in FIG. 31. For miniaturization, the bandpass filter circuit connected to the first receiving terminal is close to the bandpass filter circuit connected to the third receiving terminal, and the bandpass filter circuit connected to the second receiving terminal is close to the bandpass filter circuit connected to the third receiving terminal, with through-hole electrodes (each encircled by an elliptical dotted line in FIG. 30) formed as shield electrodes between them. The through-hole electrodes penetrate the ninth to 21st layers, so that they are connected to ground electrodes formed on these layers. Because the filter circuits in this example have slightly larger intervals than those in FIGS. 28 and 29, they have smaller numbers of through-hole electrodes. Because the bandpass filter circuit connected to the first receiving terminal is sufficiently distant from the bandpass filter circuit connected to the second receiving terminal, there are no through-hole electrodes therebetween. Thus, with the through-hole electrodes used as shield electrodes, isolation can be increased to 15 dB or more between the filter circuits in these paths. With the filter circuits arranged with small intervals via shield electrodes and sharing a power supply in this embodiment, a 2T3R-type, single-band, wireless LAN module as small as 1.5 mm in height and 72.0 mm$^3$ in volume can be obtained.

The above high-frequency circuit device can constitute a small, low-cost communications apparatus. Such a high-frequency circuit device is suitable for portable appliances, personal computers, etc. having a wireless communications function.

Although the high-frequency circuit device of the present invention has been explained referring to the attached drawings, the present invention is not restricted to those shown in the figures, but may be modified variously within the scope of the present invention. Explanations concerning each embodiment are applicable to the other embodiments. Of course, the equivalent circuit of a high-frequency circuit device shown in each figure is an example but should not be considered restrictive. These equivalent circuits may be properly combined or modified to constitute the high-frequency circuit device of the present invention.

What is claimed is:

1. A high-frequency circuit device, comprising:
    at least first and second antenna terminals;
    at least a first transmitting terminal and at least first and second receiving terminals for a first communications system; and
    at least one switch circuit connected to said first antenna terminal,
    wherein said at least one switch circuit switches a path from said first antenna terminal to said first transmitting terminal and a path from said first antenna terminal to said first receiving terminal,
    wherein a path from said second antenna terminal to said second receiving terminal for said first communications system is different from the path switched by said at least one switch circuit, and
    wherein said first transmitting terminal and said first receiving terminal for said first communications system are connectable to said first antenna terminal, and said second receiving terminal for said first communications system is connectable to said second antenna terminal.

2. The high-frequency circuit device according to claim 1, further comprising at least a first transmitting terminal and at least first and second receiving terminals for a second communications system,
    said first transmitting terminal and said first receiving terminal for said second communications system being connectable to said first antenna terminal using said at least one switch circuit, and
    said second receiving terminal for said second communications system being connectable to said second antenna terminal.

3. A high-frequency circuit device, comprising:
    at least first and second antenna terminals;
    at least first and second transmitting terminals and at least first and second receiving terminals for a first communications system;
    a first switch circuit connected to said first antenna terminal; and
    a second switch circuit connected to said second antenna terminal,
    wherein said first switch circuit switches a path from said first antenna terminal to said first transmitting terminal for said first communications system and a path from said first antenna terminal to said first receiving terminal for said first communications system,
    wherein said second switch circuit switches a path from said second antenna terminal to said second transmitting terminal for said first communications system and a path from second antenna terminal to said second receiving terminal for said first communications system, and
    wherein said first transmitting terminal and said first receiving terminal for said first communications system are connectable to said first antenna terminal, and said second transmitting terminal and said second receiving terminal for said first communications system being connectable to said second antenna terminal.

4. The high-frequency circuit device according to claim 3, further comprising at least first and second transmitting terminals and at least first and second receiving terminals for a second communications system,
    said first transmitting terminal and said first receiving terminal for said second communications system being connectable to said first antenna terminal using said first switch circuit, and
    said second transmitting terminal and said second receiving terminal for said second communications system being connectable to said second antenna terminal using said second switch circuit.

5. The high-frequency circuit device according to claim 3, further comprising:
    a third antenna terminal; and
    a third receiving terminal for said first communications system,
    said third receiving terminal for said first communications system being connectable to said third antenna terminal.

6. The high-frequency circuit device according to claim 4, further comprising:
    a third antenna terminal;
    a third receiving terminal for said first communications system; and
    a third receiving terminal for said second communications system,
    said third receiving terminal for said first communications system and said third receiving terminal for said second communications system being connectable to said third antenna terminal.

7. The high-frequency circuit device according to claim 5, further comprising a third transmitting terminal for said first communications system, which is connectable to said third antenna terminal.

8. The high-frequency circuit device according to claim 6, further comprising a third transmitting terminal for said first communications system, and a third transmitting terminal for said second communications system, which are connectable to said third antenna terminal.

9. The high-frequency circuit device according to claim 1, further comprising two or more low-noise amplifier circuits sharing a common power supply terminal for amplifying received signals.

10. The high-frequency circuit device according to claim 2, which further comprises two or more low-noise amplifier circuits sharing a common power supply terminal for amplifying received signals.

11. The high-frequency circuit device according to claim 2, further comprising two or more high-frequency amplifier circuits sharing a common power supply terminal for amplifying transmitting signals.

12. A high-frequency circuit device, comprising:
at least first and second antenna terminals;
at least a first transmitting terminal and at least first and second receiving terminals for a first communications system;
at least a first transmitting terminal and at least first and second receiving terminals for a second communications system;
(A) a first path connected to said first antenna terminal, said first path comprising
 (a) a path extending from said first antenna terminal to said first transmitting terminal for said first communications system, with a first switch circuit, a first diplexer circuit, a first high-frequency amplifier circuit and a first bandpass filter circuit connected in this order from said first antenna terminal to said first transmitting terminal for said first communications system,
 (b) a path extending from said first diplexer circuit to said first transmitting terminal for said second communications system, with a second high-frequency amplifier circuit and a second bandpass filter circuit connected in this order from said first diplexer circuit to said first transmitting terminal for said second communications system,
 (c) a path extending from said first switch circuit to said first receiving terminal for said first communications system, with a second diplexer circuit and a third bandpass filter circuit connected in this order from said first switch circuit to said first receiving terminal for said first communications system, and
 (d) a path extending from said second diplexer circuit to said first receiving terminal for said second communications system; and
(B) a second path connected to said second antenna terminal, said second path comprising
 (a) a path extending from said second antenna terminal to said second receiving terminal for said first communications system, with a third diplexer circuit and a fourth bandpass filter circuit connected in this order from said second antenna terminal to said second receiving terminal for said first communications system, and
 (b) a path extending from said third diplexer circuit to said second receiving terminal for said second communications system.

13. A high-frequency circuit device comprising
at least first and second antenna terminals;
at least first and second transmitting terminals and at least first and second receiving terminals for a first communications system;
at least first and second transmitting terminals and at least first and second receiving terminals for a second communications system;
(A) a first path connected to said first antenna terminal, said first path comprising
 (a) a path extending from said first antenna terminal to said first transmitting terminal for said first communications system, with a first switch circuit, a first diplexer circuit, a first high-frequency amplifier circuit and a first bandpass filter circuit connected in this order from said first antenna terminal to said first transmitting terminal for said first communications system,
 (b) a path extending from said first diplexer circuit to said first transmitting terminal for said second communications system, with a second high-frequency amplifier circuit and a second bandpass filter circuit connected in this order from said first diplexer circuit to said first transmitting terminal for said second communications system,
 (c) a path extending from said first switch circuit to said first receiving terminal for said first communications system, with a second diplexer circuit and a third bandpass filter circuit connected in this order from said first switch circuit to said first receiving terminal for said first communications system, and
 (d) a path extending from said second diplexer circuit to said first receiving terminal for said second communications system; and
(B) a second path connected to said second antenna terminal, said second path comprising
 (a) a path extending from said second antenna terminal to said second transmitting terminal for said first communications system, with a second switch circuit, a third diplexer circuit, a third high-frequency amplifier circuit and a fourth bandpass filter circuit connected in this order from said second antenna terminal to said second transmitting terminal for said first communications system,
 (b) a path extending from said third diplexer circuit to said second transmitting terminal for said second communications system, with a fourth high-frequency amplifier circuit and a fifth bandpass filter circuit connected in this order from said third diplexer circuit to said second transmitting terminal for said second communications system,
 (c) a path extending from said second switch circuit to said second receiving terminal for said first communications system, with a fourth diplexer circuit and a sixth bandpass filter circuit connected in this order from said second switch circuit to said second receiving terminal for said first communications system, and
 (d) a path extending from said fourth diplexer circuit to said second receiving terminal for said second communications system.

14. The high-frequency circuit device according to claim 13, which further comprises:
a third antenna terminal, a third receiving terminal for a first communications system;
a third receiving terminal for a second communications system; and a third path connected to said third antenna terminal, said third path comprising
(a) a path extending from said third antenna terminal to said third receiving terminal for said first communications system, with a fifth diplexer circuit and a seventh band-pass filter circuit connected in this order from said third antenna terminal to said third receiving terminal for said first communications system, and
(b) a path extending from said fifth diplexer circuit to said third receiving terminal for said second communications system.

15. The high-frequency circuit device according to claim 1, further comprising:
two or more filter circuits;
an integral laminate board constituted by pluralities of dielectric ceramic layers having conductor patterns for forming inductance elements and capacitance elements; and
at least one semiconductor device mounted on said laminate board,
part of said two or more filter circuits being connected to said first and second receiving terminals for said first communications system, and
shield electrodes being disposed between said two or more filter circuits filter circuits connected to said first and second receiving terminals.

16. The high-frequency circuit device according to claim 1, further comprising:
two or more filter circuits;
an integral laminate board constituted by pluralities of dielectric ceramic layers having conductor patterns for forming inductance elements and capacitance elements, and
at least one semiconductor device mounted on said laminate board,
part of said two or more filter circuits being connected to said first transmitting terminal and said first and second receiving terminals for said first communications system, and
shield electrodes being disposed between one of said two or more filter circuits connected to said first transmitting terminal and at least one of said two or more filter circuits connected to said first and second receiving terminals.

17. The high-frequency circuit device according to claim 1, further comprising:
an integral laminate board constituted by pluralities of dielectric ceramic layers having conductor patterns for forming inductance elements and capacitance elements; and
at least one semiconductor device mounted on said laminate board,
at least one surface of said laminate board being provided with at least two antenna terminal electrodes, at least one transmitting terminal electrode, at least two receiving terminal electrodes, at least one ground electrode, and at least one circuit-controlling terminal electrode,
said antenna terminal electrodes being arranged along a first side portion of said laminate board, and said transmitting terminal electrode being arranged along a second side portion opposing said first side portion.

18. The high-frequency circuit device according to claim 17, wherein said circuit-controlling terminal electrodes are arranged along two opposing side portions on both sides of said first and second side portions.

19. A high-frequency circuit device used between antennas and transmitting and receiving circuits, which comprises:
an integral laminate board comprising a circuit for controlling the connection of said antennas to said transmitting circuits and said receiving circuits, and constituted by pluralities of dielectric ceramic layers having conductor patterns for forming inductance elements and capacitance elements; and
at least one semiconductor device mounted on said laminate board,
one surface of said laminate board being provided with antenna terminal electrodes, pluralities of transmitting terminal electrodes, pluralities of receiving terminal electrodes, pluralities of ground electrodes, and pluralities of circuit-controlling terminal electrodes,
said antenna terminal electrodes, said transmitting terminal electrodes and said receiving terminal electrodes being arranged along a periphery of said one surface, and at least one of said circuit-controlling terminal electrodes being disposed in a region inside said periphery of said one surface along which said transmitting terminal electrodes and said receiving terminal electrodes are arranged.

20. A communications apparatus comprising the high-frequency circuit device recited in claim 1.

* * * * *